(12) United States Patent
Takagiwa

(10) Patent No.: US 8,885,425 B2
(45) Date of Patent: Nov. 11, 2014

(54) SEMICONDUCTOR MEMORY AND METHOD OF CONTROLLING THE SAME

(71) Applicant: Kabushiki Kaisha Toshiba, Tokyo (JP)

(72) Inventor: Teruo Takagiwa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/903,746

(22) Filed: May 28, 2013

(65) Prior Publication Data

US 2013/0314992 A1    Nov. 28, 2013

(30) Foreign Application Priority Data

May 28, 2012 (JP) ................................ 2012-121222
Dec. 14, 2012 (JP) ................................ 2012-273965

(51) Int. Cl.
| | | |
|---|---|---|
| G11C 7/00 | (2006.01) | |
| G11C 29/04 | (2006.01) | |
| G11C 16/04 | (2006.01) | |
| G11C 16/08 | (2006.01) | |
| G11C 29/00 | (2006.01) | |
| H01L 27/115 | (2006.01) | |

(52) U.S. Cl.
CPC ............ *G11C 29/04* (2013.01); *G11C 16/0483* (2013.01); *G11C 16/08* (2013.01); *G11C 29/82* (2013.01); *H01L 27/11582* (2013.01)
USPC ..................................... 365/200; 365/185.09

(58) Field of Classification Search
USPC ............................................. 365/185.09, 200
See application file for complete search history.

(56) References Cited

U.S. PATENT DOCUMENTS

| | | | |
|---|---|---|---|
| 5,479,370 A | 12/1995 | Furuyama et al. | |
| 6,622,205 B1 | 9/2003 | Weiss | |
| 6,868,022 B2 * | 3/2005 | Scheuerlein et al. | ......... 365/201 |
| 7,562,198 B2 | 7/2009 | Noda et al. | |
| 2002/0012282 A1 | 1/2002 | Saito et al. | |
| 2003/0149856 A1 | 8/2003 | Cernea | |
| 2004/0153904 A1 * | 8/2004 | Lin et al. | ........................ 714/710 |
| 2004/0190357 A1 | 9/2004 | Scheuerlein et al. | |
| 2005/0141387 A1 | 6/2005 | Cernea et al. | |
| 2006/0018157 A1 | 1/2006 | Kawai | |
| 2012/0250409 A1 | 10/2012 | Kaga et al. | |

FOREIGN PATENT DOCUMENTS

| | | |
|---|---|---|
| JP | 2009-531797 A | 9/2009 |
| WO | WO 2009-531797 A2 | 10/2007 |

* cited by examiner

*Primary Examiner* — Anthan Tran
(74) *Attorney, Agent, or Firm* — Holtz, Holtz, Goodman & Chick PC

(57) ABSTRACT

According to one embodiment, a memory includes main and redundancy regions including cells, first units in the main region, second units in the redundancy region, a column control circuit configured to selects the first units using a first pointer corresponding to an address signal, and selects the second unit using a second pointer when defect address of the main region matches the address signal so that defect first unit is replaced with the second unit, a selection circuit configured to connects one of a first path for the main region and a second path for the redundancy region to a third path based on a comparison result between the address signal and the defect address.

20 Claims, 23 Drawing Sheets

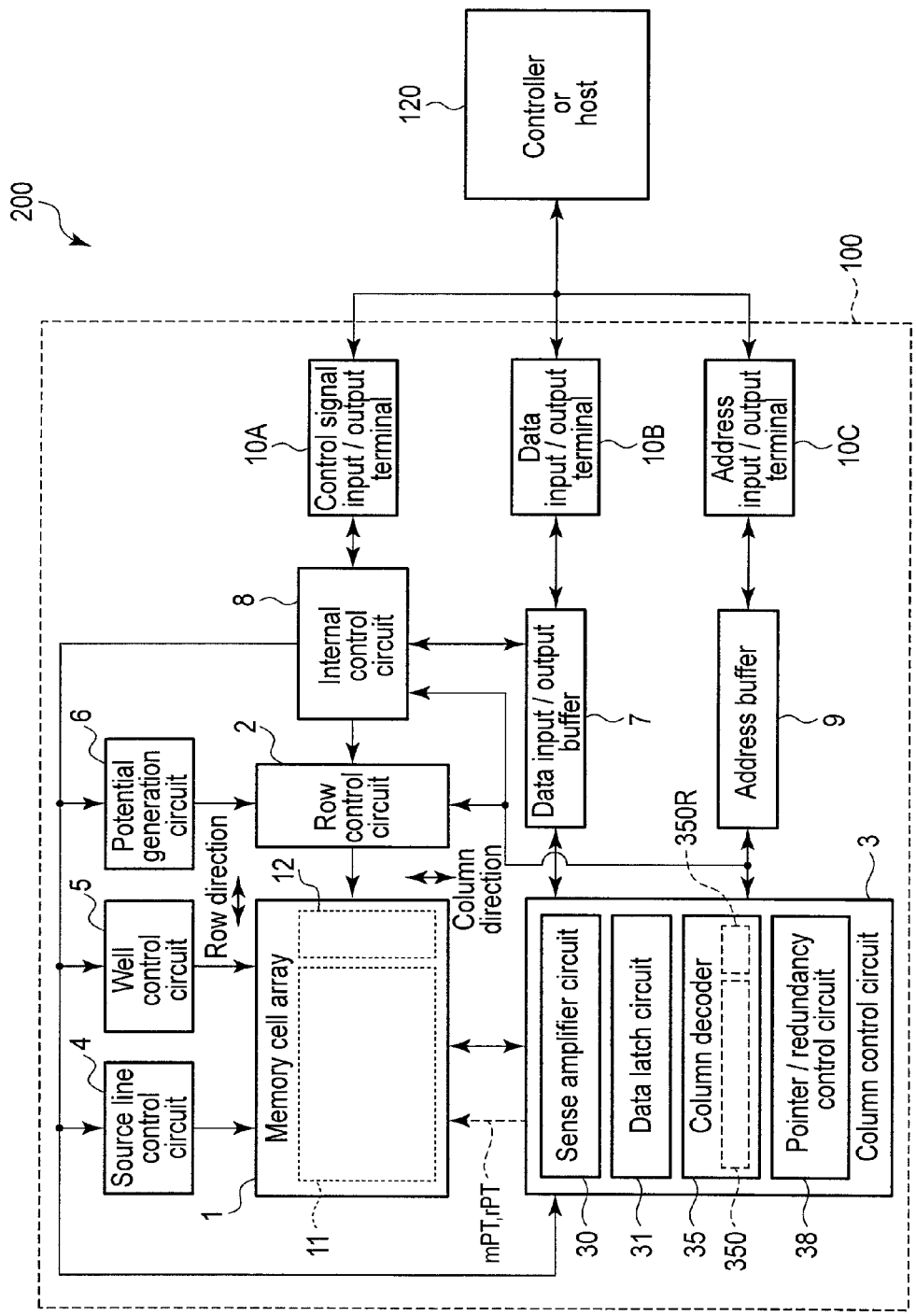
F I G. 1

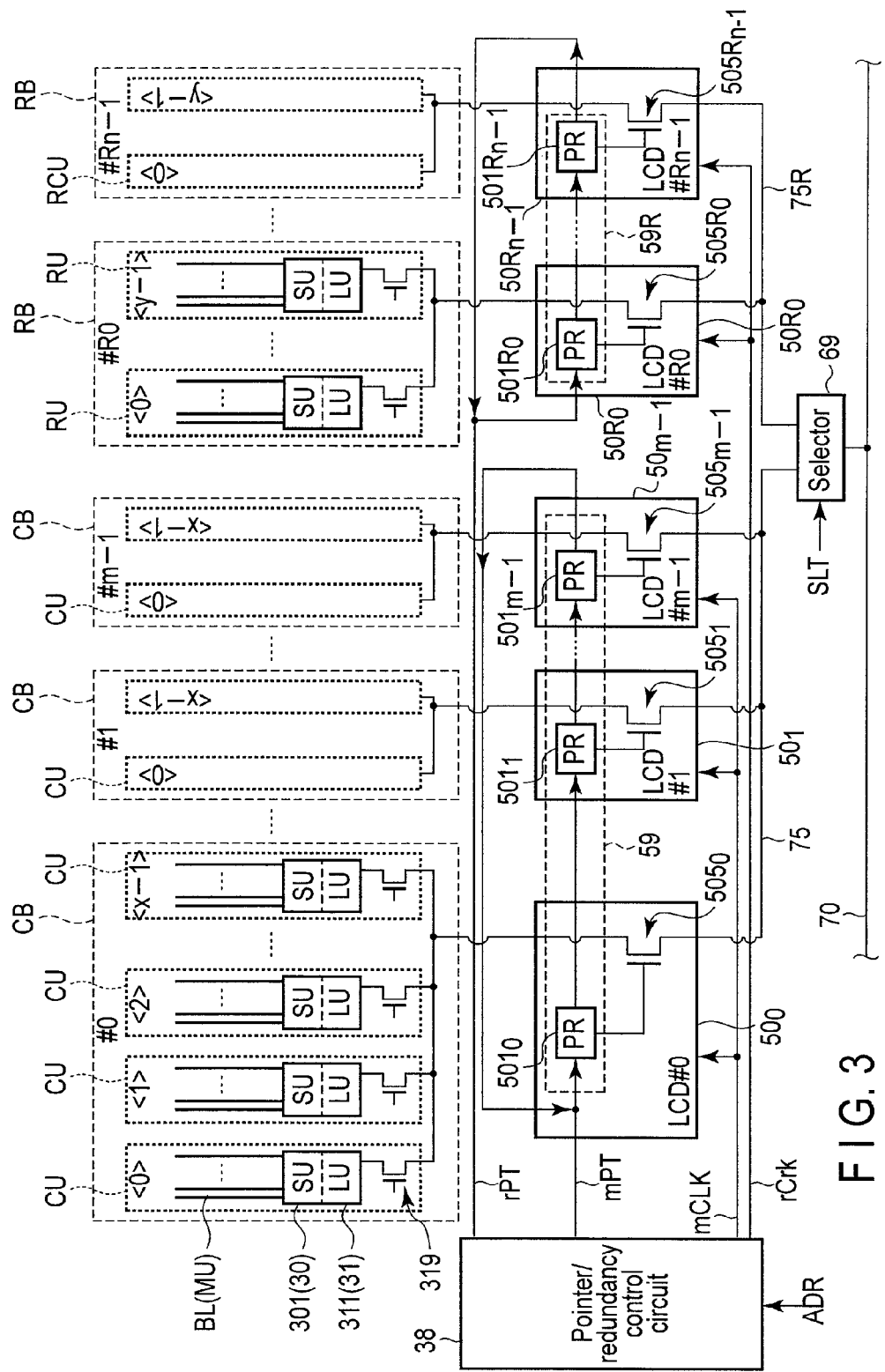
F I G. 3

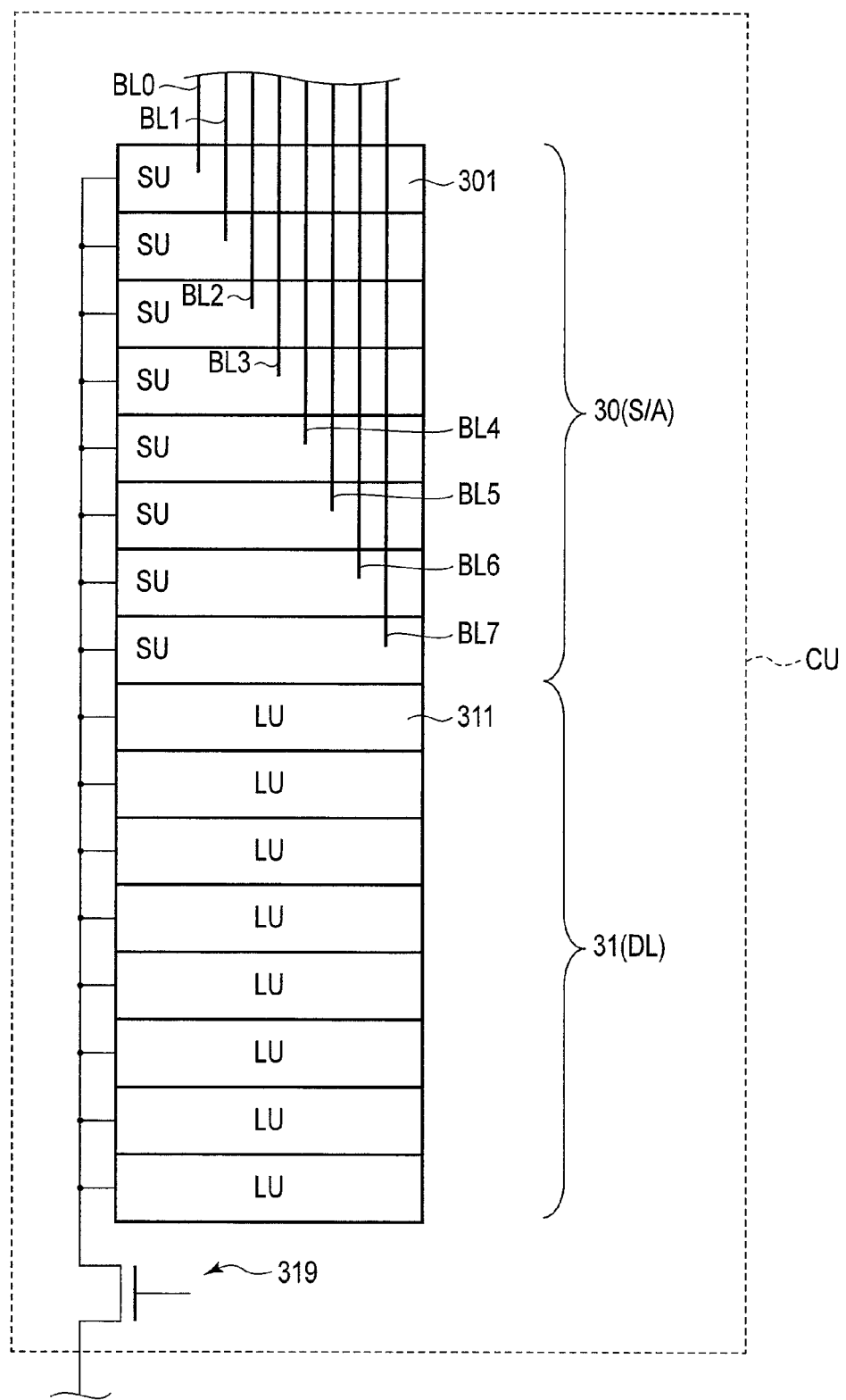
F I G. 4

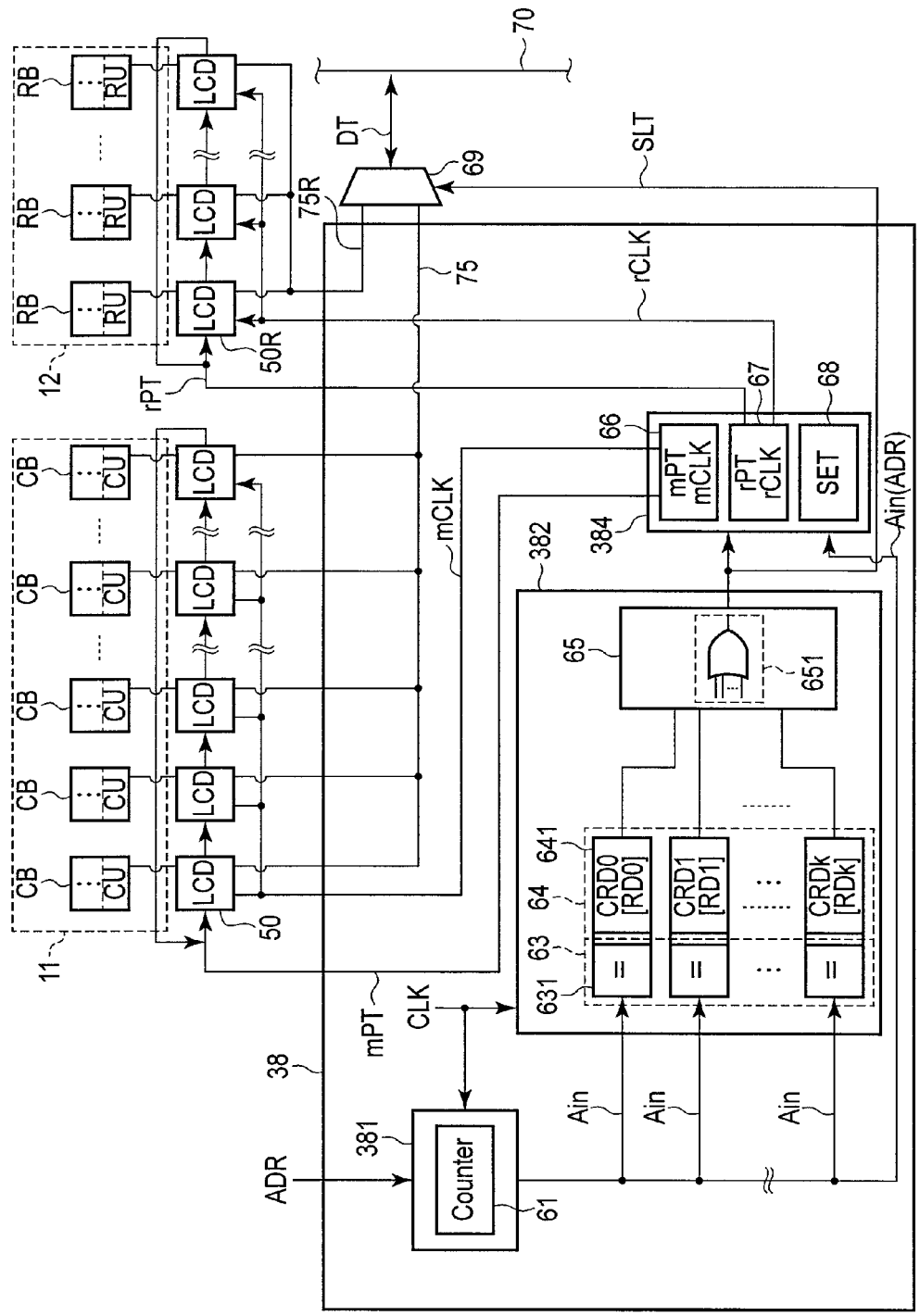
F I G. 5

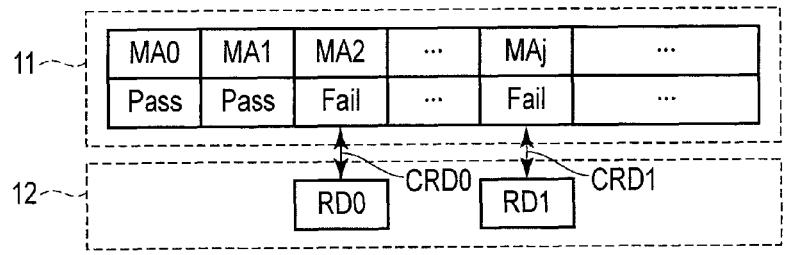
F I G. 6
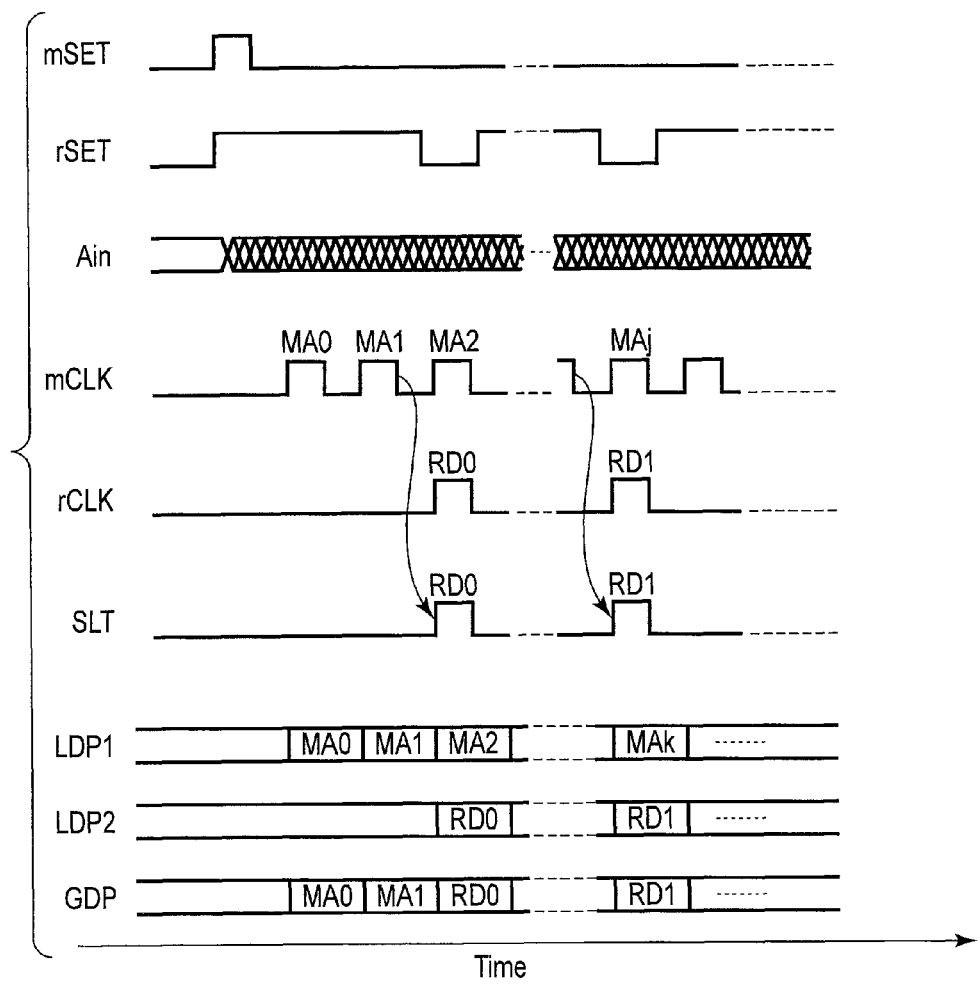
F I G. 7

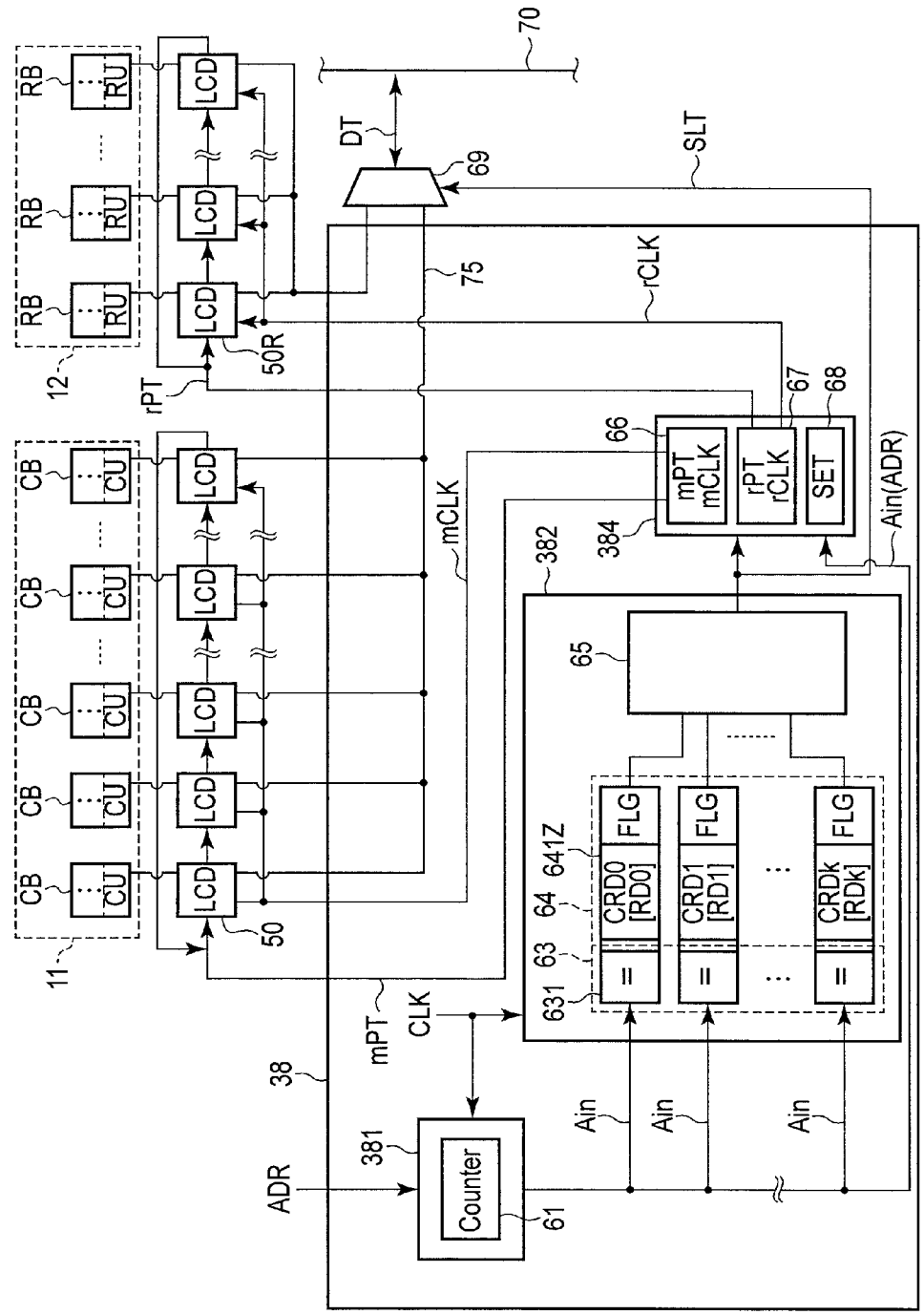
F I G. 11

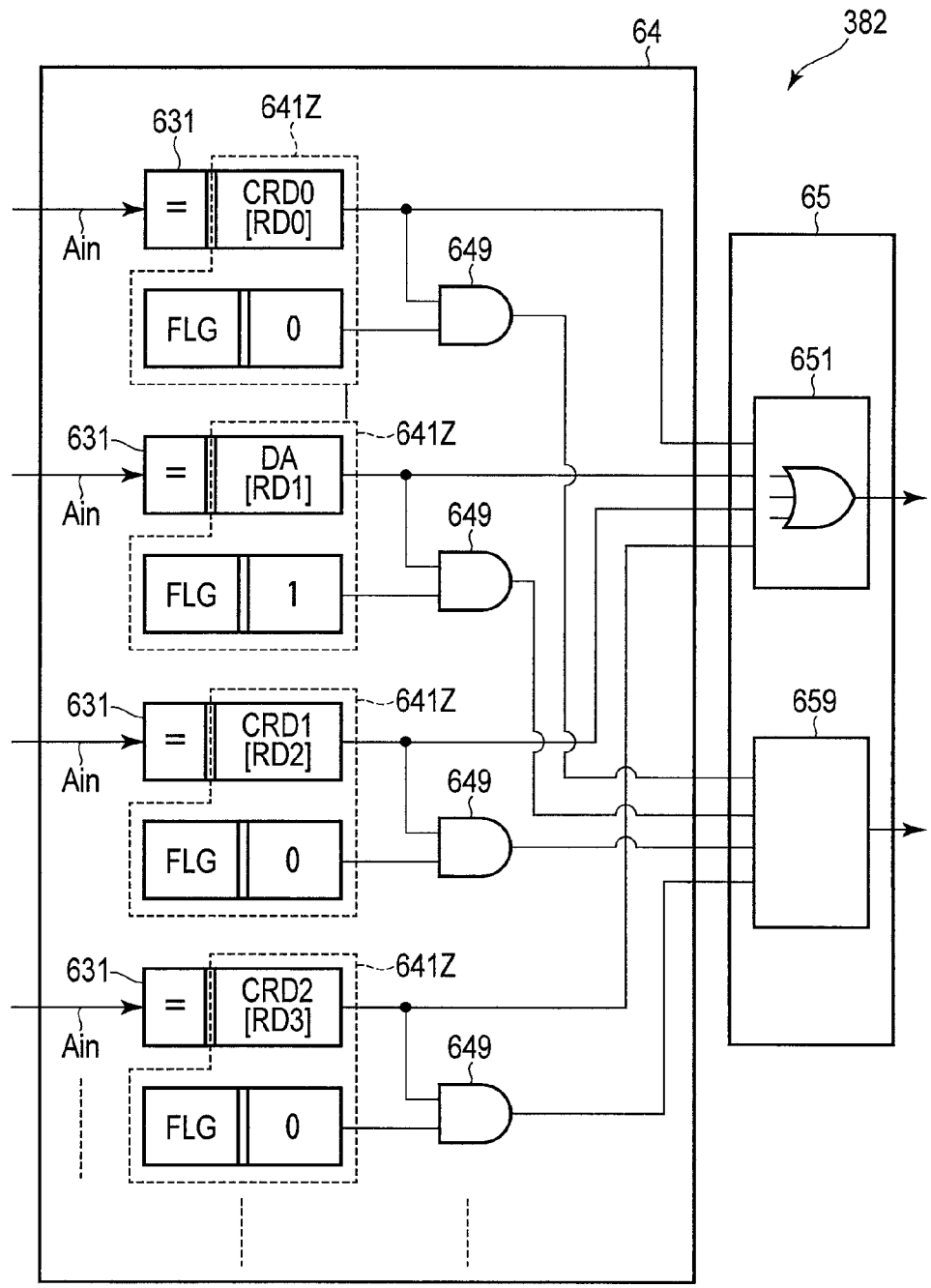
F I G. 13

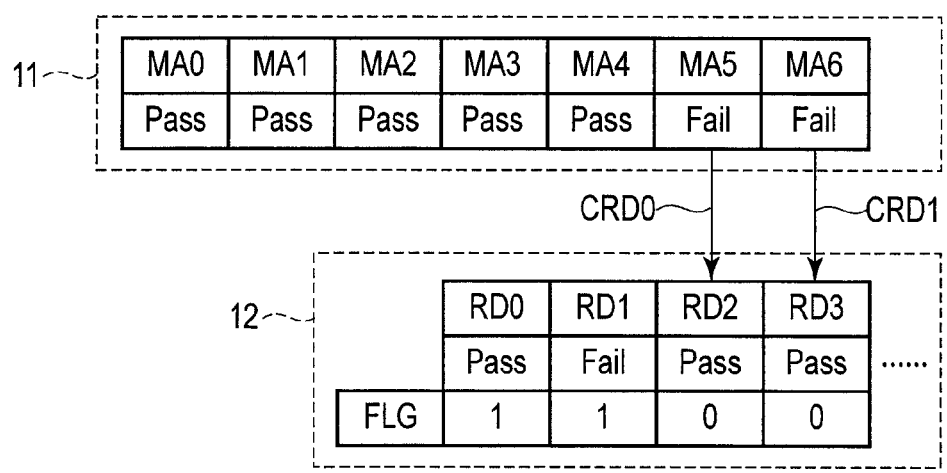
F I G. 14

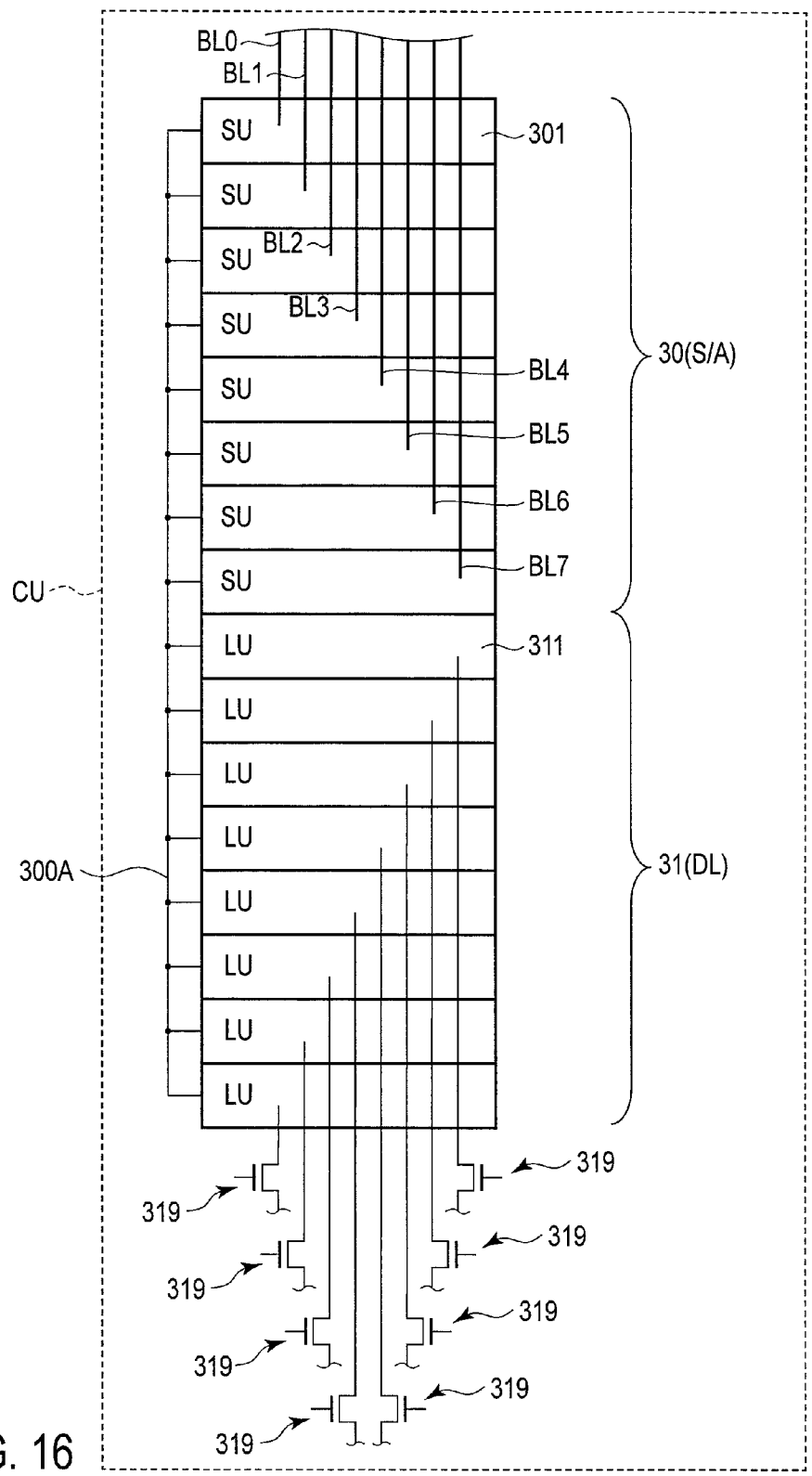
F I G. 16

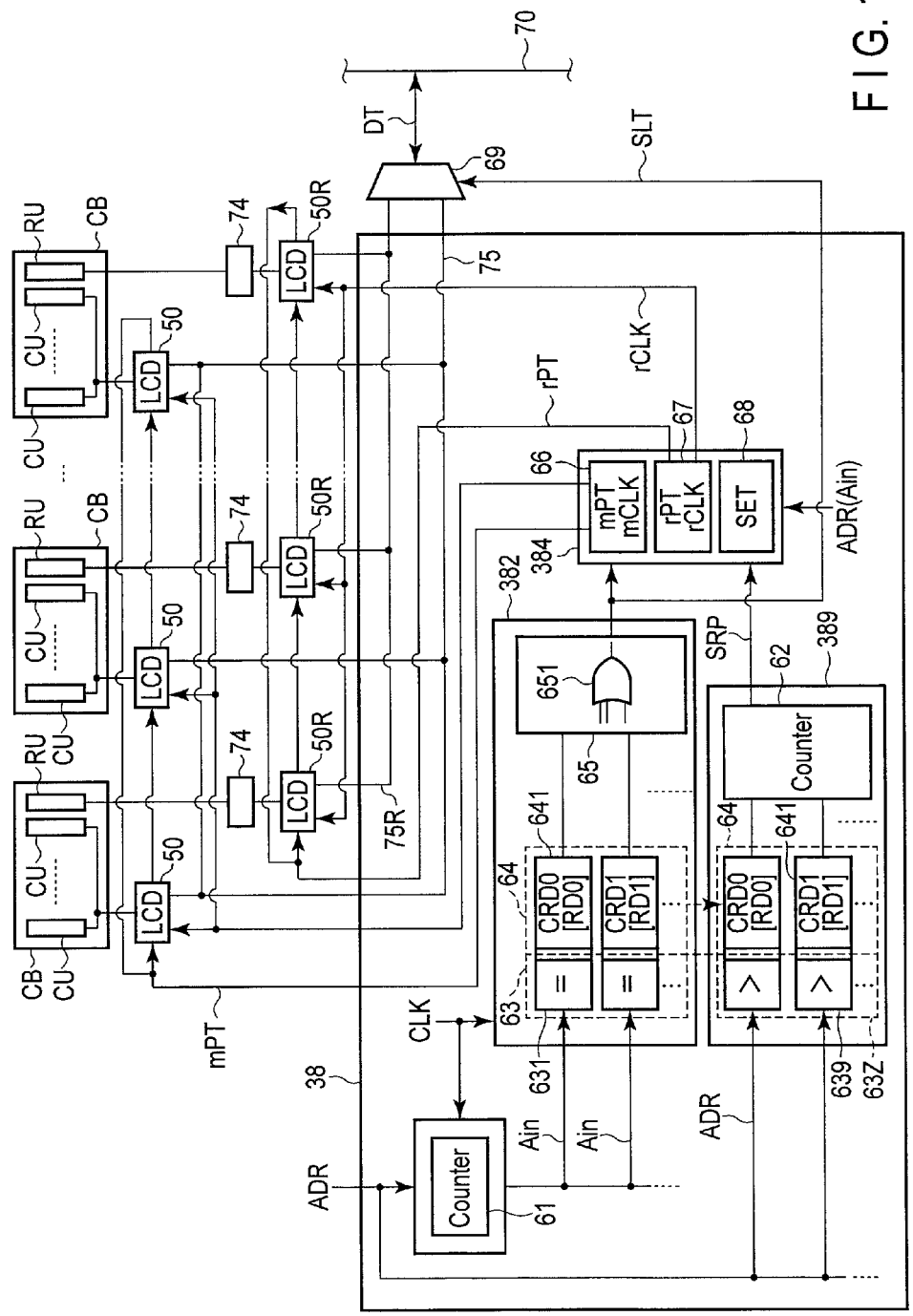
F I G. 19

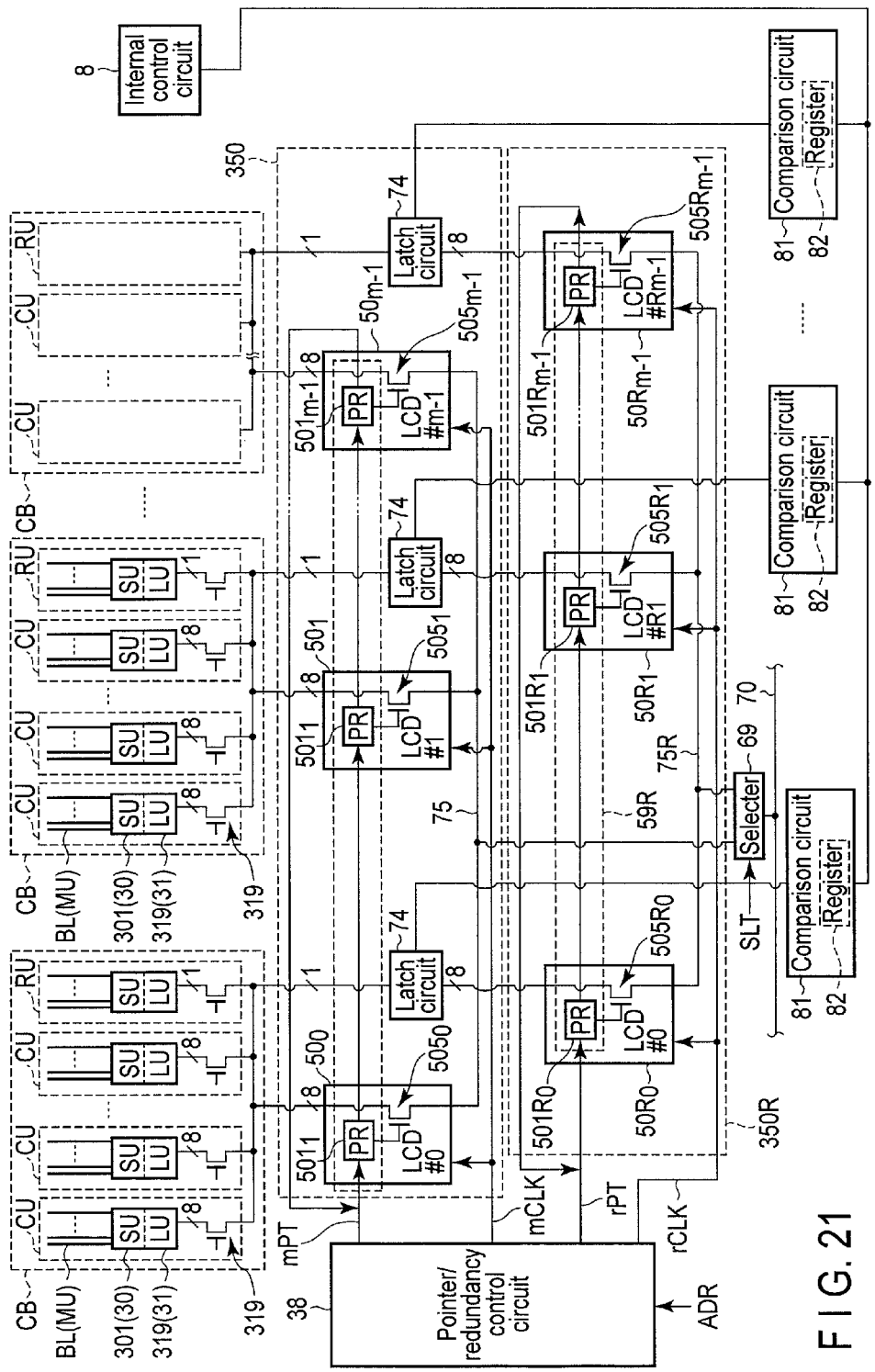
F I G. 21

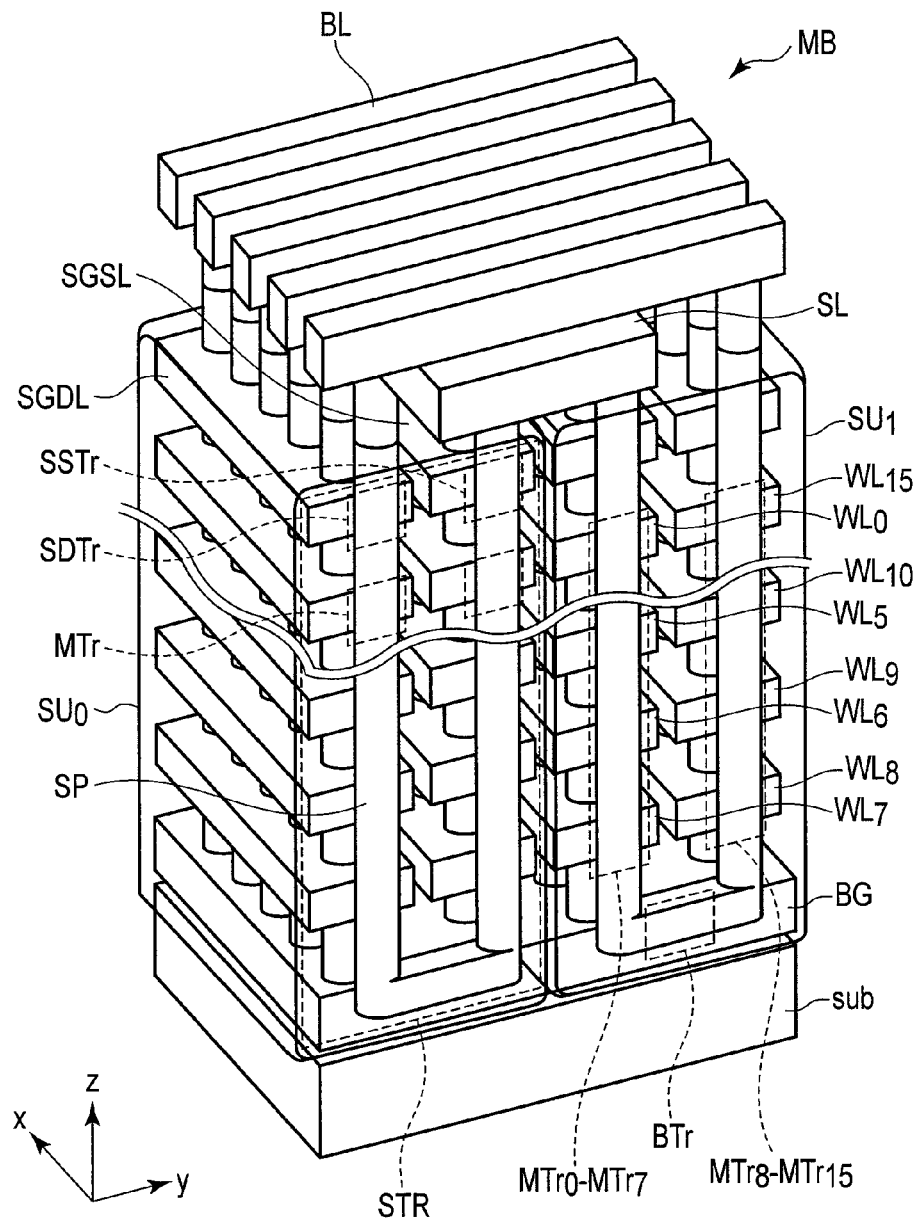
F I G. 22

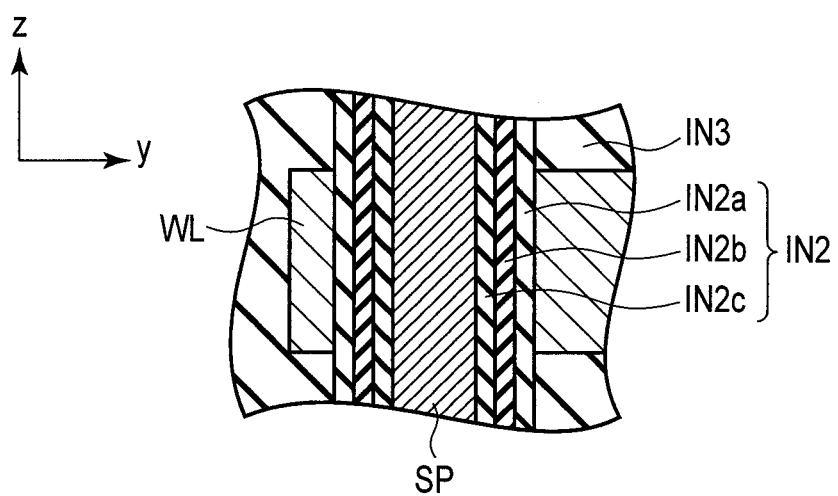
F I G. 24

SEMICONDUCTOR MEMORY AND METHOD OF CONTROLLING THE SAME

CROSS-REFERENCE TO RELATED APPLICATIONS

This application is based upon and claims the benefit of priority from Japanese Patent Applications No. 2012-121222, filed May 28, 2012; and No. 2012-273965, filed Dec. 14, 2012, the entire contents of all of which are incorporated herein by reference.

FIELD

Embodiments described herein relate generally to a semiconductor memory and a method of a controlling the same.

BACKGROUND

In recent years, a flash memory is used for a diversity of electronic equipment as a main storage device, in company with an HDD, a CD/DVD, and the like.

Regarding the flash memory, what is needed is, for example, improvement in input/output speed of data, improvement in operation reliability, reduction in a manufacturing cost, and the like.

BRIEF DESCRIPTION OF THE DRAWINGS

FIG. 1 is a block diagram illustrating an example of a circuitry of a semiconductor memory according to one embodiment;

FIG. 3 is schematic diagram illustrating example of an internal configuration of a periphery portion of the memory cell array;

FIG. 4 is schematic diagram illustrating example of an internal configuration of a periphery portion of the memory cell array;

FIG. 5 is a schematic diagram illustrating an example of a configuration of a semiconductor memory according to a first embodiment;

FIG. 6 is a diagram for describing an example of operation of the semiconductor memory according to the first embodiment;

FIG. 7 is a timing chart illustrating an example of operation of the semiconductor memory according to the first embodiment;

FIG. 11 is a diagram illustrating an example of a configuration of a semiconductor memory according to a third embodiment;

FIG. 13 is a diagram illustrating an example of a configuration of a semiconductor memory according to a third embodiment;

FIG. 14 is a diagram for describing an example of operation of the semiconductor memory according to the third embodiment;

FIG. 16 is schematic diagram illustrating example of an internal configuration of a periphery portion of the memory cell array;

FIG. 19 is a schematic diagram illustrating an example of a configuration of a semiconductor memory according to a fifth embodiment;

FIG. 21 is a schematic diagram illustrating an example of a configuration of a semiconductor memory according to a seventh embodiment;

FIG. 22 is a perspective view illustrating the structure of modification of the embodiment;

FIG. 24 is a sectional view illustrating the structure of modification of the embodiment.

DETAILED DESCRIPTION

[Embodiment]

Figure 2:
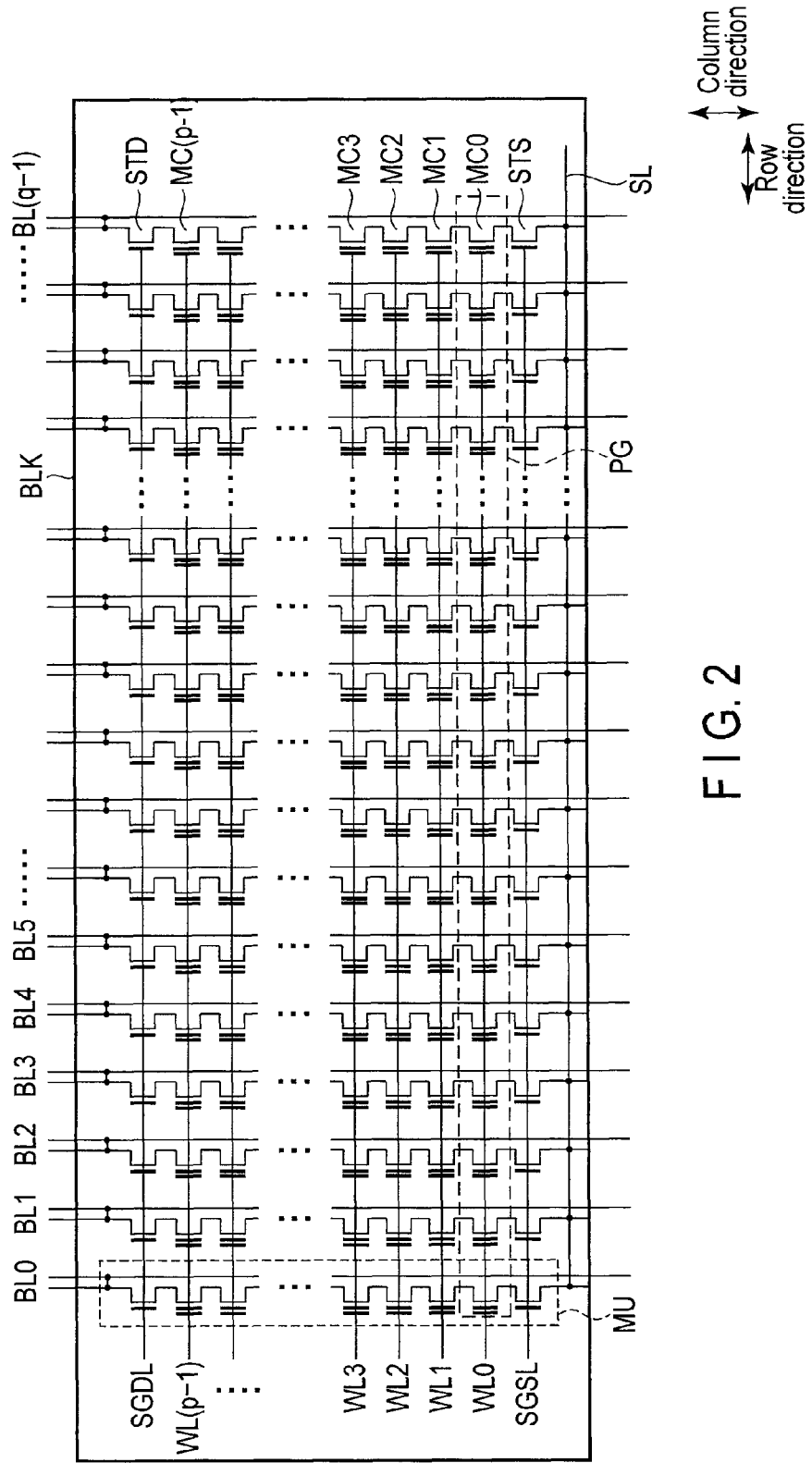
FIG. 2 is an equivalent circuit diagram illustrating an example of an internal configuration of a memory cell array.

Hereinafter, semiconductor memories according to embodiments are described in detail, with reference to FIGS. 1 through 14. In the description below, elements which have the same function and configuration are denoted by the same reference numerals, and an overlapping description will be given as necessary.

In general, according to one embodiment, a semiconductor memory includes a memory cell array including a main region and a redundancy region, the main region and the redundancy region including a plurality of memory cells arranged along a row direction and a column direction; a plurality of first control units configured to assign to a column of the main region; a plurality of second control units configured to assign to a column of the redundancy region; a column control circuit configured to sequentially select the first control units by using a first pointer corresponding to an address signal, and select the second control unit by using a second pointer when defect address information of the main region matches the address signal so that one of the first control units corresponding to the defect address information is replaced with one of the second control units; and a selection circuit configured to connect either one of a first data bus provided for the main region and a second data bus provided for the redundancy region to a third data bus provided for data transmission between the memory cell array and an outside of the memory cell array, based on a comparison result between the address signal and the defect address information.

It will be understood that when an element is referred to as being "electrically connected to" or "connected to" another element, it can be not only directly connected but also connected to the other element or intervening elements may be present.

(1) First Embodiment

A semiconductor memory according to a first embodiment is described with reference to FIGS. 1 through 7.

(a) Configuration

The configuration and function of the semiconductor memory according to the present embodiment are described with reference to FIGS. 1 through 5.

FIG. 1 is a block diagram illustrating the main part of the configuration of the semiconductor memory of the present embodiment. The semiconductor memory of the present embodiment is a nonvolatile semiconductor memory, more specifically, a flash memory.

A flash memory 100 of the present embodiment receives a signal supplied from external devices provided in the exterior of a chip of the flash memory 100, such as a memory controller 120, a host device 120, and the like, and transmits a signal to the memory controller 120 and the host device 120. To and from between the flash memory 100 and the memory controller 120 or the host device 120, a control signal (a command or status) is input and output via a control signal input/output terminal 10A, data is input and output via a data input/output terminal 103, and an address signal is input and output via an address input/output terminal 10C. The flash memory 100 of the present embodiment, and the memory controller/host device 120 form a memory system 200.

The flash memory 100 of the present embodiment includes a memory cell array 1 to store data. The memory cell array 1 includes a plurality of memory cells.

When the flash memory illustrated in FIG. 1 is a NAND flash memory, for example, the memory cell array 1 includes a plurality of blocks. The block BLK is a minimum unit for elimination of data.

Here, the internal configuration of the memory cell array 1 illustrated in FIG. 1 is described with reference to FIG. 2, in addition to FIG. 1. FIG. 2 is an equivalent circuit diagram illustrating the circuitry of one block BLK.

In the NAND flash memory, one block BLK includes a plurality of memory cell units (hereinafter, also referred to as NAND cell units) MU arranged in a line along with an x direction which is also called a first direction or a row direction. In one block BLK, q pieces of memory cell units MU are provided, for example.

One memory cell unit MU includes a memory cell string formed from a plurality (for example, p in number) of memory cells MC0 to MC, a first select transistor STS (hereafter, referred to as a source-side select transistor) connected to one end of the memory cell string, a second select transistor STD (hereafter, referred to as a drain-side select transistor) connected to the other end of the memory cell string. In the memory cell string, current paths of the memory cells MC0 to MC(p−1) are connected in series to each other along a y direction which is called a second direction or a column direction.

A source line SL is connected to an end (source-side end) of the memory cell unit MU, and, more specifically, to an end of the current path of the source-side select transistor STS. A bit line BL is connected to the other end (drain-side end) of the memory cell unit MU, that is, one end of the current path of the drain-side select transistor STD.

The number of memory cells which form one memory cell unit MU is suitably two or more, and it may be, for example, 16, 32, 64, or more. Hereinafter, when not distinguishing a specific memory cell from among memory cells MC0 to MC(p−1), the memory cell is denoted as a memory cell MC.

The memory cell MC is a field effect transistor of the stack gate structure including a charge storage layer (for example, a floating gate electrode or an insulation layer in which a trap level exits). The sources/drains of the two memory cells MC adjacent to each other in the y direction are connected to each other. In this way, a series connection of the current paths of the memory cells MC is made to form the memory cell string.

The drain of the source-side select transistor STS is connected to the source of the memory cell MC0. The source of the source-side select transistor STS is connected to the source line SL. The source of the drain-side select transistor STD is connected to the drain of the memory cell MC(p−1). The drain of the drain-side select transistor STD is connected to one bit line of the plurality of bit lines BL0 to BL(q−1). The number of bit lines BL0 to BL(q−1) equals the number of memory cell units MU provided in one block BLK.

Word lines WL0 to WL(p−1) extend in the x direction, and each of the word lines WL0 to WL(p−1) is connected in common to gates of the plurality of memory cells MC arranged along the x direction. In one memory cell unit MU, the number of word lines equals the number of the memory cells which form one memory cell string.

Each of drain-side select gate lines SGDL extends in the x direction, and is connected in common to gates of the plurality of drain-side select transistors STD arranged along the x direction. Each of source-side select gate lines SGSL extends in the x direction, and is connected in common to gates of the plurality of source-side select transistors STS arranged along the x direction.

Hereinafter, when not distinguishing a specific bit line from among bit lines BL0 to BL(q−1), the bit line is denoted as a bit line BL, and when not distinguishing a specific word line from among word lines WL0 to WL(p−1), the word line is denoted as a word line WL.

Each of the memory cells MC stores data supplied from the outside by mapping data and the magnitude of a threshold voltage (the distribution of a threshold voltage) of a transistor with each other.

Each of the memory cells MC stores data of a binary value (1 bit), a ternary value (2 bits), or more multiple values.

For example, when one memory cell MC stores the data of a binary value "0" or "1", the memory cell MC has two threshold distributions corresponding to the values of the data. For example, when one memory cell MC stores data of a quaternary value (2 bits) "00", "01", "10", or "11", the memory cell MC has four threshold distributions corresponding to the values of the data. Hereinafter, the memory cell which stores the data of multiple values more than a ternary value (2 bits) is referred to as a multiple-valued memory.

The data is written into or read out in a lump from the memory cells MC connected to the same word line WL. A control unit of the data when the data is written or read is called a page PG.

In the case of the data for the multiple-valued memory, the data is written in or read out for every lower bit (lower order bit) or every upper bit (higher order bit). Therefore, when one memory cell MC holds 2 bits of data, two pages are assigned to one word line WL. Hereinafter, a page corresponding to the data of the lower bits which is written or read in a lump is called a lower page, and a page corresponding to the data of the upper bits which is written or read in a lump is called an upper page.

For example, the memory cell array 1 includes a storage region (hereinafter, referred to as a main region) 11 which mainly stores external data which is input from the outside, and a region (hereinafter, referred to as a redundancy region) 12 which is to secure redundancy. The main region 11 and the redundancy region 12 are logically divided regions in the memory cell array 1.

The redundancy region 12 includes memory cells (hereinafter, referred to as redundancy cells) and bit lines (hereinafter, referred to as redundancy bit lines) for repairing memory cells which are defective (hereinafter, referred to as defective cells) or bit lines which are defective (hereinafter, referred to as defective bit lines) when the defective memory cells or the defective bit lines exist in the main region 11.

The connection relation between the redundancy cells in the redundancy region 12 and each of wirings WL, BL, and SL is substantially identical to the connection relation between the memory cells MC in the main region 11 illustrated in FIG. 2 and each of wirings WL, BL, and SL.

In the redundancy region 12, a plurality of redundancy cells forms a memory cell string like the memory cells in the main region 11. A memory cell string includes the redundancy memory cells. Select transistors are connected to both ends of the memory string, respectively, to form a memory cell unit in the redundancy region 12.

For example, the redundancy region 12 and the main region 11 are adjacent to each other in the row direction in the memory cell array 1. The redundancy cells are connected to the same word line WL to which the memory cells MC are connected. The select transistors in the redundancy region 12 are connected to the same select gate lines SGDL and SGSL to which the select transistors in the main region 11 are connected. The redundancy cells for each memory cell unit are connected to one bit line (hereinafter, referred to as a redundancy bit line). The memory cell unit in the redundancy region 12 is connected to the same source line SL to which the memory cell unit in the main region 11 is connected.

The storage capacity of the redundancy region 12 in the memory cell array 1 may be made smaller than the storage capacity of the main region 11.

A row control circuit 2 performs control concerning rows of the memory cells in the memory cell array 1. The row control circuit 2 is connected to the word lines WL and the select gate lines SGDL and SGSL provided in the memory cell array 1. The row control circuit 2 includes a row decoder and a driver. Based on an address signal transmitted from an address buffer 9, the row control circuit 2 selects a block BLK and a page PG, and controls operation (potentials) of the word lines WL and the select gate lines SGDL and SGSL.

A source line control circuit 4 controls the potential of the source line SL connected to the memory cell unit MU. A well control circuit 5 controls the potential of a well region in the memory cell array 1.

A potential generation circuit 6 generates a write voltage, a read potential, an intermediate potential, and a non-selection potential which are applied to each of the word lines WL at the time of writing data (at the time of programming), and at the time of reading and erasing data. The potential generation circuit 6 also generates potentials which are applied to the select gate lines SGDL and SGSL, for example. The potential generated by the potential generation circuit 6 is input to the row control circuit 2, and applied to each of a selection word line, a non-selection word line, and the select gate lines. The potential generation circuit 6 generates a potential which is applied to the source line SL and a potential which is applied to the well region. The potential generation circuit 6 transmits the generated potentials to the source line control circuit 4 and the well control circuit 5.

A data input/output buffer 7 serves as an interface for input/output of data. The data input/output buffer 7 temporarily holds the external data which is input via a data input/output terminal 10B. The data input/output buffer 7 outputs the external data which has been held, at a predetermined timing. The data input/output buffer 7 temporarily holds the data supplied from the memory cell array 1. The data input/output buffer 7 outputs the data supplied from the memory cell array 1 after holding the data for a certain period of time, to the data input/output terminal 105, at a predetermined timing.

An address buffer 9 temporarily holds the address signal which is input via an address signal terminal 10C. The address signal supplied from the outside represents a physical address, and includes a physical row address and a physical column address.

An internal control circuit (also, referred to as a state machine) 8 manages operation of the whole flash memory. An internal control circuit 8 receives a control signal (command) which is input from a control signal input/output terminal 10A. This control signal is output from the memory controller 120 or the host device 120, for example. For example, the internal control circuit 8 includes a command interface. For example, the internal control circuit 8 transmits the control signal (status) which indicates an operation state of the inside of the flash memory 100 to the memory controller 120 or the host device 120 via the control signal input/output terminal 10A. In this way, the operation state of the flash memory 100 is notified to the external memory controller 120 or the host device 120 which is installed outside the flash memory 100.

A column control circuit 3 controls the bit lines BL of the memory cell array 1, input/output of the data which is read from the memory cell MC, input/output of the data which is to be written in the memory cell MC, and the like. The column control circuit 3 includes a sense amplifier circuit 30, a data latch circuit 31, and a column decoder 35.

The sense amplifier circuit 30 is connected to the bit lines BL provided in the memory cell array 1. When data reading is performed (i.e., when data is output from the memory cell array 1), the sense amplifier circuit 30 detects and amplifies the potential fluctuation of the bit lines BL, and determines the data which is stored in the memory cell MC. The sense amplifier circuit 30 charges or discharges the bit lines BL when data writing is performed (i.e., when data is input to the memory cell array 1).

The data latch circuit 31 temporarily stores the data which is read from the memory cell array 1 or the data which is to be written into the memory cell array 1.

A column decoder 35 selects and activates the control unit which is set with respect to the column of the memory cell array 1.

The flash memory 100 of the present embodiment controls operation of the memory cell array 1 and the circuits 30, 31, and 35 in the column control circuit 3 using a pointer mPT. The flash memory 100 of the present embodiment includes a pointer control circuit 38, for controlling the pointer mPT, in the column control circuit 3.

The input and output of the data of the flash memory 100 can be accelerated by controlling operation of the flash memory 100 using the pointer mPT.

The pointer control circuit 38 generates the pointer mPT for selecting one control unit of the column, based on the address signal transmitted from the address buffer 9.

The sense amplifier circuit 30 includes a plurality of sensing units SU for detecting and amplifying a signal (data). The data latch circuit 31 includes a plurality of latching units (LU) for temporarily storing the signal (data). The column decoder 35 includes a plurality of local column decoders (LCD) assigned to the control units of the column of the memory cell array 1, respectively.

Here, the internal configuration of the column control circuit 3, and the control unit assigned to the column of the memory cell array 1 will be described with reference to FIGS. 3 and 4, in addition to FIG. 1.

FIG. 3 is a schematic diagram for describing the control unit which is set with respect to the column of the memory cell array 1, and the circuit configuration of each circuit in the column control circuit 3 corresponding to the control unit.

FIG. 4 is a schematic diagram for describing a connection relation among the bit lines in the memory cell array 1, the sensing units in the sense amplifier circuit 30, and the latching units in the data latch circuit 31.

As illustrated in FIGS. 3 and 4, the sense amplifier circuit 30 includes a plurality of sense amplifier units 301. One sense amplifier unit 301 is connected to one bit line BL, for example. The sense amplifier unit 301 charges and discharges a predetermined bit line BL, by control of the sense amplifier circuit 30 and the internal control circuit 8, when data writing is performed. The sense amplifier unit 301 detects and amplifies the potential fluctuation of the predetermined bit line BL when data reading is performed. The sense amplifier unit 301 may be provided with a function as a latch (buffer).

One sense amplifier unit 301 may be shared by an even-numbered bit line and an odd-numbered bit line which are adjacent to each other, depending on a method of sensing the bit line BL. When the sense amplifier unit 301 is shared by two bit lines, the even-numbered bit line and the odd-numbered bit line which share the sense amplifier unit 301 are selectively connected to the sense amplifier unit 301 with different timings, according to operation.

The data latch circuit 31 includes a plurality of latching units 311. One latching unit 311 is connected to one bit line BL via the sense amplifier unit 301 (i.e., the sense amplifier circuit 30). The latching unit 311 temporarily holds the data to be written into the memory cell, the data which is read from the memory cell, setup information (flag) which indicates operation for the memory cell, and the like. The latching unit 311 functions to amplify the signal supplied from the sense amplifier unit 301, or an external signal.

The latching unit 311 includes a plurality of latches. The latching unit 311 includes an upper data latch which holds data of an upper bit, and a lower data latch which holds data of a lower bit when the memory cell MC stores two bits of data. The latching unit 311 includes a flag latch which holds a flag indicating operation mode. The latching unit 311 may further include a latch for cache reading, and a latch for holding a determination result of a fail bit.

For example, one control unit CU is formed by eight bit lines (eight memory cell units) BL0 through BL7, eight sensing units 301 corresponding to the bit lines BL0 through BL7, and eight latching units 311 corresponding to the bit lines BL0 through BL7. Hereinafter, the control unit which is formed by eight bit lines, eight sensing units, and eight latching units is referred to as a column unit CU. In this case, one column unit CU within the data of one page corresponds to data of 8 bits (1 byte). However, the number of bit lines BL included in one column unit (also referred to COL) CU, the number of the sensing units 301, and the number of the latching units 311 are not limited to eight.

Each of the column units CU is connected to the column decoder 35 and a data bus via a field effect transistor 319 serving as a selection switch of the column unit CU. Hereinafter, the selection switch 319 used for selection and activation of each of the column units CU is also referred to as a column unit selection switch 319.

As illustrated in FIG. 3, the column decoder 35 includes a plurality of local column decoders $50_0, 50_1, \ldots,$ and $50_{(m-1)}$.

Hereinafter, for simplification of description, the local column decoder is referred to as the LCD. When not distinguishing a specific LCD from among LCDs $50_0, 50_1, \ldots, 50_{m-1}$, the LCD is denoted as an LCD 50. In addition, the column unit CU may be connected to the LCD 50 via a latch circuit which stores data size (for example, 8 bits) corresponding to the number of the hit line in the column unit, respectively.

The plurality of LCDs 50 controls selection and activation of the columns of the memory cell array 1. One LCD 50 corresponds to a plurality (x pieces) of column units CU which belongs to a certain group (control unit). One LCD 50 controls selection and activation of the column units CU based on a given order and certain operation timing. A group including a plurality of column units CU corresponding to one LCD 50 is referred to as a column block CB.

The LCDs $50_0, 50_1, \ldots,$ and $50_{m-1}$ include registers $501_0, 501_1, \ldots,$ respectively and $501_{m-1}$ and selection switches $505_0, 505_1, \ldots,$ and $505_{m-1}$, respectively. For clarification of description, when not distinguishing a specific register from among the registers $501_0, 501_1, \ldots,$ and $501_{m-1}$ of the LCDs 50, the register is denoted as a register 501. In addition, when not distinguishing a specific selection switch from among the selection switches $505_0, 505_1, \ldots,$ and $505_{m-1}$ of the LCDs 50, the selection switch is denoted as a selection switch 505.

In the column decoder 35, each of the registers 501 is connected to an adjacent register 501 and ranges over a plurality of LCDs 50 assigned to the main region 11, thereby forming a shift register 59.

The selection switch 505 in the LCD 50 is a field effect transistor 505, for example. The field effect transistor 505 serving as the selection switch 505 controls connection between the column block CB and the data bus 70 or 75. For example, the signal which is held by the register 501 is used as a control signal for controlling ON and OFF of the field effect transistor 505.

When the transistor 505 turns on, the column block CB and the column unit CU are electrically connected to the data bus 75. Hereinafter, the selection switch 505 in the LCD 50 is also referred to as a data pass switch 505.

In this way, a plurality of column blocks CB and a plurality of column units CU are set for the main region 11 of the memory cell array 1.

In this way, the column blocks RB and the column units RU which are configured in the same way as in the main region 11 are set for the redundancy region 12 of the memory cell array 1. Hereinafter, the column block RB of the redundancy region 12 is referred to as a redundancy column block RB, and the column unit RU of the redundancy region 12 is referred to as a redundancy unit RU.

A plurality (n pieces) of redundancy column blocks RB is set for the redundancy region 12, like in the main region 11 of the memory cell array 1. Each of the redundancy column blocks RB includes a plurality of column units (redundancy units) RU having the circuit configuration illustrated in FIG. 4.

A plurality of LCDs $50R_0, \ldots,$ and $50R_{n-1}$ is provided in the column decoder 35 so as to correspond to the redundancy column blocks RB of the redundancy region 12, respectively. Hereinafter, the LCDs 50R corresponding to the redundancy column blocks RB are referred to as redundancy LCDs $50R_0, \ldots,$ and $50R_{n-1}$. When not distinguishing a specific redundancy LCD from among the redundancy LCDs $50R_0, \ldots,$ and $50R_{n-1}$, the redundancy LCD is denoted as a redundancy LCD 50R. The redundancy unit RU may be connected to the redundancy LCD 50R via a latch circuit which stores data size (for example, 8 bits) corresponding to the number of the bit line in the redundancy unit, respectively.

The redundancy LCD 50R has substantially the same internal configuration as the LCD 50 assigned to the main region 11. The redundancy LCDs $50R_0, \ldots,$ and $50R_{n-1}$ includes registers $501R_0, \ldots,$ and $501R_{n-1}$, respectively and selection switches (field effect transistors) $505R_0, \ldots,$ and $505R_{n-1}$, respectively. For clarification of description, when not distinguishing a specific register from among the registers $501R_0, \ldots,$ and $501R_{n-1}$ provided in the redundancy LCDs 50R corresponding to the redundancy region 12, the register is denoted as a register 501R. In addition, when not distinguishing a specific selection switch from among the selection switches $505R_0, \ldots,$ and $505R_{n-1}$, the selection switch is denoted as a selection switch 505R.

The shift register 59R is formed by the registers $501R_0, \ldots,$ and $501R_{n-1}$ of the plurality of redundancy LCDs 50R. The shift register 59R which is formed by the registers 501R of the plurality of redundancy LCDs 50R is electrically disconnected from the shift register 59 which is formed by the registers 501 of the plurality of LCDs 50 provided for the main region 11.

Hereinafter, for clarification of description, among the column decoders 35, part (circuit area) of the column decoders 35 which controls the columns of the main region 11 is referred to as a main column decoder 350, and part of the column decoders 35 which controls the columns of the redundancy region 12 is referred to as a redundancy column decoder 350R.

For example, m column blocks CB are provided for the main region 11 in one memory cell array 1, and m LCDs 50 are provided for the column decoder 35. For example, one column block CB includes 16 column units CU. The number of column blocks CB which is set up for the main region 11 is not limited. The number of column blocks CB varies depending on the number of column units CU assigned to one column block CB, or the number of memory cells MC belonging to one page. The number of LCDs 50 included in the main column decoder 350 equals the number of column blocks CB in the main region 11.

The number (n pieces) of the redundancy column blocks RB which is set for the redundancy region 12 is smaller than the number of the column blocks CB which is set for the main region 11. The number of redundancy LCDs 50R in the redundancy column decoder 350R equals the number of the column blocks RB in the redundancy region 12, and is smaller than the number of the LCDs 50 which control the main region 11. The number (y pieces) of the column units RU included in each of the redundancy column blocks RB may be equal to or different from the number (x pieces) of the column units CU included in each of the column blocks CB in the main region 11.

Regarding the main region 11 and the redundancy region 12 of the memory cell array 1, the plurality of LCDs 50 and 50R may be provided in the column decoder 35 such that one LCD 50 or 50R may correspond to one column unit CU.

In the flash memory 100 of the present embodiment, independent data buses 75 and 75R are provided for the main region 11 and the redundancy region 12 of the memory cell array 1, respectively. The data bus 75 to the main region 11 and the data bus 75R to the redundancy region 12 are electrically disconnected. Hereinafter, the data buses 75 and 75R which are independently provided for the main region 11 and the redundancy region 12 of the memory cell array 1, respectively are also referred to as local data buses 75 and 75R, respectively. The two local data buses 75 and 75R are connected to a selector (selection circuitry) 69.

The selector 69 is connected to a data bus (hereinafter, also referred to as a global data bus or an I/O path) 70 for input/output of data between the memory cell array 1 and the outside (for example, the data input/output buffer 7) of the memory cell array 1. The selector 69 selects either the local data bus 75 or the local data bus 75R based on the control signal SLT, and causes the selected local data bus of the two local data buses 75 and 75R to be connected to the global data bus 70. For example, the global data bus 70 is connected to the data input/output buffer 7

As illustrated in FIG. 3, in the present embodiment, a selection of the column of the memory cell array 1 of the flash memory 100 is performed using the pointers mPT and rPT.

The pointers mPT and rPT are generated based on the internal address signal generated by the internal circuit of the flash memory 100 or the address signal (column address) which is externally input to the control circuit 3 via the address buffer 9.

For example, the pointers mPT and rPT are generated by the pointer control circuit 38 provided in the column control circuit 3. The address (column unit, column block) which has been selected in the present situation and the address which is to be selected next time are identified by the pointer (the value of the pointer).

When an external address signal (start address) ADR is input, the pointer control circuit 38 outputs a control signal to the main column decoder 350. The control signal is a signal for setting the generated pointer mPT to the LCD 50 indicated by the address signal, to control operation of the column block CB and the column unit CU of the main region 11.

The pointer mPT is set to the register 501 in one LCD 50 indicated by the external address signal ADR. The column block CB and the column unit CU corresponding to the LCD 50, to which the pointer mPT is set, are objects of an initial operation when data reading or data writing is performed.

In the present embodiment, the expression "the pointer is set" means the state in which a signal (for example, an "H" level) which depends on the pointer mPT is held in the register 501 of the LCD 50 corresponding to the column address (the column block and the column unit). The field effect transistor 505 serving as the data pass switch 505 in the LCD 50 turns on or turns off depending on the hold state of the signal of the register 501. Hereinafter, the signal which indicates the state where the pointer is set is referred to as a set state signal.

The pointer control circuit 38 generates a shift clock mCLK for moving (shifting) the pointer mPT among the plurality of LCDs 50 as well as generates and sets the pointer mPT used for the main region 11. The shift clock mCLK generated inside the pointer control circuit 38 is input to each of the LCDs 50.

As described above, the registers 501 in the plurality of LCDs 50 form the shift register 59 provided for the main column decoder 350. Synchronizing with the shift clock mCLK which is input to each of the LCDs 50, the signal (the set state signal) which is held by the register 501 in a specific LCD (for example, a k-th LCD) 50 is shifted to the register 501 in a later-stage LCD (for example, a k+1-th LCD) 50. As a result, synchronizing with the shift clock mCLK, the pointer mPT is shifted among the LCDs 50, and the selected column block CB change over in turn.

For example, when the pointer mPT is initially set to the register $501_0$ of a first LCD $50_0$, it is sequentially transmitted to the register $501_1$ of a second LCD $50_1$ and then to the register $501_2$ of a third LCD 502, synchronizing with the main-side shift clock mCLK. The pointer mPT reaches the register $505_{m-1}$ of the last-stage LCD $50_{m-1}$.

When the input/output of the data having a predetermined data length corresponding to a command is not completed, the pointer mPT is transmitted to the register $501_0$ of the first LCD $50_0$ after the operation is performed on the column block CB and the column unit CU corresponding to the LCD $50_{m-1}$, and is then set and shifted in turn to a next bit in the order of the first LCD 50, the second LCD 50, and the third LCD 50, synchronizing with the main-side shift clock mCLK.

As for the selection of the plurality of column units CU in the column block CB, for example, in one operation cycle in which the pointer is shifted from the register $501_0$ of the first LCD $50_0$ toward the register $501_{m-1}$ of the m-th LCD $50_{m-1}$, when the operation for one column unit CU of the selected column block CB is completed, the target column blocks CB and the target column units CU of the operation sequentially change over in turn, for example, to one column unit CU of a later-stage column block CB, synchronizing with the shift of the pointer mPT.

When repetitive executions of the cycle of the shift of the pointer are carried out for the registers $505_0$ of the m pieces of LCDs 50, consecutive addresses assigned to the columns obtained by dividing the memory cell array 1 are sequentially selected one by one. As a result, for example, transmission of the data of one page is performed.

In this way, for control of the columns of the main region 11 of the memory cell array 1, the pointer mPT is shifted within the shift register 59 which is formed by the registers of the plurality of LCDs 50 at a predetermined timing and the plurality of column blocks CB and column units CU are selected in a given order.

The pointer control circuit 38 includes a circuit for controlling the operation with respect to the redundancy region 12 of the memory cell array 1 in addition to the circuit for controlling the operation with respect to the main region 11 of the memory cell array 1.

The pointer control circuit 38 performs not only the control with respect to the main region 11 but also control of replacing a defect with a redundancy when the defect occurs in the main region 11 of the memory cell array 1, or in each of the circuits for driving the main region 11. Hereinafter, the pointer control circuit 38 including a circuit (function) for redundancy control is referred to as a pointer/redundancy control circuit 38.

By the control performed by the pointer/redundancy control circuit 38, the main region 11 is replaced with the redundancy region 12 on a repair unit basis. The repair unit is a column unit CU or a column block CB. Therefore, a defective cell, a defective bit line, a defective sensing unit, or a defective latching unit can be repaired.

In the flash memory of the present embodiment, the control of the columns in the redundancy region 12 of the memory cell array 1 is performed using the pointer rPT, like the control of the columns in the main region 11.

The control of the columns of the redundancy region 12 is performed using the pointer rPT which is different from the pointer mPT used for the main region 11. Hereinafter, for clarification of description, the pointer rPT used for the control of the columns of the redundancy region 12 is referred to as a redundancy-side pointer rPT. The pointer mPT used for the control of the columns of the main region 11 is referred to as a main-side pointer mPT.

As described above, the shift register 59R formed by the plurality of redundancy LCDs 50R of the redundancy column decoder 350R is electrically disconnected from the shift register 59 of the main column decoder 350.

The redundancy-side pointer rPT is held as a signal (set state signal) of the "H" level in the shift register 59R formed by the plurality of redundancy LCDs 50R, and moves among the plurality of redundancy LCDs 50R along a route which is different from the route of movement of the main-side pointer mPT.

The redundancy-side pointer rPT moves among the plurality of redundancy LCDs 50R of the redundancy column decoder 350R in response to a shift clock rCLK which is different from the shift clock mCLK which is used for the shift of the main-side pointer mPT.

Hereinafter, the shift clock mCLK used for the shift of the main-side pointer mPT is referred to as a main-side shift clock mCLK, and the shift clock rCLK used for the shift of the redundancy-side pointer rPT is referred to as a redundancy-side shift clock rCLK.

The redundancy-side shift clock rCLK is input to the plurality of redundancy LCDs 50R. For example, the redundancy-side pointer rPT moves within the shift register 59R, synchronizing with the input redundancy-side shift clock rCLK.

When a defective column unit CU in the main region 11 is replaced with a redundancy column unit (redundancy unit) RU in the redundancy region 12, the setting or shift of the redundancy-side pointer rPT enables the change-over of the redundancy column block RB and the redundancy unit RU which are selected.

Thus, in the flash memory 100 of the present embodiment, the redundancy column decoder 350R controls the columns of the redundancy region 12 using the pointer rPT and the shift clock rCLK which are different from those used for the LCDs 50 in the main column decoder 350.

The configuration of the pointer/redundancy control circuit 38 in the flash memory of the present embodiment is described with reference to FIG. 5, in addition to FIGS. 1 through 4.

FIG. 5 is a diagram illustrating an example of the internal configuration of the pointer/redundancy control circuit 38 included in the flash memory of the present embodiment.

The pointer/redundancy control circuit 38 is connected to the address buffer 9, for example, via a plurality of address decode lines (not illustrated). The address signal (physical column address) from the address buffer 9 is input to the pointer/redundancy control circuit 38 via the address decode line. For example, when the main region 11 has a storage capacity of about 8 Kbytes, 14 address decode lines are provided.

When the external address signal ADR is input, the pointer/redundancy control circuit 38 changes the signal (hereinafter, referred to as a set signal) which controls the setting of the pointers mPT and rPT, from a "L (0)" level to the "H (1)" level, and prepares for the setting of the pointer mPT to the LCD 50 corresponding to the external address signal ADR which is input.

The pointer/redundancy control circuit 38 starts generating an internal address signal (input address signal) Ain using an address generating unit 381, and then carries out an increment of the input external address signal ADR.

For example, synchronizing with the operation clock CLK of the flash memory, an increment of the value of the external address signal ADR indicating a first-selected column address is carried out by a counter 61 provided in the address generating unit 381. The converted value of the external address signal ADR and the increased address value are output as the internal address signal Ain. The internal address signal Ain represents the column address (start address) in the main region 11 which corresponds to the external address signal ADR, and the column address in the main region 11 which is successive to the external address signal ADR. For example, the two column addresses adjacent each other correspond to the addresses of different column blocks CB.

In addition, the internal address signal Ain corresponds to the pointer which indicates the column block CB and the column unit CU indicated by the external address signal ADR, and to the pointer mPT which indicates the address (column address) of the column block CB and the column unit CU which is to be subsequently selected. The value obtained by adding +1 to the present column address (pointer value) which is under selection represents the column address which is to be selected subsequently.

The two column addresses adjacent each other in the main region 11 correspond to two column units which belong to different column blocks CB, for example. Hereinafter, for simplification of description, the column block, the column unit, and the LCD corresponding to the column block may be referred to as a column address depending on cases. The description about the address (redundancy address) of the redundancy region 12 is similar to the description about the column address. In the main region 11, one column address corresponds to one control unit. In the redundancy region 12, one redundancy address corresponds to one control unit and a defect repair unit.

The value of the main-side pointer mPT represents a physical column address corresponding to the selected LCD 50. The value of the main-side pointer mPT matches the physical column address of the main region 11. In addition, the column block CB and the column unit CU which are under selection may be changed by carrying out a decrement of the pointer mPT.

The pointer/redundancy control circuit 38 sets the main-side pointer mPT to the selected LCD 50 using the column control signal generating unit 384 after the conversion from the external address signal ADR to the pointer mPT is finished and the preparation for causing the main region 11 to drive is finished.

Synchronizing with the setting of the pointer mPT to the LCD 50, the pointer/redundancy control circuit 38 generates the main-side shift clock mCLK, and the pointer/redundancy control circuit 38 supplies the main-side shift clock mCLK to the LCD 50 of the main column decoder 350. The main-side shift clock mCLK is used as a control signal of the shift register 59 in the main column decoder 350. For example, a frequency of the main-side shift clock mCLK differs from a frequency of the operation clock CLK of the flash memory (for example, the internal control circuit).

Synchronizing with the main-side shift clock mCLK, the signal hold state (hold state of the "H" or the "L" level) of each of the registers 501 which form the shift register 59 changes. As a result, the set state signal of the "H" level moves among the LCDs 50 in the main column decoder 350, and the column address to which the pointer mPT is set is shifted. With this operation, the column block CB and the column unit CU which are under selection (access) change over among the column blocks CB and the column units CU. In this way, the change of the signal hold state in the shift register 59 becomes equivalent to the shift of pointer mPT.

In the flash memory 100 of the present embodiment, the addresses of the column block and the column unit which have been selected in the present time can be identified using the pointer mPT. The pointer/redundancy control circuit 38 can also identify the column block CB and the column unit CU as an object for the present operation, for example, by distinguishing the pointer hold state of the LCD 50.

For example, by the method in which the pointer (pointer value) indicating the column block CB and the column unit CU which is an object for the operation is output to the internal control circuit 8 or another circuit, a peripheral circuit (for example, the internal control circuit 8) which forms the flash memory, the external memory controller 120, or the host device 120 can recognize which column block CB and column unit CU are an object for the present operation.

The pointer/redundancy control circuit 38 illustrated in FIG. 5 includes a replacement determination circuit 382 which performs a determination for a process of replacing an address of a defective column with a redundancy address, based on a result of a determination on whether the selected column address for the main region 11 is defective.

A defect address information storage circuit 64 which stores "information on defects" in the main region 11 is provided in the replacement determination circuit 382.

The defect address information storage circuit 64 stores addresses (the values of the pointer) CRD0, CRD1, . . . , and CRDk of defective column units or defective column blocks including a defective cell, a defective bit line, or a defective sensing unit/latching unit, as "information on defects". The defect address information storage circuit 64 includes a plurality of storage elements (for example, latches) 641 in which defective column addresses CRD0, CRD1, . . . , and CRDk are stored, respectively so that the plurality of defective column addresses CRD0, CRD1, . . . , and CRDk can be stored. Hereinafter, when not distinguishing a specific defective column address from among the plurality of defective column addresses CRD0, CRD1, . . . , and CRDk, the defective column address is denoted as a defective column address CRD.

When a malfunction is detected in the main region 11 of the memory cell array 1 at the time of the test of the flash memory 100, an address CRD of the column unit (or column block) including the defect is stored in the latch (hereinafter, referred to as a defective column address storing latch) 641 in the defect address information storage circuit 64 at the time when the flash memory 100 is powered up. The defective column address CRD as the information-on-defect in the main region 11 may be notified to the memory controller 120 and the host device 120, and may not be notified.

The defective column addresses CRD stored in the defective column address storing latches 641 may be stored in a nonvolatile storage region in the memory cell array 1 which is provided in addition to the main region 11 and the redundancy region 12, or may be stored in other storage regions (for example, a fuse circuit) provided in the chip. The defective column addresses CRD may be given from the outside of the flash memory 100, such as the memory controller 120 or the host device 120 when the power is supplied. The defect address information storage circuit 64 may store addresses of defects in a non-volatile manner.

For example, the defective column address storing latches 641 is associated with addresses (redundancy addresses) RD0, RD1, . . . , and RDk of the redundancy region 12. As a result, the defective column addresses CRD0 CRD1, . . . , and CRDk of the main region 11 are associated with the redundancy addresses RD0, RD1, and RDk of the redundancy region 12. Hereinafter, when not distinguishing a specific redundancy address from among the plurality of redundancy addresses RD0, RD1, . . . , and RDk, the redundancy address is denoted as a redundancy address RD.

The number of the defective column address storing latches 641 may be equal to the number of the redundancy addresses RD, each corresponding to the defect repair unit, i.e., the number of redundancy units RU in the redundancy region 12.

When the defective column unit becomes an object of operation at the time of the operation of the flash memory 100, the redundancy address RD associated with the defective column address CRD indicating the defective column unit is accessed without accessing the defective column unit. The redundancy unit RU corresponding to the redundancy address RD is an object of the input/output of data (writing/reading of data). Thus, the defect in the main region 11 is repaired by performing a replacement process in which the defect is replaced with a redundancy.

When the defective column address storing latch 641 is associated with the redundancy column block RB, the defects which occur in the main region 11 are repaired in the unit of a column block. In this case, the number of the defective column address storing latches 641 may be set to be equal to the number of redundancy column blocks RB.

As illustrated in FIG. 5, the replacement determination circuit 382 in the pointer/redundancy control circuit 38 includes a comparison circuit 63 and a determining unit 65.

The comparison circuit 63 compares the input internal address signal (the value of the column address or the pointer mPT which is to be selected next time) Ain with each of the defective column addresses (the values of the pointer at the defects) CRD stored in the defect address information storage circuit 64. For example, the comparison circuit 63 includes a plurality of comparing units 631. The comparing units 631 are provided in the comparison circuit 63 such that one comparing unit 631 may correspond to one defective column address storing latch 641.

For example, each of the comparing units 631 outputs the signal of a "L(0)" level when the input internal address signal Ain does not match the defective column address CRD in the defective column address storing latch 641 corresponding to the comparing unit 631, and outputs the signal of a "H(1)" level when the internal address signal Ain matches the defective column address CRD.

The determining unit 65 outputs, as a determination signal, the result of the determination about the presence of the replacement process which is determined based on the comparison result of the internal address signal Ain and the defective column address CRD.

The determining unit 65, for example, has a calculating unit having an OR gate 651. The output (comparison result) from each of the comparing units 631 is input to each input terminal of the OR gates 651 of the determining unit 65. If all the outputs of the respective comparing units 631 are "0", the output of the OR gate 651 of the determining unit 65 will be set to "0." if all the outputs of the respective comparing units 631 are "1", the output of the OR gate 651 of the determining unit 65 will be set to "1."

When the internal address signal in which is input to the replacement determination circuit 382 does not match the defective column address in the defect address information storage circuit 64, the determining unit 65 outputs a determination signal (for example, the signal of the "L(0)") indicating that the column unit CU in the main region 11 which is to be selected next time is not defective (the replacement process is not performed).

When the internal address signal Ain which is input to the replacement determination circuit 382 matches the defective column address in the defect address information storage circuit 64, the determining unit 65 outputs a determination signal (for example, the signal of the "H(1)") indicating that the column unit CU in the main region 11 which is to be selected next time is defective (the replacement process is performed).

The determination signal of the determining unit 65 is input to the column-control-signal generating unit 384 in the pointer/redundancy control circuit 68.

The column-control-signal generating unit 384 controls the setting of the pointer mPT or rPT for the main region 11 or the redundancy region 12, based on the input of the external/internal address signal ADR/Ain to the pointer/redundancy control circuit 38, and the input of the determination signal. The column-control-signal generating unit 384 causes the LCD 50 or 50R corresponding to the selected address in the main region 11 or the redundancy region 12 to enter a set state (a hold state of the "H" level signal), based on the pointer mPT or rPT.

The column-control-signal generating unit 384 includes a main-side control unit 66 for generating and controlling the pointer mPT and the shift clock mCLK for the main region 11, and the redundancy-side control unit 67 for generating and controlling the pointer rPT and the shift clock rCLK for the redundancy region 12. The column-control-signal generating unit 384 includes a set signal control unit 68 which controls a signal level of a set signal SET for controlling a timing of setting of the pointers mPT and rPT and timing of generation of the shift clocks mCLK and rCLK.

The column-control-signal generating unit 384 sets the pointer mPT to the column address (the column block and the column unit) of the main region 11, as described above, and sets the pointer rPT to the redundancy address (the redundancy block and the redundancy unit) corresponding to the redundancy region 12 in order to control the replacement process of the defective column unit.

In a case where the defective column address CRD is replaced with the redundancy address RD by the control of the column-control-signal generating unit 384, the register 501 of the redundancy LCD 50R corresponding to the redundancy address RD which is to be used for the replacement process, within the shift register 59R of the redundancy column decoder 350R, holds the signal of the "H" level. The redundancy column block RB corresponding to the redundancy LCD 50R holding the signal of the "H" level is activated, and the redundancy unit RU indicated by the redundancy address RD is selected. The input/output of the data with respect to the redundancy unit RU is performed in this way.

The column-control-signal generating unit 384 generates the shift clock mCLK for the main region 11 and the shift clock rCLK for the redundancy region 12 as well as controls each of the pointers mPT and rPT.

The column-control-signal generating unit 384 generates the main-side shift clock mCLK of a predetermined frequency. As described above, the generated main-side shift clock mCLK is supplied to each of the LCDs 50 in the main column decoder 350.

The redundancy-side control unit 67 of the column-control-signal generating unit 384 generates the redundancy-side shift clock rCLK. The redundancy-side shift clock rCLK is supplied to the register 501R which forms the shift register 59R in the redundancy column decoder 350R.

Synchronizing with the supplied redundancy-side shift clock rCLK, the redundancy block RB and the redundancy unit RU corresponding to the redundancy address RD which is an object of replacement are selected and activated. Synchronizing with the supplied redundancy-side shift clock rCLK, the pointer rPT for the redundancy region 12 is shifted among the redundancy LCDs 50R, and the signal hold state of the register 501R in the shift register 59R in the redundancy column decoder 350R changes.

The redundancy-side shift clock rCLK has a frequency different from that of the main-side shift clock mCLK. When the internal address signal Ain, which is input to the replacement determination circuit 382, does not match the defective column address CRD in the defect address information storage circuit 64 (when the replacement process is not performed), the redundancy-side control unit 67 of the column-control-signal generating unit 384 maintains the signal level of the redundancy-side shift clock rCLK at the "L" level. When the input internal address signal Ain matches the defective column address CRD (when the replacement process is performed), the redundancy-side control unit 67 of the column-control-signal generating unit 384 changes the signal level of the redundancy-side shift clock rCLK from the "L" level to the "H" level.

The determination signal of the determining unit 65 of the replacement determination circuit 382 is input to the selector 69 as a selection signal SLT for selecting one of the two local data buses 75 and 75R. The selector 69 selects either the main-side local data bus 75 or the redundancy-side local data bus 75R, based on the input selection signal SLT which is supplied from the determining unit 65.

As described above, the determination signal indicates the "L" level when the column unit CU in the main region 11 which is to be selected next time (subsequently) is not defective, and the determination signal indicates the "H" level when the column unit CU in the main region 11 which is to be selected next time is defective. When the signal of the "L" level is input to the selector 69 as the selection signal SLT, the selector 69 selects the main-side local data bus 75. Thus, the main-side local data bus 75 is electrically connected to the global data bus 70, and the input/output of the data DT is performed with respect to the column unit CU of the main region 11 corresponding to the column address to which the pointer mPT has been set.

Conversely, when the signal of the "H" level is input to the selector 69 as the selection signal SLT, the selector 69 selects the redundancy-side local data bus 75R. Thus, the redundancy-side local data bus 75R is electrically connected to the global data bus 70, and the input/output of the data DT is performed with respect to the column unit RU of the redundancy region 12 corresponding to the redundancy address to which the pointer rPT has been set. The data transmission between the redundancy unit RU and the global data bus 70 is directly performed between the replaced redundancy unit RU and the global data bus 70, without going through the LCD 50 and the latching unit 311 of the main region 11.

In this way, the redundancy unit RU replaces the defective column unit CU so that the defect of the main region 11 is repaired.

For example, during the operation of the flash memory 100, the defective column address CRD is not notified to external devices, such as the memory controller 120 and the host device 120, and the memory controller 120 and the host device 120 do not detect that the redundancy unit RU is accessed by the defect repair (replacement process).

In addition, when data reading is performed, even though the redundancy unit RU of the redundancy region 12 is connected to the global data bus 70 instead of the defective column unit of the main region 11, the data from the defective column unit (or the defective column block) of the main region 11 is output to the main-side local data bus 75. In this case, the data from the defective column unit which is output to the main-side local data bus 75 is intercepted by the selector 69 so that the data cannot be output to the global data bus 75.

In the flash memory of the present embodiment, the column unit CU which is the defect repair unit includes the sensing unit 301 and the latching unit 311 which are connected to the bit line and the memory cell MC. For this reason, besides the replacement of the defective cell and the defective bit line, the flash memory of the present embodiment can repair a defect in the sensing unit 301 and the latching unit 311 of the main region 11, by using the redundancy unit RU of the redundancy region 12, through the replacement process (repair process) of using the mutually-independent pointers mPT and rPT, when the defect occurs in the sensing unit 301 and the latching unit 311 included in the column unit CU of the main region 11.

As described above, as for the control of the column of the memory cell array 1, the flash memory 100 of the present embodiment independently generates and controls the pointer mPT and the shift clock mCLK for controlling the main region 11 of the memory cell array 1 and each of the circuits connected to the main region 11, and the pointer rPT and the shift clock rCLK for controlling the redundancy region 12 and each of the circuits connected to the redundancy region 12.

Using the mutually-independent pointers mPT and rPT, and the mutually-independent shift clocks mCLK and rCLK, the flash memory 100 of the present embodiment controls the process of replacing the defect in the main region 11 with the redundancy in the redundancy region 12, and repairs the defect in the main region 11.

Thus, in the flash memory 100 of the present embodiment, based on the result of comparison between the defective column address CRD and the address Ain which is to be selected next time, the data bus 70 is selectively connected to either the main region 11 or the redundancy region 12 by the selector 69, and the data DT is directly transmitted between the main region 11 and the data bus 70, or between the redundancy region 12 used in the replacement process and data bus 70.

The flash memory of the present embodiment can perform the data transmission between the redundancy region 12 and the data bus 70, without going through the data bus 70 and the latching unit 311 provided for the main region 11. Because of this, the flash memory of the present embodiment can perform a high speed operation.

Therefore, the operating characteristics of a semiconductor memory of the present embodiment may be improved.

(b) Operation

A control method (operation) of the flash memory of the first embodiment is described with reference to FIGS. 6 and 7. Hereinafter, in addition to FIGS. 6 and 7, FIGS. 1 through 5 are also suitably referred to in describing the operation of the flash memory of the present embodiment.

Herein, for simplification of description, described is an operation in which a first column unit CU (CU<0>) included in a first column block CB (CB#0) is selected by the external address signal ADR, and subsequently each column block CB and each column unit CU are sequentially selected.

FIG. 6 illustrates the mapping between the defective column addresses CRD in the main region 11 of the memory cell array 1 of the flash memory, and the redundancy addresses which are repair units in the redundancy region 12. Here, FIG. 6 illustrates a case as an example in which, as the pointer mPT is shifted, column addresses MA2 and MAj for a third main region 11 and a j+1-th main region 11, respectively are found to be defective column addresses CRD0 and CRD1.

For example, two adjacent column addresses belong to two adjacent column blocks CB, respectively, and two adjacent redundancy addresses belong to two adjacent redundancy column blocks RB, respectively.

FIG. 7 illustrates a timing chart for describing an operation example of the flash memory of the present embodiment.

For example, in the flash memory 100 of FIG. 1, a control signal (command) from the memory controller 120 or the host device 120 is input into the flash memory 100 via the control signal input/output terminal 10A. The address signal from the memory controller 120 or the host device 120 is input to the flash memory 100 via the address input/output terminal 10C.

When the memory controller 120 or the host device 120 issues a data write command to the flash memory 100, the data to be written is input to the flash memory 100 via the data input/output terminal 10B.

The address signal from the outside is input to the address buffer 9. Based on the input command, the internal control circuit (state machine) 8 of the flash memory 100 may generate the address signal.

When the command is input to the flash memory 100, or when the flash memory 100 is powered up, the information-on-defect (information on addresses of defects) is input to the replacement determination circuit 382 of the pointer/redundancy control circuit 38. For example, the defective column address included in the information-on-defect is stored in the defect address information storage circuit 64 provided in the replacement determination circuit 382. One or more defective column addresses CRD are stored in the defective column address storing latches 641 provided in the defect address storage circuit 64, respectively in a manner to correspond to the replacement units (repair units) which are set with respect to the redundancy region 12.

The address signal ADR is output to each of the row control circuit 2, the column control circuit 3, and the internal control circuit 8 from the address buffer 9.

The internal control circuit 8 drives each of the circuits in the flash memory, to execute the desired operation based on the command and the address signal. The row control circuit 2 prepares for driving the block and page (word line) based on the address signal. The potential generation circuit 6 starts generating the potentials to be applied to the word line, the selection gate lines, the source line, and the well region.

The external address signal (physical column address) ADR is input to the pointer/redundancy control circuit 38 of the column control circuit 3.

As illustrated in FIG. 7, in response to the input of the external address signal ADR, the signal level of the set signals mSET and rSET for the main region 11 and the redundancy region 12 is changed from the level "L(0)" to the level "H(1)" by the set signal control unit 68 of the column-control-signal generating unit 384 provided in the pointer/redundancy control circuit 38. With the change of the signal level of the set signals SET, the preparation for the operation for controlling the column of the memory cell array 1 is completed.

Using the set signal mSET of the "H" level which control the main region 11 and the external address signal ADR, the pointer mPT corresponding to the column block CB and the column unit CU in the main region 11 is generated by the column-control-signal generating unit 384.

Using the main-side set signal mSET of the "H" level, the shift clock (main-side shift clock) mCLK for setting the pointer mPT to the LCD 50 in the main region 11 indicated by the external address signal ADR is generated by the column-control-signal generating unit 384. The main-side shift clock mCLK is supplied to the plurality of LCDs 50 of the main column decoder 350, respectively.

The generated pointer mPT has a value which indicates the column block CB and the column unit CU corresponding to the input external address signal ADR. The generated pointer mPT is set, as a signal of the "H" level, to the LCD 50 corresponding to the column block CB and the column unit CU indicated by the column address (herein, address MA0).

After the preparation for control of the main region 11 is started, the signal level of the main-side set signal mSET is changed from the "H" level to the "L" level with a certain timing by the set signal control unit 68 of the column-control-signal generating unit 384.

During a period until a substantial access to the selected address is started after the set signal mSET changes to the "H" level, that is, the period until the LCD 50 starts driving, the internal address signal Ain corresponding to the external address signal ADR is transmitted to the replacement determination circuit 382. And the internal address signal Ain (=ADR) is input to the comparison circuit 63 of the replacement determination circuit 382. The internal address signal Ain (or the main-side pointer mPT) is input to each of the comparing units 63 of the comparison circuit 63.

The address signal ADR is compared by each of the comparing units 63 to confirm whether the address signal ADR matches the defective column address CRD stored in each of the defective column address storing latches 641 of the defective-column information storage circuit 64.

Herein, as illustrated in FIG. 6, a selected address MA0 (for example, the first column unit CU<0> of the first column block CB#0) in the main region 11 which is first selected based on the external address signal ADR is not defective. In this case, since the external address signal ADR, and each of the defective column addresses CRD0, CRD1, . . . and CRDi do not match, the signal "0" (the signal of the "L" level) is output to the determining unit 65 from each of the comparing units 631.

The signal "0" is input to all the input terminals of the OR gates included in the calculating units 651 in the determining unit 65, and the OR gates output the signal of the "L(0)" level.

When the replacement determination circuit 382 obtains the determination signal of the "L" level, the replacement process between the main region 11 and the redundancy region 12 is not performed.

When the determination signal of the "L" level is input to the column-control-signal generating unit 384 (when the selected address of the main region 11 is not a defect), for example, the redundancy-side control unit 67 in the column-control-signal generating unit 384 does not drive, and the control signal (the pointer and the shift clock) for the redundancy region 12 is not generated nor output.

Thus, when the input address does not match the defective column address CRD (when the column unit in the main region 11 to be selected next time is not defective), the data hold state of the shift register 590 of the redundancy LCD 50 becomes the "L(0)" level. As a result, the data pass switch 505R in the redundancy LCD 50R is not turned on. The redundancy block RB and the redundancy unit RU in the redundancy region 12 are not electrically connected to the redundancy-side local data bus LDP2 (75R).

When control of the column of the memory cell array 1 is started, generation of the main-side pointer mPT and the main-side shift clock mCLK, for example, is started by the set signal mSET of the "H" level, based on the timing at which the external address signal (or the address signal from the internal control circuit 8) ADR is input, without being dependent on the determination signal.

For example, the main-side control unit 66 of the column-control-signal generating unit 384 generates the main-side pointer mPT and the main-side shift clock mCLK as the control signals for the LCD 50, the column block CB, and the column unit CU before the input of the determination signal, and the preparation for outputting those signals mPT and mCLK is completed. For example, synchronizing with the timing at which the determination signal is input, the signal of the "H" level serving as the main-side pointer mPT is supplied to a predetermined LCD 50 corresponding to the address signal ADR by the main-side control unit 66. Herein, the main-side pointer mPT is held in the predetermined LCD 50 corresponding to the column address MA, synchronizing with the first clock signal of the main-side shift clock mCLK. The data hold state of the register 501 in the LCD 50 becomes the "H" level, and the data pass switch 505 turns on based on this "H" level signal. Thus, the column block CB and the column unit CU corresponding to the column address MA (herein, address MA0) are electrically connected to the main-side local data bus LDP1 (75).

The determination signal is supplied to the control terminal of the selector 69 as the selection signal SLT of the selector 69, from the replacement determination circuit 382. When the selection signal SLT is at the "L" level, the main-side local data bus LDP1 (75) is connected to the global data bus GDP (70) by the selector 69. In this case, the redundancy-side local data bus LDP2 (75R) is electrically disconnected from the global data bus GDP (70) by the selector 69.

As illustrated in FIG. 6, the selected address MA0 (herein, the first column CU<0> of the first column block CB#0) in the main region 11 based on the external address signal ADR is not defective, and the column block CB and the column unit CU of the main region 11 are accessed in relation to the LCD 50 to which the pointer mPT has been set. As a result, the data DT is serially input and output between the column unit CU serving as the selected address MA0, and the data bus GDP.

When data writing is performed, the data DT of a predetermined size is input to the latching unit 311 or the sense amplifier unit 301 in the selected column unit CU via the global data bus 70, the main-side local data bus 75 selected by the selector 69, and the data pass switch 505 and the column selection switch 319 which are in the ON state.

When data writing is performed, the data which is input to the selected column unit CU is not written immediately, but one page of the data is divisionally stored over the latching units and the sensing units of the plurality of column blocks CBs and the plurality of column units CU. Next, the potential of the bit line is set to the potential according to to-be-written data, and the write voltage is applied to the selection word line indicated by the address signal (physical row address). By this, the data from the outside can be written, in a lump, into the plurality of memory cells MC connected to the selection word line.

When data reading is performed, the data DT of a predetermined size detected by the sense amplifier unit is input to the latching unit 311 or the sense amplifier unit 301 in the selection column unit CU. Thus, for example, the data DT is output to the data input/output buffer (page buffer) 7 via the data pass switch 505 and the column selection switch 319 which are in the ON state, the main-side local data bus 75 selected by the selector 69, and the global data bus 70. In addition, when data reading is performed, the data which is output from the selection column unit CU in an amount of one page, may be first stored into the data input/output buffer 7, and then transmitted to the outside of the flash memory 100, or may be transmitted to the outside in the unit of the data output from the selected column unit CU at a random timing.

For example, in a case where the address signals ADR and Ain and the defective column address CRD match, the redundancy-side set signal rSET is maintained by the set signal control unit 68 at the "H" level so that the redundancy-side pointer rPT may be set to a predetermined redundancy address RD.

The external address signal ADR or the pointer mPT obtained from the external address signal ADR is input to the counter 61 of the control unit 381 of the pointer/redundancy control circuit 38. Synchronizing with the operation clock CLK of the flash memory 100, an increment operation (a calculation process of "+1") of the pointer mPT of the main region 11 is performed.

The internal address signal Ain obtained by the increment operation corresponds to the column address (pointer) MA of the column block CB and the column unit CU in the main region 11 which is to be accessed next time (which is to be selected next time).

For example, during a period until the pointer mPT is shifted to the LCD 50 of the address which is to be selected next time after the pointer mPT is set to a certain LCD 50, that is, a period in which the input or output of the data DT is performed with respect to the selected column unit CU, whether the internal address signal Ain obtained by the increment is defective or not is determined.

By an operation which is substantially the same as the above-described operation performed with respect to the external address signal ADR, the internal address signal (pointer) Ain acquired through the increment process is input to each of the comparing units 631 in the replacement determination circuit 382. The input address signal Ain is compared with the defective column address CRD, and the comparison result is output to the determining unit 65 from each of the comparing units 631. The determination signal based on the comparison result is output to column-control-signal generating unit 384 from the determining unit 65, and the selection signal SLT is output to the selector 69 from the determining unit 65.

The main-side pointer mPT is shifted to the LCD 50 which is to be selected next time from the LCD 50 corresponding to the column unit CU for which the input/output of the data is completed, by the main-side shift clock mCLK of a predetermined frequency, without being dependent on the determination result of good/fail with respect to the internal address signal Ain. With this operation, the column block CB and the column unit CU connected to the main-side local data bus 75 change over automatically, in sequence.

In the example illustrated in FIG. 6, when the second column address MA1 is not defective, after the input/output of the data with respect to the column unit CU corresponding to the first column address MA0 is performed, the column unit corresponding to the second column address MA1 is connected to the local data bus LDP1 by the shifted main-side pointer mPT. On the other hand, the pointer is not set to the redundancy block RB and the redundancy unit RU of the redundancy region 12, and the redundancy block RB and the redundancy unit RU are not connected to the local data bus 75R and the global data bus 70. Based on the determination result about the internal address signal Ain which is generated by the replacement determination circuit 382, the local data bus LDP1 is connected to the global data bus GDP by the control of the selector 69.

By the data transmission between the main region 11 and the global data bus GDP which is performed via the main-side local data bus LDP1, the data input or the data output is performed with respect to the column unit (herein, the first column unit CU<0> of the second column block CB#1) corresponding to the second column address MA1 serving as an accessing target in a manner similar to the operation which is performed with respect to the above-described first selected address MA0.

In a similar manner to the operation described above, the internal address signal Ain and the defective column address CRD are compared with each other during a period until the pointer mPT is shifted from the LCD 50 corresponding to the column unit CU which is an object of an operation in the main region 11 to a successive LCD 50.

In the example illustrated in FIG. 6, a third column address MA2 in the main region 11 is a defect address CRD. Accordingly, the column address MA2 is stored as the defective column address CRD in one defective column address storing latch 641 provided in the defect address information storage circuit 64.

When the internal address signal Ain indicating the column address MA2 is input to the replacement determination circuit 382, the output signal (comparison result) of the comparing unit 631 corresponding to the latch 641, in which the column address MA2 as the defective column address CRD1 is stored, among the plurality of comparing units 631 of the replacement determination circuit 382, displays "1." The output signals of other comparing units 631 display "0."

The signal from each of the comparing units 631 is input to the determining unit 65. If "1" is contained in at least one signal output from the plurality of comparing units 631 when the signals from the comparing units 631 are input to the input terminals of the OR gates of the calculating units 651 of the determining unit 651, respectively, the outputs (determination signal) of the OR gates will be set to "1."

Accordingly, when the column address MA2 of the main region 11 which is to be selected next time is defective, the determination signal of "H(1)" is output to the column-control-signal generating unit 384 from the replacement determination circuit 382.

Based on the determination signal of "H", the set signal rSET for the redundancy region 12 is changed to the "L" level from the "H" level by the set signal control unit 68 in the column-control-signal generating unit 384.

The control signals rPT and rCLK for the redundancy region 12 are generated by the redundancy-side control unit 68 of the column-control-signal generating unit 384 with the timing at which the set signal rSET changes to the "L" level. For example, the redundancy-side shift clock rCLK is generated by the redundancy-side control unit 68, based on the determination signal of "H", and the signal level of the redundancy-side shift clock rCLK changes from the "L" level to the "H" level.

The redundancy-side shift clock rCLK is supplied to each of the redundancy LCDs 50R in the redundancy column decoder 350R, and the redundancy-side pointer rPT is supplied to the redundancy LCD 50R corresponding to the address for the replacement. With the timing in synchronization with the redundancy-side shift clock rCLK, the signal of the "H" level serving as the redundancy-side pointer rPT is input to the redundancy LCD 50R, and the pointer rPT is set to the redundancy address RD to replace the defective column address CRD.

And the redundancy column block RB and the redundancy unit RU as the control unit are selected and activated by the redundancy-side pointer rPT and the redundancy-side shift clock rCLK, with the timing at which the defective column address CRD (=MA2) is selected.

The operation of the selection and activation of the column block (redundancy column block) and the column unit (redundancy unit) of the redundancy region 12 is substantially the same as the operation of the selection and activation of the column block CB and the column unit CU of the main region 11.

When the redundancy column block RB and the redundancy unit RU are selected by the process of replacing the defective column address CRD (defective column unit CU) with the redundancy address RA (redundancy unit RU), the signal of the "H" level is held in the register 501 in the redundancy LCD 50R corresponding to the address RD to which the redundancy-side pointer rPT is set, and the data pass switch 505R in the redundancy LCD 50R turns on based on the signal.

Thus, the redundancy column block RB including the redundancy unit RU which has replaced the defective column unit is selected. The column selection switch 319 corresponding to the redundancy unit RU which has replaced the defective column address CRD turns on. Thus, the redundancy unit RU which has replaced the defective column address CRD is activated, and the redundancy unit RU is connected to the redundancy-side local data bus LDP2.

Even when the defective column unit CU of the main region 11 is replaced by the redundancy unit, the main-side shift clock mCLK of a predetermined frequency is continuously output. Accordingly, even when the column address MA2 in the main region 11 is defective, the main-side pointer mPT is set to the LCD 50 corresponding to the defective column address MA2, synchronizing with the main-side shift clock mCLK, and the defective column unit CU is electrically connected to the main-side local data bus LDP1.

As described above, in the present embodiment, the main-side local data bus LDP1 and the redundancy-side local data bus LDP2 are connected to the global data bus 70 via the selector 69. The determination signal corresponding to the comparison result of the internal address signal Ain and the defective column address CRD is supplied to the selector 69 as the selection signal SLT. When the column address (herein, address MA2) which is to be selected next time and the defective column address CRD of the main region 11 match, the determination signal as the selection signal SLT indicates the "H(1)" level.

When the selection signal (determination signal) SLT of the "H" level is supplied to the selector 69, the redundancy-side local data bus LDP2 is connected to the global data bus GDP by the selector 69. The main-side local data bus LDP1 is electrically disconnected from the global data bus GDP by the selector 69. Accordingly, even though the column unit of the defective column address CRD is connected to the main-side local data bus LDP1, the data transmission between the column unit of the defective column address CRD and the global data bus GDP is intercepted by the selector 69.

The timing at which the selector 69 switches the connection between the global data bus 70 and the local data buses 75 and 75R means the timing at which the pointer hold state of the LCD corresponding to the address which is currently selected changes from the "H" level to the "L" level, that is, the timing at which the main-side shift clock mCLK changes from the "H" level to the "L" level.

In this way, when the column address MA2 at which the defect occurs in the main region 11 is a selected address in the main region 11, the column unit CU corresponding to the address MA2 is replaced by the redundancy unit RU corresponding to the address RA0 of the redundancy region 12. Instead of the column unit CU of the defective column address MA2 (CRD0), the redundancy unit RU is accessed as an object of the input/output of data. In this way, the defective column address in the main region 11 is repaired.

The redundancy unit RU corresponding to the redundancy address RA of the redundancy region 12 is connected to the global data bus GDP. As a result, data is input to the redundancy unit RU when the data is written, or data is output from the redundancy unit RU when the data is read.

When data reading is performed, even when the redundancy unit RU of the redundancy region 12 is an accessing target, the data of the defective column unit in the main region 11 is read from the memory cell unit to the sensing unit and the latching unit. As described above, the redundancy-side local data bus LDP2 is connected to the global data bus GDP by the selector 69, and the main-side local data bus LDP1 is disconnected from the global data bus GDP. Accordingly, when the redundancy unit RU of the redundancy region 12 is accessed, the data from the column unit CU of the main region 11 is not output to the global data bus GDP and the outside.

When the defective column unit is replaced by the redundancy unit RU at the time of data writing, in the redundancy unit RU corresponding to the redundancy LCD 50R to which the pointer rPT is set, the selector 69 causes the data DT from the outside to be input into the latching unit 311 in the redundancy unit RU, and causing the data from the outside not to be input to the latching unit 311 in the defective column unit.

After the transmission of the data DT between the global data bus GDP and the redundancy unit RU which has replaced the defective column unit is completed, the redundancy-side shift clock rCLK is changed from the "H" level to the "L" level by the redundancy-side control unit 67.

At this time, the redundancy-side pointer rPT is not shifted from the LCD 50R of the set state to the later-stage LCD 50R, but, for example, is held in the redundancy LCD 50R corresponding to the address RA0 which has undergone the input or output of the data. However, the redundancy-side pointer rPT may be shifted to the later-stage redundancy LCD 50R after the access to the redundancy unit RU is completed, or the signal hold stage of all the redundancy LCDs 50R of the redundancy region 12 may become a reset state ("L" level).

Herein, in the LCD in which the redundancy-side pointer rPT is held, the column selection switch 319 corresponding to the redundancy unit RU which has replaced the defective column address CRD turns on. However, if the address in the main region 11 which is to be selected next time and the defective column address do not match, the data bus 75R is not connected to the global data bus 70 by the control of the selector 69. As a result, even though the LCD 50R of the redundancy region holds the pointer rPT, control may be performed such that the input/output of the data is not performed with respect to the latching unit 311 in the redundancy unit RU.

For example, after the transmission of the data DT between the global data bus GDP and the redundancy unit RU which has replaced the defective column unit is completed, at the time when the column address and the defective column address match each other, the set signal rSET of the redundancy region is changed from the "L" level to the "H" level by the set signal control unit 68 so that the redundancy-side pointer rPT is settable with a random timing.

For example, the selected redundancy address is not notified to the memory controller 120 or the host device 120 during the operation of the flash memory 100. That is, the internal control circuit 8 or the pointer/redundancy control circuit 38 of the flash memory 100 do not notify the fact that the redundancy address RD is accessed through the replacement process of replacing the defective column address CRD with the redundancy address RD, the data is input to the redundancy unit RU corresponding to the redundancy address RD or the data is output from the redundancy unit RU, to the external device, such as the memory controller 120 or the host device 120.

Within a period in which the data DT is being input to or output from the redundancy unit RU, like the above-described period in which the data is being input to or output from the column unit CU in the main region 11, comparison and determination are made by the replacement determination circuit 382 to confirm whether the defective column address CRD and the column address (internal address signal) Ain in the main region 11 which is to be selected next time match or not each other.

When the column address which is to be selected next time is found to be not defective, based on the determination result and comparison result between the defective column address CRD and the address signal Ain in the main region 11 which is to be selected next time, the main-side local data bus LDP1 is electrically connected to the global data bus GDP by the selector 69 with a timing at which the main-side shift clock mCLK (or, the redundancy-side shift clock rCLK) is lowered from the "H" level to the "L" level based on the determination signal. On the other hand, the redundancy-side local data bus LDP2 is electrically disconnected from the global data bus GDP.

And synchronizing with the main-side shift clock mCLK, the pointer (the signal of the "H" level) is shifted like in the operation performed with respect to the column address (the column block and the column unit) of the main region 11. The data transmission is performed with respect to the LCD 50, to which the main-side pointer mPT is set, between the global data bus 70 and the column unit CU corresponding to the column address MA.

When the column address (for example, the address MAj) which is to be selected next time is found to be defective, based on the determination result and comparison result between the defective column address CRD and the address signal Ain which is to be selected next time, the redundancy-side local data bus 75R is electrically connected to the global data bus 70 by the selector 69 with a timing at which the main-side shift clock mCLK is lowered from the "H" level to the "L" level based on the determination signal. On the other hand, the main-side local data bus 75 is electrically disconnected from the global data bus 70.

During the period in which the redundancy-side set signal rSET changes from the "H" level to the "L" level, the redundancy-side shift clock rCLK changes from the "L" level to the "H" level by the column-control-signal generating unit 384. The redundancy-side pointer rPT is shifted to the predetermined redundancy LCD 50R by the redundancy-side shift clock rCLK of the "H" level. Furthermore, the redundancy-side pointer rPT may be newly generated and set to the redundancy LCD 50R of the redundancy address RD which has replaced the defective column address CRD.

And, like the operation which is performed on the redundancy address (the column block and the column unit) of the redundancy region 12 which has replaced the defective column address CRD of the main region 11, with respect to the redundancy LCD 50 to which the pointer rPT is set, the data is input or output between the global data bus 70 and the redundancy unit RU of the redundancy address RD associated with the defective column address CRD.

As for the redundancy address RD (the redundancy column block RB or the redundancy unit RU) in the redundancy region 12 which is not used, the redundancy address (the redundancy unit) which is not used can be distinguished by storing the flag data of 1 bit or 2 bits in the defective column address storing latch 641. The operation for the redundancy region 12 is controllable based on the flag data in such a manner that the redundancy address RD corresponding to the defective column address storing latch 641 in which the flag data indicating the unused state is stored may not be accessed.

The above-described operation is repeatedly performed until the input or output of the data having a predetermined size which is requested from the outside is completed. As described above, when data writing is performed, after the data of the predetermined size gathers first, the data stored in the latching unit of each column unit is written, in a lump, in the plurality of memory cells MC of the main region 11 and the redundancy region 12. When data reading is performed, after the data of the predetermined size gathers in the input/output buffer 7 first, the data of the predetermined size is transmitted to the outside of the flash memory 100 from the input/output buffer 7.

As described above, according to the flash memory of the present embodiment, the operation for the column of the main region 11 and the redundancy region 12 is controlled using the mutually-independent pointers mPT and rPT dedicated to the main region 11 and the redundancy region 12 of the memory cell array 1, respectively.

In this way, according to the control method of the semiconductor memory of the present embodiment, the operating characteristic of a memory improves.

(c) Conclusion

According to the flash memory of the first embodiment, the columns (the column block and the column unit) of the main region 11 and the redundancy region 12 are controlled using the mutually-independent pointers mPT and rPT dedicated to the main region 11 and the redundancy region 12 of the memory cell array 1, respectively.

The data transmission is accelerated when the columns of the memory cell array are controlled using the pointer like in the present embodiment.

In the present embodiment, the control of the column of the main region 11 is performed by shifting the pointer mPT using the shift clock mCLK of a predetermined frequency, and changing over the column address MA which is selected and activated in a predetermined order. On the other hand, the control of the column of the redundancy region 12 is performed by setting the pointer rPT which is controlled independently of the pointer mPT of the main region 11, to the redundancy address RD which has replaced the defective column address CRD when the column address MA in the main region 11 which is to be selected next time is the defective column address CRD.

The flash memory of the present embodiment switches the connection between the local data buses 75 and 75R which are independently provided for the main region 11 and the redundancy region 12, respectively and the global data bus 70 connected the outside, depending on whether the selected column address is normal or defective. In this way, the data transmission between the global data bus 70 and the control unit (the column block and the column unit) CB, CU of the main region 11, or the data transmission between the global data bus 70 and the control unit (the redundancy block and the redundancy unit) RB, RU of the redundancy region 12 is performed. When the redundancy region 12 is connected to the global data bus 70 by the replacement process, the data transmission is performed without using the circuits of the main region 11, but directly performed between the control units RB and RU of the redundancy region 12 and the global data bus 70.

Thus, in the flash memory of the present embodiment, when a defect exists in the main region 11 and the circuit of the main region 11, the replacement process of replacing the control units CB and CU of the main region 11 with the control units RB and RU of the redundancy region 12 is performed so that the defect in the main region 11 can be repaired.

In a general flash memory, when data transmission is performed between the global path and the control unit of the redundancy region which has replaced the defect in the control unit of the main region, the data from the control unit of the redundancy region is first output to the circuit (for example, latch) in the corresponding control unit of the main region, and after that, the data from the redundancy region which has been stored in the latch of the main region is transmitted to the data bus. Even when the data is input to the control unit of the redundancy region, the data from the data bus is first input to the latch of the main region, and then the data is transmitted to the control unit of the redundancy region via the latch of the main region.

In this case, since the data transmission between the redundancy region and the data bus is performed via the latch of the main region, the operation speed of the flash memory may be limited when the input/output of the data is performed with respect to the control unit of the redundancy region 12 depending on the period for the data transmission between the main region and the redundancy region.

On the other hand, in the flash memory 100 of the present embodiment, the data transmission is not performed between the circuit (for example, the latch 311) of the control unit (for example, the column unit CU) of the main region 11, and the circuit (for example, the latch) of the control unit (for example, the redundancy unit RU) of the redundancy region 12. And in the flash memory 100 of the present embodiment, the data is directly transmitted between the control unit RB, RU of the redundancy region 12 and the data bus connected to the outside, without going through the control unit CB, CU of the main region 11.

Accordingly, operational delay in the data transmission between the main region 11 and the redundancy region 12 hardly occurs in the flash memory of the present embodiment.

When the data transmission between the control unit RB, RU of the redundancy region 12 and the global data bus 70 is performed using the circuit in the main region 11, if a circuit in the main region 11, for example, a latch for holding data is defective, the whole flash memory may be considered to be defective.

According to the flash memory of the present embodiment, even when a defect occurs in the latch (latching unit) 311 corresponding to the control units CB and CU of the main region 11, since the data is directly transmitted between the control units RB and RU of the redundancy region 12, and the global data bus 70, the whole flash memory (chip) is not determined to be defective.

For example, when the main region 11 has a storage capacity of about 8 Kbytes, the storage capacity of the redundancy region 12 is set to about 128 bytes or less. In this case, 14 address decode lines are provided for accessing the main region, but only about seven address decode lines are provided for accessing the redundancy region 12. By this, when directly setting the pointer rPT to the redundancy region 12, a margin in operational timing is secured.

In terms of the timing margin in the operation of the flash memory, it may be difficult to perform an operation that the pointer is directly set to the control unit of the redundancy region after the control unit of the main region 11 is accessed, and then the pointer is set again directly to the main region.

On the other hand, in the flash memory of the present embodiment, the setting of the pointer mPT to the main region 11 is performed only once at the time when the first address signal (external address signal) ADR is input to the pointer/redundancy control circuit 38. Therefore, the pointer mPT which is set to the control unit of the main region 11 sequentially shifts among the plurality of control units CB and CU of the main region 11, synchronizing with the shift clock mCLK of a predetermined frequency, without being dependent on whether the defective control units CB and CU are selected.

Thus, in the flash memory of the present embodiment, the operation of setting again the pointer mPT to the main region 11 after the pointer rPT has been set to the redundancy region 12 once is not performed. That is, the pointer mPT of the main region 11 does not depend on the operation of the pointer rPT of the redundancy region 12, and independently, sequentially the control units CB and CU are selected with the cycle of the shift clock mCLK. Therefore, the margin needed for directly setting the pointer to the redundancy region 12 should be secured, according to the flash memory of the present embodiment. Accordingly, according to the flash memory of the present embodiment, the margin of timing can be secured relatively easily and operation can also be accelerated.

In the flash memory of the present embodiment, even while the redundancy region 12 is being accessed by the defect repair process, the selection (the shift of the pointer) of the control unit in the main region 11 is performed with a predetermined cycle, independently of the control for the redundancy region 12. Accordingly, the shift in the mapping between the input/output data and the addresses is difficult to occur in the flash memory of the present embodiment.

In the flash memory of the present embodiment, by controlling the main region 11, the redundancy region 12 and the circuits corresponding to the main region 11 and the redundancy region 12 of the memory cell array 1, respectively using mutually-independent pointers mPT and rPT, a defect in the main region 11 can be repaired with a relatively simple circuit. Accordingly, according to the flash memory of the present embodiment, the scale (the occupied area) of the circuit needed for repairing the defect in the flash memory can be made small, and the area of the chip of the flash memory can be reduced.

As described above, the flash memory of the present embodiment can improve the operating characteristic of the flash memory.

(2) Second Embodiment

A semiconductor memory (for example, a flash memory) according to a second embodiment is described with reference to FIGS. 8 through 10. In the present embodiment, the substantially same configurations as the flash memory of the first embodiment are denoted by the same reference numerals. In the flash memory of the present embodiment, description about the substantially same configurations, functions, or operations as the flash memory of the first embodiment is given as necessary.

Figure 8:
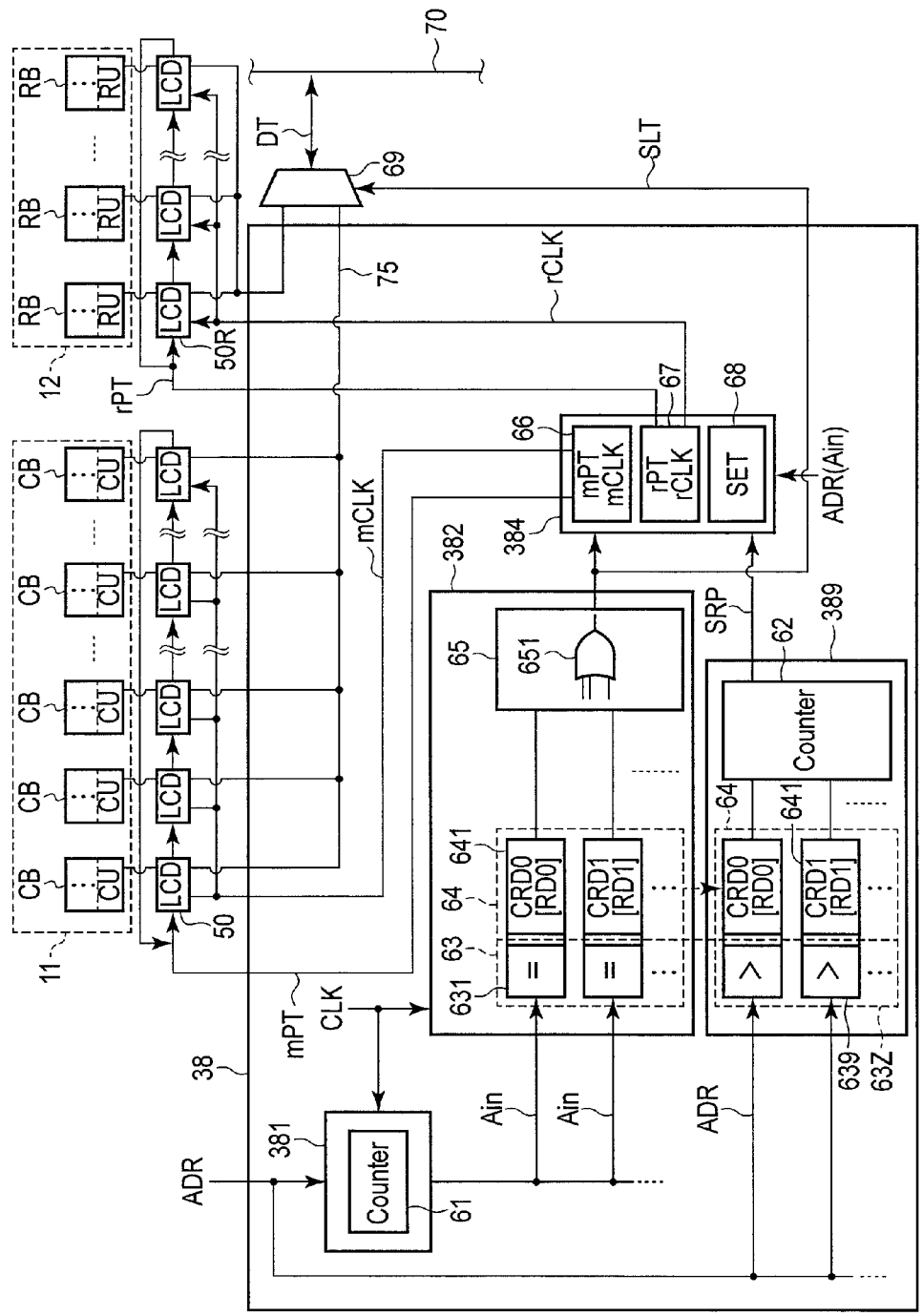
FIG. 8 is a schematic diagram illustrating an example of a configuration of a semiconductor memory according to a second embodiment.

FIG. 8 is a schematic diagram illustrating the internal configuration of a pointer/redundancy control circuit 38 of the flash memory of the second embodiment.

Regarding a redundancy region 12 of a memory cell array 1 and each circuit corresponding to the redundancy region 12, a rule of selection order of column addresses (redundancy units or redundancy column blocks) in the redundancy region 12, such as ascending order or descending order, may not be set depending on cases.

When the selection order of redundancy addresses RD is not specified, it is possible to set a pointer to a LCD 50R of the redundancy region 12 at any time. Therefore, a signal level of a set signal rSET of the redundancy region 12 is always maintained at a "H" level until the pointer is set to the redundancy address RD. And when a column address MA to be selected in the main region 11 and a defective column address CRD match each other, a pointer rPT of the redundancy region 12 is set to the redundancy addresses RD one by one in turns.

The flash memory of the second embodiment shown in FIG. 8 includes a circuit (hereinafter, referred to as a redundancy-side pointer setting circuit) 389 which controls setting of the pointer rPT to the redundancy region 12.

The redundancy-side pointer setting circuit 389 distinguishes a redundancy address RD in the redundancy region 12 to which the pointer rPT is first set, based on an external address signal ADR which indicates a start address in the main region 11. Based on the result of this distinguishing, the redundancy-side pointer rPT is set to a predetermined redundancy LCD 50R before the input/output of the data to the column unit of the main region 11 and the redundancy region 12 is started.

In the present embodiment, regarding the addresses of the main region 11 which are selected in a given order, the redundancy addresses RD in a given order which is determined according to the arrangement of addresses are associated with defective column addresses CRD in a given order. Thus, also with respect to the redundancy region 12, each redundancy address which is a replacement unit of the redundancy region 12 is sequentially selected in one direction and connected to a data bus 70 by the shift of the redundancy-side pointer rPT which is performed based on the given order.

According to the flash memory of the present embodiment, when the column address selected in the main region 11 is a defective column address, the defective column address CRD in the main region 11 is replaced by the redundancy address RD, which is a replacement unit or a repair unit, in the redundancy region 12 based on the preset order, the redundancy address RD is selected.

An example provided in the flash memory of the second embodiment is that the order of selection of the redundancy addresses (a column block RB, a column unit RU, and a redundancy LCD 50R) of the redundancy region 12 is specified, and access to the main region 11 of the memory cell array 1 and access to the redundancy region 12 are separately performed.

Figure 9:
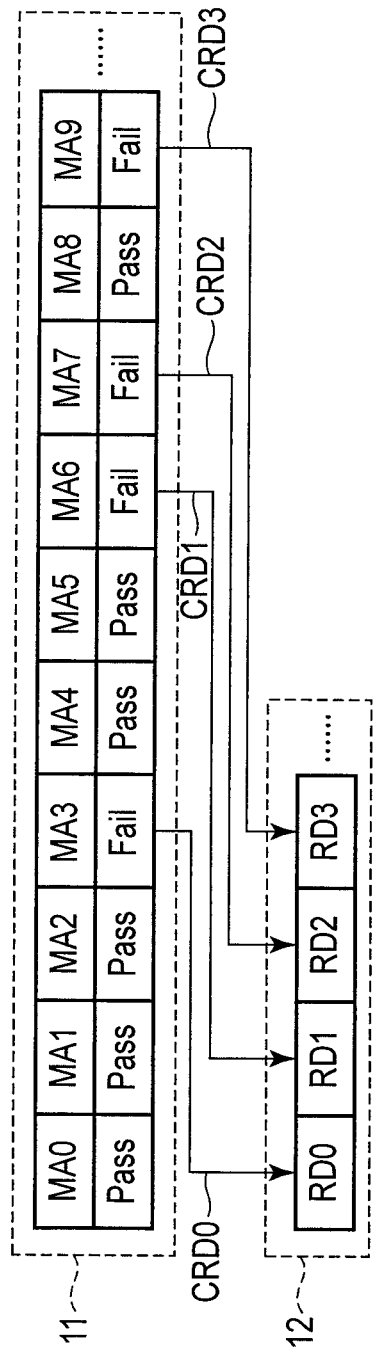
FIG. 9 is a diagram for describing an example of operation of the semiconductor memory according to the second embodiment.

FIG. 9 illustrates an example of the mapping between the defective column addresses CRD in the main region 11 and the redundancy addresses RD in the redundancy region 12.

As illustrated in FIG. 9, the present embodiment describes a case where among a plurality of addresses in the main region 11, a column address (column unit) MA3 indicating "3", a column address MA6 indicating "6", a column address MA7 indicating "7", and a column address MA9 indicating "9" are addresses of defective columns CRD. For example, the column addresses MA3, MA6, MA7, and MA9 of "3", "6", "7", and "9" correspond to addresses which are selected as a fourth address, a seventh address, an eighth address, and a tenth address, respectively, when counting from the column address of the head (the column address of "0") MA0 of the main region 11. One column address MA corresponds to one column unit CU.

In the present embodiment, for example, defective column address storing latches 641 are sorted in ascending order so as to correspond to addresses of defective columns. The defective column address storing latches 641 which are sorted are associated with certain redundancy addresses RD (redundancy column blocks RB or redundancy units RU) which are replacement units (repair units), respectively.

Among a plurality of redundancy addresses RD in the redundancy region 12, a first redundancy address RD0 is used, as an object of replacement for the column address MA3 (=CRD0) of "3", a second redundancy address RD1 is used as an object of replacement for the column address MA6 (=CRD1) of "6", a third redundancy address RD2 is used as an object of replacement for the column address MA7 (=CRD2) of "7", and a fourth redundancy address RD3 is used as an object of replacement for the column address MA9 (=CRD3) of "9." One redundancy address RD corresponds to one redundancy unit RU. For example, redundancy units RU of adjacent redundancy addresses RD belong to different redundancy column blocks RB, and are controlled by different redundancy LCDs 50D.

The sorting of the defective column address storing latches 641 is relatively easily performed by rearranging the defective column addresses CRD contained in the information-on-defect. When the defective column addresses CRD are stored in the storing latches 641, the sorting may be automatically performed by an internal control circuit 8, or may be sorted based on the defective column addresses by an external device (for example, a memory controller or a host). The external sorting result may be overwritten on the automatic sorting result obtained by internal processing of the flash memory.

Even when a defect occurs in a column of the main region 11 while the user is using the flash memory, the column address corresponding to the column block CB and the column CU containing the defect can be newly added as the defective column address by a memory controller 120 or a host device 120, and the sorting for mapping between the defective column addresses and the redundancy addresses can be performed again.

As illustrated in FIG. 8, the pointer/redundancy control circuit 38 includes a redundancy-side pointer setting circuit 389. The redundancy-side pointer setting circuit 389 includes a calculating unit 62 and a comparison circuit 63Z including a plurality of comparing units 639.

Each of the comparing units 639 provided in the redundancy-side pointer setting circuit 389 compares an external address signal ADR indicating a start address of the operation of the flash memory and the defective column address CRD to see which one is larger.

The defective column address CRD used by the redundancy-side pointer setting circuit 389 is transmitted to each of the comparing units 639 in the redundancy-side pointer setting circuit 389 from the defective column address storing latches 641 in the replacement determination circuit 382. Latches may be additionally provided aside from the defective column address storing latches 641 in the replacement determination circuit 382 in a manner to correspond to the comparing units 639 of the redundancy-side pointer setting circuit 389, respectively.

The comparing units 639 are provided in the comparison circuit 63Z of the redundancy-side pointer setting circuit 389 so as to correspond to the defective column addresses CRD (defective column address storing latches 641) in a one-on-one manner.

The comparing units 639 in the redundancy-side pointer setting circuit 389 determine whether the external address signal ADR is larger than the defective column address CRD. The comparing unit 639 outputs a signal of an "L(0)" level to a later-stage calculating unit 62, when the value of the external address signal ADR is smaller than the value of the defective column address CRD. The comparing unit 639 outputs a signal of an "H(1)" level to the later-stage calculating unit 62, when the value of the external address signal ADR is larger than the value of the defective column address CRD.

The calculating unit 62 is formed, for example, from a counter.

The counter 62 as the calculating unit counts the number (the number of the signals of the "H" level) of comparison results in which the external address signal ADR is larger than the defective column address CRD among the comparison results obtained by the comparison between the external address signal ADR and the defective column address CRD.

The counter 62 outputs a calculation result (a count number of "H") to a column-control-signal generating unit 384.

Based on the calculation result from the counter 62, the redundancy-side pointer setting circuit 389 outputs a control signal SRP.

In order to set redundancy-side pointer rPT to redundancy addresses RD corresponding to the count number of counters 62 based on the control signal SRP, the column-control-signal generating unit 384 outputs a signal of an "H" level to a predetermined redundancy LCD 50R which controls the redundancy address RD which is first selected, and maintains the signal of the "H" level in the redundancy LCD 50R.

The column-control-signal generating unit 384 makes a redundancy-side shift clock rCLK "H" level, for example, in order to hold the signal of the "H" level in the redundancy LCD 50R. However, the signal of the "H" level may be held in the redundancy LCD 50R in a state where the redundancy-side shift clock rCLK is set to the "L" level.

Based on the control signal SRP, a redundancy-side set signal rSET is changed from the "L" level to the "H" level by the column-control-signal generating unit 38 at the same timing as when the redundancy-side pointer rPT is set. And after the redundancy-side pointer rPT is set to a predetermined redundancy address RD, the redundancy-side set signal rSET changes to the "L" level.

Operation of the flash memory of the second embodiment is described with reference to FIG. 10. FIG. 10 illustrates a timing chart for describing an operation example of the flash memory of the present embodiment.

The present embodiment describes an example in which a column address MA5 indicating "5" in the main region 11 is input to the column control circuit 3 as the external address signal ADR.

The mapping relation between the redundancy addresses RD and the defective column addresses CRD is sorted (decided) beforehand, for example, as illustrated in FIG. 9, and the defective column addresses CRD0, CRD1, CRD2, . . . are associated with the redundancy addresses RD0, RD1, RD2, . . . , respectively, in ascending order of the column addresses MA.

The external address signal (start address) ADR which indicates the column address MA5 of "5" in the main region 11 is input to the pointer/redundancy control circuit 38.

The external address signal ADR of "5" is input to the replacement determination circuit 382 as the internal address signal (column address) Ain via the address generating unit 381, and to the comparison circuit 63Z of the redundancy-side pointer setting circuit 389. And the order relationship of the external address signal ADR of "5" and the defective column addresses CRD0, CRD1, CRD2 and CRD3 is examined by each of the comparing units 639 in the comparison circuit 63Z of the redundancy-side pointer setting circuit 389, respectively.

When comparing the external address ADR with the column address MA3 of "3" which is the defective column address CRD0, "5" which is the value of the address signal ADR is larger than "3" which is the value of the defective column address CRD0. Accordingly, in the comparing unit 639 corresponding to the defective column address CRD0, the relation "ADR>CRD" is obtained. In this case, the comparing unit 639 corresponding to the latch 641 which stores the defective column address CRD smaller than the external address signal ADR outputs the comparison result of the "H(1)."

When comparing the external address ADR with the column address MA6 of "6" as the defective column address CRD1, "5" which is the value of the address signal ADR is smaller than "6" which is the value of the defective column address CRD1. Accordingly, in the comparing unit 639 corresponding to the defective column address CRD1, the relation "ADR>CRD" is not obtained. In this case, the comparing unit 639 corresponding to the latch 641 which stores the defective column address CRD larger than the external address signal ADR outputs the comparison result of the "L(0)."

When comparing the external address signal ADR with each of "7" and "9" as the defective column addresses CRD2 and CRD3, like the comparing unit 639 corresponding to the defective column address CRD1, "5" which is the value of the eternal address ADR is smaller than "7" and "9" which are values of the defective column addresses CRD2 and CRD3. Accordingly, the relation "Ain>CRD" is not obtained in each of the comparing units 639 corresponding to the defective column addresses CRD2 and CRD3, and the comparison result "L(0)" is output from each of the comparing units 639.

The comparison result obtained by the comparison between the external address signal ADR and each defective column address CRD is output to the later-stage counter 62. The counter 62 counts the number of the signals of the "H(1)" level among a plurality of comparison results from the comparing units 639, that is, performs an addition operation of "1"s or "0"s which are output from the comparing unit 639.

As described above, when one of the outputs displays "1" and the remaining outputs display "0" among four comparison results, the output (a counted result of "1" or an addition result) of the counter 62 is set to 1.

The value of "1(0001)" as the output of the counter 62 is associated with the second redundancy address RD1 among the plurality of redundancy addresses RD.

Accordingly, in order to set the pointer rPT to the redundancy region 12, the redundancy-side set signal rSET changes from the "L" level to be set to the "H" level, based on the control signal SRP.

In order to set the pointer rPT to the second redundancy address RD1 based on the control signal SRP supplied from the redundancy-side pointer setting circuit 389, the signal of the "H" level is output to the redundancy LCD 50R corresponding to the second redundancy address RD1. By this, a register 501R of the redundancy LCD 50R corresponding to the redundancy address RD holds the signal of the "H" level.

After the redundancy-side pointer rPT is set to a predetermined redundancy address RD, the redundancy-side set signal rSET changes from the "H" level to be set to the "L" level, and maintains the signal at the "L" level during the operation period corresponding to the input external address signal ADR (or command).

In addition, the external address signal ADR of "5" is input to each of the comparing units 631Z of the replacement determination circuit 382 substantially at the same time as the input to the redundancy-side pointer setting circuit 389, and the substantially same operation as the operation described in the first embodiment is performed.

In the replacement determination circuit 382, the external address signal ADR as the start address is compared with each of the defective column addresses CRD0, CRD1, CRD2, and CRD3 substantially at the same time as the operation of the redundancy-side pointer setting circuit 389.

With respect to the external address signal ADR as the start address, the determining unit 65 of the replacement determination circuit 382 determines that the column unit CU of the main region 11 corresponding to the column address MA of "5" is a column address which does not contain a defect. In the main region 11, the signal of the "H" level is input to the register 501 of the LCD 50 corresponding to the address MA5, and the main-side pointer mPT is set to the column block CB and the column unit CU corresponding to the external address signal (start address) ADR.

Based on the determination result of the external address signal ADR and the defective column address CRD, the selector 69 connects a main-side local data bus 75 to a global data bus 70.

On the other hand, a redundancy-side local data bus 75R is electrically disconnected from the global data bus 70 by the selector 69. Accordingly, even though the signal of the "H" level corresponding to the set state of the redundancy-side pointer rPT has been held beforehand in the redundancy LCD 50R before the redundancy address RD of the redundancy region 12 is accessed, the redundancy unit RU corresponding to redundancy address RD to which the pointer rPT has been set is not connected to the global data bus 70 at all.

Therefore, though the redundancy-side pointer rPT is beforehand set to the redundancy region 12, the redundancy unit RU to which the pointer rPT has been set does not have a negative influence on the access to the normal column unit CU corresponding to the start address ADR.

After the input or output of the data of the column unit CU corresponding to the start address ADR ("5") is completed, the main-side pointer mPT which has been set to the main region 11 sequentially shifts among the LCDs 50 in the main column decoder 350, synchronizing with the main-side shift clock mCLK of a predetermined frequency.

With respect to the incremented column address (the internal address signal), the replacement determination circuit 382 sequentially performs the comparison between the column address Ain and the defective column address CRD. For example, the redundancy-side pointer setting circuit 389 will not drive and will not perform the comparison process on the incremented column address in until the following external address signal ADR is input, when the comparison between the column address corresponding to the external address signal ADR and the defective column address CRD is completed.

When the column address MA6 corresponding to "6" in main region 11 becomes an object of operation, since the column address MA6 of "6" is the defective column address CRD1, the output signal of the determining unit 651 of the replacement determination circuit 382 is set to "1" which indicates the replacement process. Thus, the redundancy-side shift clock rCLK changes to the "H" level, and the access to the redundancy unit CU is performed.

The redundancy unit RU of the redundancy address RD1 associated with the column address (the defective column address) of "6" is electrically connected to the global data bus 70 by the selector 69, in a substantially similar manner to the operation described in the first embodiment. Subsequently, the direct transmission of the data DT is performed between the redundancy unit RU and the global data bus 70.

After the input or output of the data to the redundancy unit RU which has replaced the column address of "6" is completed, the redundancy-side shift clock rCLK changes to the "L" level from the "H" level.

As described above, a defective column unit in the main region 11 is not connected to the global data bus 70, even though the main-side pointer mPT is set. After the access to the replaced redundancy unit RU is performed, the pointer mPT which is set to the defective column unit CU in the main region 11 is shifted to the following column address, synchronizing with the shift clock mCLK. The shifted pointer mPT is set to a next-stage LCD 50.

As illustrated in FIG. 9, when the column unit CU corresponding to the column address MA7 of "7" which is successive to "6" in the main region 11 is defective, two redundancy units are consecutive accessing targets.

Based on the determination result by the replacement determination circuit 392, the signal level of the redundancy-side shift clock rCLK changes to the "H" level, and the signal of the "H" level corresponding to redundancy-side pointer rPT shifts between adjacent redundancy LCDs 50R, synchronizing with the redundancy-side shift clock rCLK.

In the present embodiment, the defective column addresses CRD and the redundancy addresses RD are associated in a given order, and the selection order of the redundancy addresses RD is set beforehand. Accordingly, without setting the redundancy-side set signal rSET to the "H" level at the time of the shift of the pointer rPT of the redundancy region 12, the pointer rPT of the redundancy region 12 is shifted to the adjacent redundancy address RD with only use of the shift clock rCLK of the redundancy region 12.

Similarly to the above-described operation, the redundancy unit RU which has replaced the defective column unit of the column address MA7 of "7" is accessed, and the input or output of the data DT to the redundancy unit RU is performed.

Subsequently, similarly to the operation described in the first embodiment, either the column unit CU of the main region 11 or the redundancy unit RU of the redundancy region 12 is electrically, directly connected to the global data bus 70 via the selector 69, based on the comparison result between the internal address signal (incremented column address) Ain and the defective column address CRD.

In the example illustrated in FIG. 9, when the external address signal ADR is smaller than the smallest defective column address CRD0 (herein, "3") of the plurality of defective column addresses CRD, the relation "ADR>CRD" is not obtained for all the comparing units 639 in the redundancy-side pointer setting circuit 389. Accordingly, all the outputs (comparison results) of the comparing units 639 become the "L(0)" level. In this case, the output (the count number of "H"s) of the counter 62 is set to "0(0000)." When the output of the counter 62 is "0", the redundancy-side pointer rPT is set to the redundancy address RD0 which is a candidate address for replacing the smallest defective column address CRD0, and the signal of the "H" level is held in the redundancy LCD 50R corresponding to the redundancy address RD0.

For example, when the external address signal ADR of "8" is input, the outputs of the respective comparing units 639 of the redundancy-side pointer setting circuit 389 include three "1"s and one "0". That is, the calculation result of the counter 62 becomes "3(0011)." Thus, the redundancy side pointer rPT is set to the redundancy address RD3 associated with the defective column address CRD3 of "9".

For example, when the external address signal ADR which matches the defective column address CRD is input (herein, when the address signal of "7" is input), the outputs of the respective comparing units 639 of the redundancy-side pointer setting circuit 389 include two "1"s and two "0"s. That is, the calculation result of the counter 62 becomes "2(0010)." This calculation result represents the redundancy address RD2 associated with the column address CRD2 of "7." The determination result of the replacement determination circuit 382 with respect to the external address signal ADR serving as the start address also indicates that the defective column address CRD2 has been input. Thus, the pointer is set to the redundancy address RD by the control signal SRP of the redundancy-side pointer setting circuit 389, and the redundancy-side shift clock rCLK is generated by the replacement determination circuit 382 and the column-control-signal generating unit 384.

Accordingly, even though the start address is the defective column address CRD, the pointer rPT can be set to the redundancy region 12 by the replacement determination circuit 382 and the redundancy-side pointer setting circuit 389 included in the flash memory of the present embodiment so that the defective column address CRD can be replaced by the redundancy address RD.

As described above, in the present embodiment, the defective column addresses CRD and the redundancy addresses RD are sorted, and the selection order of the redundancy addresses RD is specified according to the arrangement of the defective column addresses CRD. By comparing an address (for example, an address which is first selected according to a certain operation sequence) ADR with the defective column address CRD in a state in which the selection order of the redundancy addresses RD is specified, before the redundancy address RD to be a first accessing target is activated by the replacement process, the pointer rPT can be set to the redundancy address RD beforehand.

By means of the above, the flash memory of the present embodiment can perform control of the pointer rPT for the redundancy region 12 in a similar manner to the control of the pointer mPT for the main region 11, that is, by the shift of the pointer rPT synchronized with the clock rCLK, and can access the redundancy address RD to which the shifted pointer rPT is set.

Therefore, according to the semiconductor memory of the second embodiment and the control method thereof, the same effect as in the first embodiment can be acquired, and the operating characteristic of the semiconductor memory may be improved.

(3) Third Embodiment

A semiconductor memory (for example, a flash memory) according to a third embodiment is described with reference to FIGS. 11 through 14. In the flash memory of the present embodiment, description about the configuration, function, or operation substantially the same as those of the flash memories of the first and second embodiments is given as necessary.

FIG. 11 is a schematic diagram illustrating the internal configuration of a pointer/redundancy control circuit of the flash memory of the third embodiment.

The redundancy region 12 is likely to include a defective cell, a defective bit line, a defective sensing unit 301, or a defective latching unit 319.

As illustrated in FIG. 11, in the flash memory of the present embodiment, flag data FLG which indicates a redundancy address (a redundancy column block or a redundancy unit) RD in a redundancy region 12 being normal or defective is added to a defective column address storing latch 641 associated with the redundancy address RD. For example, the flag data (defect redundancy information) indicating being-normal or being-defective of the redundancy address RD of the redundancy region 12 may not be notified to an external device, such as a memory controller 120 or a host device 120.

With use of the flag data FLG, the flash memory of the present embodiment can replace a column unit CU of a main region 11 with a redundancy RU of a redundancy region 12 by using mutually-independent pointers mPT and rPT dedicated to the main region 11 and the redundancy region 12, respectively, even in a case where the redundancy region 12 includes a redundancy address RD of a defect.

Figure 12:
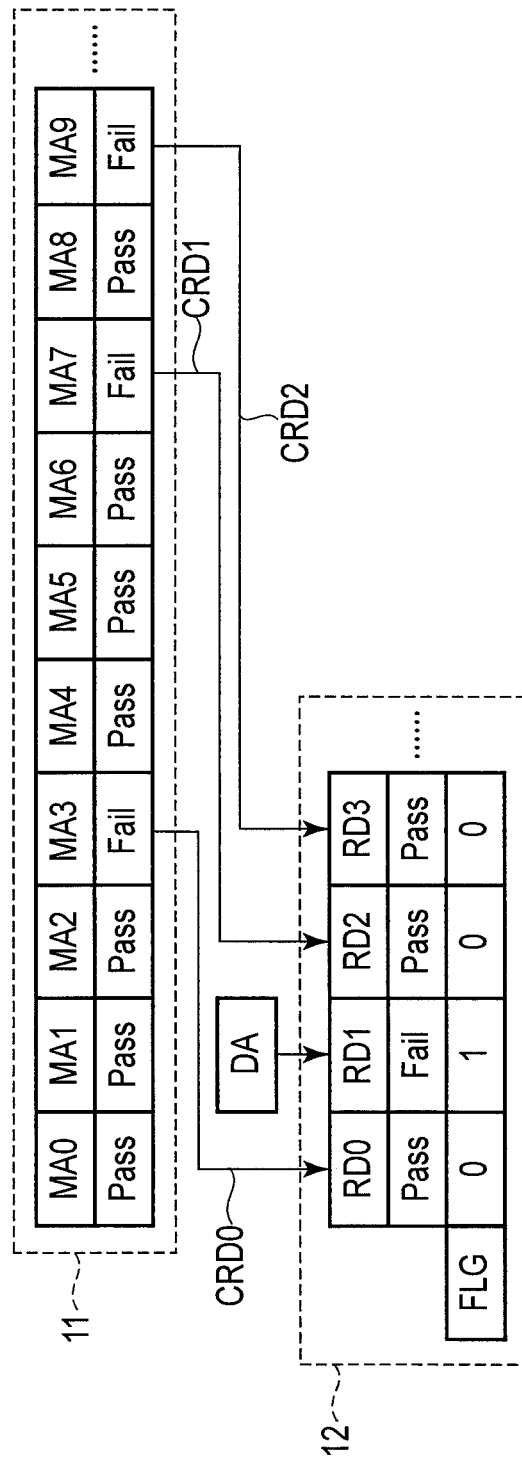
FIG. 12 is a diagram for describing an example of operation of the semiconductor memory according to the third embodiment.

FIG. 12 illustrates a schematic diagram illustrating the mapping between defective column addresses CRD in the main region 11 and the redundancy addresses RD in the redundancy region 12.

As illustrated in FIG. 12, the flash memory of the present embodiment is described with an example in which a second redundancy address RD1 in the redundancy region 12 is defective. FIG. 12 illustrates an example in which column addresses MA3, MA7, and MA9 of "3", "7", and "9" are defective column addresses CRD0, CRD1, and CRD2 in the main region 11.

For example, a first redundancy address RD0 is associated with the column address MA3 of "3"(CRD0), a third redundancy address RD2 is associated with the column address MA7 of "7"(CRD1), and a fourth redundancy address RD3 is associated with the column address MA9 of "9"(CRD2). With this configuration, the defective column addresses CRD in the main region 11 are replaced by normal redundancy addresses RD in the redundancy region 12.

A dummy address DA is stored in a defective column address storing latch 641Z associated with the defective redundancy address RD. For example, any one address among addresses which come between column address MA corresponding to the redundancy addresses RD which are ahead of or behind the defective redundancy address RD is used as the dummy address DA. That is, supposing that the column addresses MA corresponding to the redundancy addresses RD which are ahead of and behind the defective redundancy address RD are "Mn" and "Mm" (Mn and Mm are integers equal to or greater than 0, and Mm is a value two or more larger than "2"), the order relation "Mn<the dummy address DA<Mm" is established.

As illustrated in FIGS. 11 and 12, in the flash memory of the present embodiment, the flag data FLG of 1 bit or more, or 2 bits or more is added to the defective column address storing latch 641 corresponding to each of the redundancy addresses RD. Each of the defective column address storing latches 641Z stores the flag data FLG as defective redundancy information of the redundancy region 12, in company with the defective column address CRD of the main region 11.

In the present embodiment, the flag data FLG of "0" is stored in the defective column address storing latches 641Z associated with the redundancy addresses (herein, redundancy address RD0, RD2, RD3) which do not include a defect. The flag data FLG of "1" is stored in the defective column address storing latches 641Z associated with the defective redundancy addresses (herein, a redundancy address RD1).

Besides based on the comparison result obtained by comparing an internal address signal (column address) Ain and the defective column address CRD, the connection relation between the redundancy unit RU corresponding to the redundancy address RA and a data bus 70 is controlled based on the flag data FLG of "0" or "1."

FIG. 13 illustrates an example of the internal configuration of a replacement determination circuit 382 which controls operation of the redundancy region 12 using the flag data FLG.

For example, as illustrated in FIG. 13, the flag data FLG and the output of the comparing unit 631 are input to an AND gate 649. Control is made such that a defective redundancy unit is not connected to a data bus 70 by an AND operation (logical sum) of the output (a comparison result of an address) of the comparing unit 631 and the flag data FLG.

A determining unit 65 includes a circuit 659 for calculating/detecting the output of the AND gate 649 (hereinafter, referred to as a defective redundancy address determining unit), in addition to a calculating unit (a circuit including a NOR gate) 651 which operates the output of the comparing unit 631.

As described above, since the comparison result of the comparing unit 631 is set to "0" when the internal address signal Ain does not match the defective column address CRD in the defective column address storing latch 6412, in either case that the flag data is "0" or "1", the output of the AND gate 649 is set to "0."

When the column address indicated by the internal address signal Ain matches the defective column address CRD stored in the defective column address storing latch 641Z, the comparison result of the comparing unit 631 is set to "1." When the flag data FLG is "0," the output of the AND gate 649 is set to "0." The flag data FLG of "0" indicates that the redundancy address RA corresponding to the defective column address storing latch 641Z is normal.

When all the outputs of the AND gates 649 are "0", the column-control-signal generating unit 384 and the selector 69 drive based on the output signal (determination signal) of the calculating unit 651. The defective redundancy address determining unit 659 does not output a signal which drives and controls the column-control-signal generating unit 384 and the selector 69.

When the comparing unit 631 outputs the comparison result of "1" and the flag data FLG is "1", the output of the AND gate 649 becomes "1." The flag data FLG of "1" indicates that the redundancy unit corresponding to the defective column address storing latch 6412 which holds the flag data FLG of "1" is defective. When the output of the AND gate 649 is "1", the internal address signal Ain matches the dummy address (normal column address) DA.

When the defective redundancy address determining unit 659 in the determining unit 65 detects the signal of "1" from the AND gate 649, the defective redundancy address determining unit 659 controls operation of the selector 69 so that the replacement process based on the signal of "1" of the comparing unit 631 may not be performed (that is, so that the defective redundancy address may not be accessed).

When the defective redundancy address determining unit 659 detects the signal of "1" from the AND gate 649, as a normal column address MA is used as the dummy address DA, the accessing target is a column address in the main region 11. The selector 69 connects the main-side local data bus 75 to the global data bus 70 based on the control signal supplied from the defective redundancy address determining unit 659. As described above, even in a case where the replacement process is performed, the pointer mPT is shifted within the main region 11 with a predetermined cycle, and the column unit CU corresponding to the column address is connected to the main-side local data bus 75 regardless of being normal/defective.

Accordingly, even when it is determined to be the object of the replacement process based on the dummy address DA, the column unit CU of the main region 11 is connected to the global data bus 70 by the controlling of the operation of the selector 69, based on the output signal of "1" from the AND gate 649 and the control signal of the defective redundancy address determining unit 659.

Thus, in a state where the pointer rPT is set to the defective redundancy address RD, even though the output of the calculating unit (the OR gate) 651 is set to "1" which indicates the replacement process being performed, the defective redundancy address RD is not connected to the global data bus 70, and data DT is transmitted between the normal column unit (column address) corresponding to the dummy address DA of the main region 11 and the global data bus 70.

The pointer rPT which has been set to the defective redundancy address is shifted to the redundancy LCD 50R corresponding to the redundancy address RD which is an object of a next replacement, based on the control signal and redundancy-side shift clock rCLK from the replacement determination circuit 382.

Thus, in a case where the internal address signal Ain and the dummy address DA match, the AND operation of the output of the comparing unit 631 and the flag data FLG corresponding to the dummy address DA become "1." When the output of "1" from the AND gate 649 is detected, the redundancy address RD associated with the defective column address storing latch 641 in which the dummy address DA is stored is not accessed. The defective redundancy address (the defective redundancy unit or the defective redundancy column block) in the redundancy region 12 is skipped.

On the other hand, since the flag data FLG is set to "0" for the normal redundancy address RD, the AND operation of the output (the comparison result of addresses Ain and CRD) of the comparing unit 631 and the flag data FLG does not yield "1."

As described above, the defective redundancy address RD (the defective redundancy unit) is controlled using the flag data FLG so as not to be accessed (so is to be skipped).

For the dummy address DA stored in the defective column address storing latch 641 corresponding to the defective redundancy address RD, when a k-th redundancy address RDk is defective, a column address, obtained by subtracting 1 from the defective column address CRD stored in the defective column address storing latch associated with a (k+1)-th redundancy address RDk+1, is stored, as the dummy address DA, in the defective column address storing latch associated with the k-th redundancy address RDk.

When the second redundancy address RD1 is defective in the example illustrated in FIG. 12, in order to form the dummy address DA, 1 is subtracted (decremented) from the value (herein, "7") of the defective column address stored in the defective column address storing latch 641Z associated with the third redundancy address RD2. The value "6" of the column address obtained by the subtraction is stored, as the dummy address DA, in the defective column address storing latch 641Z associated with the defective redundancy address RD1.

Herein, the example illustrated in FIG. 12 relates to an operation in which the column address MA6 of "6" as the dummy address DA is used and the normal column address of "6" as the internal column address Ain is input to each of the comparing units 631.

For the column address of "6" which is input as the internal column address Ain, the output of the comparing unit 631 and the flag data FLG are operated by the AND gate 649.

Since the column address of "6" is a normal address, the output of the comparing unit 631 associated with the defective column address CRD becomes "0."

On the other hand, since the address of "6" is stored, as the dummy address DA, in the defective column address storing latch 641Z corresponding to the defective redundancy address RD, the comparing unit 631 outputs "1."

And the calculation result of the AND gate 649 corresponding to the latch 6412 in which the dummy address DA is stored becomes "1" by the flag data FLG of "1" indicating the defective redundancy address and the output "1" of the comparing unit 641 which indicates matching with the dummy address DA.

Since the dummy address DA has the same value (herein, "6") as the column address which does not include a defect, the column address corresponding to the dummy address DA becomes the accessing target. Accordingly, the selector 69 is controlled based on the signal from the determining unit 65 such that based on the output of "1" from the AND gate 649, the main-side local data bus 75 is connected to the global data bus 70 but the redundancy-side local data bus 75R is not connected to the global data bus 70.

In this way, the normal column unit CU corresponding to the column address MA6 treated as the dummy address DA is connected to the global data bus 70.

On the other hand, although the pointer rPT is set to the defective redundancy unit RU corresponding to the defective redundancy address RD, the defective redundancy unit RU is not connected to the global data bus 75 by the selector 69.

In this way, when the internal address signal Ain matches the dummy address DA associated with the defective redundancy address, the normal column unit CU indicated by the dummy address DA is accessed, and the defective redundancy unit RU indicated by the redundancy address RD associated with the dummy address DA is skipped.

When the column address Ain with a different value from that of the dummy address DA is input to each of the comparing units 631, at least either one of the output of the comparing unit 631 and the flag data FLG is "0" as described above. In this case, the operation result of each of the AND gates 649 becomes "0." Accordingly, like the operation described above, based on the comparison result of the defective column address CRD and the internal address signal Ain, either the address (the column block CB and the column unit CU) of the main region 11 or the address (the column block RB and the column unit RU) of the redundancy region 12 is connected to the global data bus 70.

When a plurality of consecutive redundancy addresses RD is defective, values obtained by subtracting 1 from each of addresses (defective column addresses) in the defective column address storing latches 6412 associated with the normal redundancy addresses RD which are adjacent to the defective redundancy address are stored in the defective column address storing latches 641 associated with the consecutive defective redundancy addresses RD as the dummy addresses DA of the consecutive values, respectively.

When the dummy address DA is generated by performing the subtraction process on the defective column address CRD, the dummy address DA may be smaller than the column address MA of "0". In this case, the flag data FLG indicating the defective redundancy address RD is expressed in 2 bits. For example, in the defective column address storing latch 641Z in which the dummy address DA smaller than the column address MA0 of "0" is stored, an upper order of 1 bit of the flag data FLG may be set to "1". With use of the upper bit of the flag data FLG, control is performed such that the defective dummy address will not be accessed, regardless of the value of the dummy address DA of the defective column address storing latch 641 associated with the defective redundancy address.

For example, there is a case where among a plurality of consecutive redundancy addresses RDk−1, RDk, and RDk+1, the redundancy address RDk is defective, normal redundancy addresses RDk−1 and RDk+1 which are prior or subsequent to the defective redundancy address, respectively may replace the consecutive defective column address MAj and MAj+1 of the main region 11, respectively.

However, like the example of mapping of the column addresses between the main region and the redundancy region illustrated in FIG. 14, the normal redundancy addresses RD may not be used to improve control efficiency of the pointers mPT and rPT at the defective column address CRD and the redundancy address RD, depending on the position of the defective redundancy address.

Here, a description is given with an example in which the second redundancy address RD1 is defective, and the column addresses MA5 and MA6 of "5" and "6" which are consecutive in the main region 11 are defective.

In this case, the first redundancy address RD0 is not used for replacing the column address MA5 of "5" which is defective, the column address MA5 of "5" may be associated with the normal third redundancy address RD1, and the column address of "6" may be associated with the normal fourth redundancy address RD4. Since the second redundancy address RD1 is defective, the flag data FLG and the dummy address DA are stored in a manner as described above.

For example, the flag data FLG of "1" and the dummy address with a different value from the defective redundancy address RD1 are stored in the defective column address storing latch 6412 corresponding to the unused first redundancy address RD0. For example, any one address among the addresses ahead of the column address MA corresponding to the redundancy addresses RD2 is used as the dummy address DA (denoted as "DA1") of the redundancy address RD1. For example, any one address among the addresses ahead of the column address MA corresponding to the redundancy addresses RD1 is used as the dummy address DA (denoted as "DA0") of the redundancy address RD0. That is, supposing that the column address MA corresponding to the redundancy address (herein, RD2) subsequent to the defective redundancy address RD1 is "Mz" (z is an integer equal to or greater than 0, and z is a value two or more than "2"), the order relation "the dummy address DA0<the dummy address DA1<Mz" is obtained.

In this way, the consecutive defective column addresses CRDk and CRDk+1 are not associated with two redundancy addresses RDk−1 and RDk which are ahead of and behind the defective redundancy address RDk, respectively, and the normal redundancy address RDk−1 is not used. The selection order of the redundancy addresses is set such that the consecutive defective column addresses CRDk and CRDk+1 are associated with the consecutive normal redundancy addresses RDk+1 and RDk+2, respectively. Thus, the efficiency of control of the pointer rPT for the redundancy region 12 can be increased.

When "Mz" is smaller than 2, as described above, the flag data FLG illustrating the defective redundancy address RD may be expressed in 2 bits.

As described in the present embodiment, even when a defect exists in circuits corresponding to the redundancy region 12 and the redundancy region 12, it is possible to replace the defective column address CRD of the main region 11 with the redundancy address RD without impairing the operation speed of the flash memory, by excepting the defective redundancy address from the objects of operation, using The flag data FLG indicating the redundancy address RD being defective.

It is also possible to control the columns of the main region 11 and the redundancy region 12 with a combination of the flash memory of the present embodiment and the flash memory of the second embodiment.

Therefore, according to the semiconductor memory of the third embodiment and the controlling method thereof, the same effect as in the first embodiment and the second embodiment is acquired, and the operating characteristic of the semiconductor memory can be improved.

(4) Fourth Embodiment

A semiconductor memory (for example, a flash memory) according to a fourth embodiment is described with reference to FIGS. 15 to 18. In the present embodiment, the substantially same configurations as the flash memory of the first to third embodiments are denoted by the same reference numerals. In the flash memory of the present embodiment, description about the substantially same configurations, functions, or operations as the flash memory of the first embodiment is given as necessary.

Figure 15:
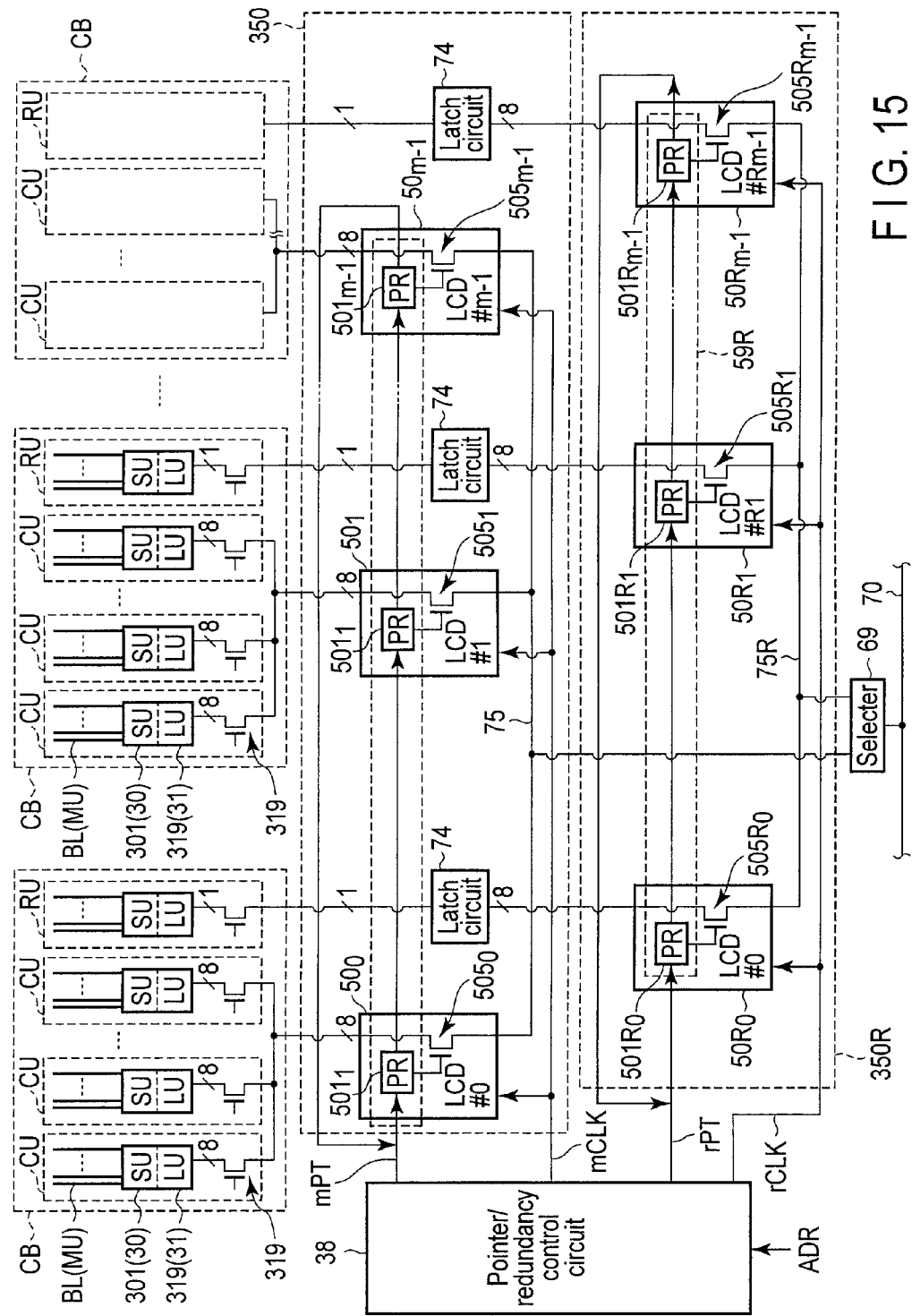
FIG. 15 is schematic diagram illustrating example of an internal configuration of a periphery portion of the memory cell array in the fourth embodiment.

FIG. 15 is a schematic diagram for describing the control unit which is set with respect to the column of the memory cell array 1, and the circuit configuration of each circuit in the column control circuit 3 corresponding to the control unit in the fourth embodiment.

As illustrated in FIG. 15, the present embodiment differs from the first to third embodiment in that a column unit and a redundancy unit is provided in a same column block in a memory cell array without dividing a memory cell array into a main region including a column unit and a redundancy region including a redundancy unit.

As illustrated in FIG. 15, the memory cell array 1 has a plurality of column blocks CB. In the present embodiment, each of the column blocks has a plurality of column units CU and a redundancy unit RU.

The redundancy unit RU includes redundancy cells and redundancy bit lines for repairing defective cells or defective bit lines when the defective cells or the defective bit lines, like that, exist in the column block CB. The redundancy unit RU and the column unit CU are adjacent to each other in the row direction, in each of the column blocks CB.

The column unit CU and the redundancy unit RU in the column block CB has the same configurations, and the connection relation between the redundancy cells and each of interconnects WL, BL, and SL is substantially identical to the connection relation between the memory cells MC in the column unit CU and each of interconnects WL, BL, and SL.

The redundancy unit has a plurality of memory strings. The memory string in the redundancy unit RU includes the redundancy cells. Select transistors are connected to one end and the other end of the memory string, respectively. Thereby, memory cell unit in the redundancy unit is formed. For example, the redundancy unit RU has the same storage capacity of one column unit CU. That is, the redundancy unit RU has eight bit lines BL.

The redundancy cells are connected to the same word line WL to which the memory cells MC are connected. The select transistors in the redundancy unit RU are connected to the same select gate lines SGDL and SGSL to which the select transistors in the column unit CU are connected. The redundancy cells for each memory cell unit are connected to one bit line (hereinafter, referred to as a redundancy bit line). The memory cell unit in the redundancy unit RU is connected to the same source line SL to which the memory cell unit in the column unit CU is connected.

The storage capacity of the redundancy unit RU in the memory cell array 1 may be made smaller than the storage capacity of the column units CU.

Herein, in addition to FIG. 15, the internal configurations of control units allocated to the memory cell array 1 and column control circuit 3 in the present embodiment are described with reference to FIGS. 16 and 17.

FIG. 16 is a schematic diagram for describing a connection relation among the bit lines in the memory cell array 1, the sensing units in the sense amplifier circuit 30, and the latching units in the data latch circuit 31 in the column unit CU. FIG. 17 is a schematic diagram for describing a connection relation among the bit lines in the memory cell array 1, the sensing units in the sense amplifier circuit 30, and the latching units in the data latch circuit 31 in the redundancy unit RU.

In the column block including the column units and redundancy unit, an internal configuration of the column unit is similar to the internal configuration of the column unit illustrated in FIG. 4.

In the column unit, eight sense amplifier units 301 and eight latching units 311 are connected in common to one data bus 300A. Eight bit lines are connected to sense amplifier units 301 corresponding to the bit lines. Eight sense amplifier units 301 are connected to the latch units 311 corresponding to the sense amplifier units 301.

Each of the column unit CU is connected to the column decoder 35 and a data bus via the column unit selection switch 319. As illustrated in FIG. 16, the column unit CU has eight column unit selection switches 319 corresponding to eight latching units 311, respectively. The latching unit 311 is connected to one end of the column unit selection switches 319 corresponding to the latching unit 311.

The column unit CU of FIG. 16 may be applied to the column unit or redundancy unit of the first to third embodiments, instead of the column/redundancy unit of FIG. 4.

In addition, in FIG. 15, for ease of illustration, eight sense amplifier units 301 are illustrated as single sense unit 301. Similarity, eight latching units 311 are illustrated as single latching unit 311. And eight column selection switches 319 are illustrated as single column unit 319.

Figure 17:
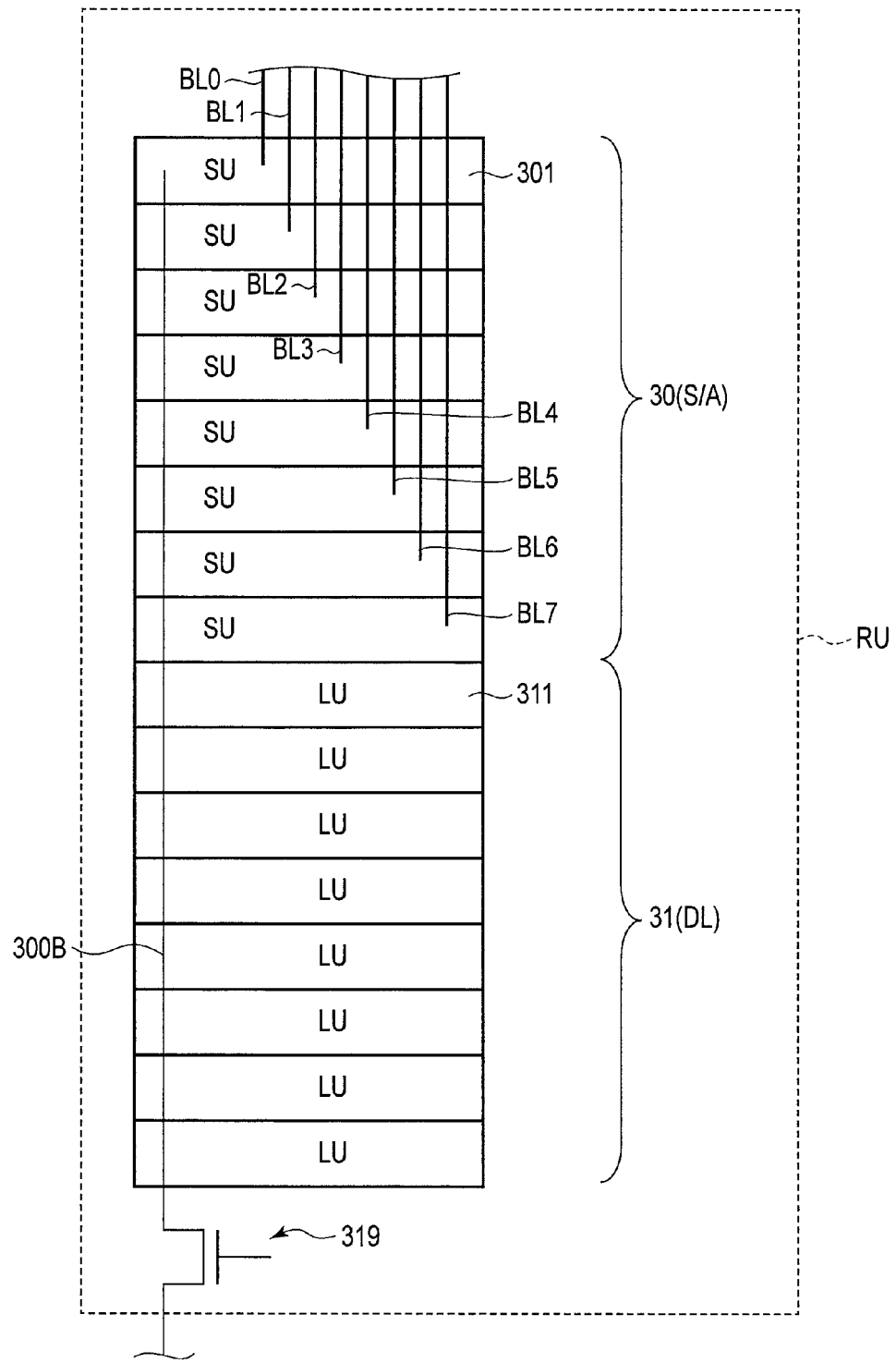
FIG. 17 is schematic diagram illustrating example of an internal configuration of a periphery portion of the memory cell array.

As illustrated in FIG. 17, a sense amplifier circuit 30 and a data latch circuit 31 of the redundancy units RU in the column blocks CB have the substantially same configuration of the sense amplifier circuit 30 and the data latch circuit 31 of the column units CU.

Each of the redundancy units is connected to the column decoder 35 and a data bus via a column unit selection switch 319.

In the redundancy unit RU, eight sense amplifier units 301 and eight latching units 311 are connected in common to a data bus 300B.

One end of the data bus 300B is connected to one end of a current path of the column unit selection switch 319.

The redundancy unit RU differs from the column unit CU and has single column unit selection switch 319.

The other end of the current path of the column unit selection switch 319 is connected to a latch circuit 74.

The latch circuit 74 has a latch which is capable of holding at least 8 bits. The latch circuit 74 has a function as a buffer temporary holding the data of the redundancy unit RU. The latch circuit 74 can hold the data of the redundancy unit RU.

In the present embodiment, latch circuit 74 is provided between the redundancy unit RU and LCD 50R.

As a comparison example, a case in where a latch circuit is provided in a peripheral circuit without providing the latch circuit between the column block CB and the selector 69 is described. In case of the comparison example, the data of redundancy unit RU is once read out the other latch circuit in the peripheral circuit and the data is returned again to the data latch circuit 31 (the latching unit 311) of the column unit CU.

However, in the present embodiment, since the latch circuit 74 is provided between the redundancy unit RU and LCD 50R, data of the redundancy unit may not be read into the peripheral circuit. Thus, a reading time of the present embodiment can be shorter than that of the comparison example.

The redundancy unit RU of FIG. 17 and the latch circuit 74 connected to the redundancy unit RU may be applied to the column unit or redundancy unit of the first to third embodiments, instead of the column/redundancy unit of FIG. 4.

As illustrated in FIG. 15, the column decoder 35 includes a plurality of LCDs $50_0, 50_1, \ldots, 50_{m-1}, 50R_0, 50R_1, \ldots,$ and $50R_{m-1}$. Hereinafter, for simplification of description, when not distinguishing a specific LCD from among LCDs $50_0, 50_1, \ldots, 50_{m-1}$, the LCD is denoted as an LCD 50, and when not distinguishing a specific LCD from among LCDs $50R_0, 50R_1, 50R_{m-1}$, the LCD is denoted as an LCD 50R.

The plurality of LCDs 50 and 50R controls selection and activation of the column blocks CB of the memory cell array 1. One LCD 50 corresponds to a plurality (x pieces) of column units CU which belongs to a certain group (control unit, column block). One LCD 50R corresponds to a redundancy unit RU which belongs to the certain group (control unit, column block).

One LCD 50 controls selection and activation of the column units CU based on a given order and certain operation timing. One LCD 50R controls selection and activation of the redundancy unit RU based on a given order and certain operation timing.

In the present embodiment, the column block CB includes column units CU and redundancy unit RU. The column units CU correspond to single LCD 50 and the redundancy unit RU corresponds to single LCD 50R.

Single LCD 50 for the column units CU and single LCD 50R for the redundancy unit RU is allocated to single column block CB.

The LCDs $50_0, 50_1, \ldots,$ and $50_{m-1}$ include registers $501_0, 501_1, \ldots,$ and $501_{m-1}$ and selection switches $505_0, 505_1, \ldots,$ and $505_{m-1}$, respectively. For clarification of description, when not distinguishing a specific register from among the registers $501_0, 501_1, \ldots,$ and $501_{m-1}$ of the LCDs 50, the register is denoted as a register 501. In addition, when not distinguishing a specific selection switch from among the selection switches $505_0, 505_1, \ldots,$ and $505_{m-1}$ of the LCDs 50, the selection switch is denoted as a selection switch 505.

In the same way, the LCDs $50R_0, 50R_1, \ldots,$ and $50R_{m-1}$ include registers $501R_0, 501R_1,$ respectively and $501R_{m-1}$ and selection switches $505R_0, 505R_1, \ldots,$ and $505R_{m-1}$, respectively. For clarification of description, when not distinguishing a specific register from among the registers $501R_0, 501R_1, \ldots,$ and $501R_{m-1}$ of the LCDs 50R, the register is denoted as a register 501R. In addition, when not distinguishing a specific selection switch from among the selection switches $505R_0, 505R_1, \ldots,$ and $505R_{m-1}$ of the LCDs 50R, the selection switch is denoted as a selection switch 505R.

The field effect transistor 505 serving as the selection switch 505 controls connection between the column unit CU of the column block CB and the data bus 75. For example, the signal which is held by the register 501 is used as a control signal for controlling ON and OFF of the field effect transistor 505.

One ends of the current path of eight data bus switches 505 are connected to the other ends of the current path of column unit selection switch 319 corresponding to each of data bus switch 505, respectively.

That is, in each of the column unit CU in the column block CB, column unit selection switches 319 corresponding to the data bus switch 505 are connected to common LCD 50 via the data buses and each of the column units CU is electrically connected to LCD 50 by the eight data bus.

In the redundancy unit RU, eight data bus switches 505R are the latch circuit 74 via eight data buses.

When the data bus switch 505 turns on, column units CU in the column block CB are electrically connected to the data bus 75.

In the column decoder 35, each of the registers 501 for the column units CU is connected to an adjacent register 501. A shift register 59 ranging over a plurality of LCDs 50 is formed.

In the column decoder 35, each of the registers 501R for the redundancy units is connected to an adjacent register 501R. A shift register 59R ranging over a plurality of LCDs 50R is formed. Each of the register 501R is connected to one end of the latch circuit 74. The other end of the latch circuit 74 is electrically connected data bus switch 505R.

The field effect transistor 505R as the selection switch 505R in the LCD 50R controls the connection between the latch circuit 74 and the data bus 75R. For example, the signal which is held by the register 501R is used as a control signal for controlling ON and OFF of the field effect transistor 505R.

The shift register 59R which is formed by the registers 501R of the plurality of redundancy LCDs 50R is electrically disconnected from the shift register 59 which is formed by the registers 501 of the plurality of LCDs 50.

As described above, an usage of redundancy unit differs from an usage of column unit CU, but any unit of column unit CU or redundancy unit RU is controlled.

Same as the first to third embodiments, among the column decoders 35, part (circuit area) of the column decoders 35 which controls the columns of the column units is referred to as a main column decoder 350, and part of the column decoders 35 which controls the columns of the redundancy unit RU is referred to as a redundancy column decoder 350R.

For example, m column blocks CB are provided in one memory cell array 1. m LCDs 50 and m pieces of LCDs 50R are provided for the column decoder 35. For example, one column block CB includes 16 column units CU and 1 redundancy unit RU.

In the present embodiment, all column block CB has a plurality of column units CU and a redundancy unit RU. However, present embodiment is not limited to that. For example, several column blocks have the column units CU and one redundancy unit RU, and remaining column blocks CB may not have a redundancy unit RU. If a column unit in the column block excluding a redundancy unit is defective, the defective column unit is replaced with a redundancy unit in the other column block. One column unit in one column block including a redundancy unit is defective, the defective column unit is replaced with a redundancy unit in the other column block. Thus, a defective column unit in the column block can be replaced by a redundancy unit in a free order.

For example, by connecting a column block CB which does not include a redundancy unit RU to a column block which include a redundancy unit RU, the number of the column can be changed to any number.

The number of the redundancy unit RU provided in the column block CB is smaller than the number of column units CU provided in the column blocks CB.

In the flash memory 100 of present embodiment, the column units CU in the column block CB are connected to a local data bus 75 via the LCD 50. The redundancy unit RU in the column block CB is connected to local data bus 75R via the LCD 50R. Two local data buses 75 and 75R are connected to a selector (selection circuit) 69.

The selection of the column units CU and redundancy unit RU is operated by using the mutually-independent pointers mPT and rPT in the column units CU and redundancy unit RU, by a pointer/redundancy control circuit 38.

As described above, the pointer/redundancy control circuit 38 generates a shift clock mCLK for moving (shifting) the pointer mPT for the column units CU among the plurality of LCDs 50 as well as generates and sets the pointer mPT. The shift clock mCLK generated inside the pointer/redundancy control circuit 38 is input to each of the LCDs 50. Synchronizing with the shift clock mCLK, the pointer mPT is shifted among the LCDs 50 by the sift register 59, and the selected column block CB change over in turn.

For example, when the pointer mPT is initially set to the register $501_0$ of a first LCD $50_0$, it is sequentially transmitted to the register $501_1$ of a second LCD $50_1$ and then to the register $501_2$ of a third LCD 502, synchronizing with the shift clock mCLK. The pointer mPT reaches the register $505_{m-1}$ of the last-stage LCD $50_{m-1}$.

When the input/output of the data having a predetermined data length corresponding to a command is not completed, the pointer mPT is transmitted to the register $501_0$ of the first LCD $50_0$ after the operation is performed on the column block CB corresponding to the LCD $50_{m-1}$, and is then set and shifted in turn to a next bit in the order of the first LCD 50, the second LCD 50, and the third LCD 50, synchronizing with the shift clock mCLK.

As for the selection of the plurality of column units CU in the column block CB, for example, in one operation cycle in which the pointer is shifted from the register $501_0$ of the first LCD $50_0$ toward the register $501_{m-1}$ of the m-th LCD $50_{m-1}$, when the operation for all column units CU of the selected column block CB is completed, the target column blocks CB of the operation sequentially change over, for example, to one column unit CU of a later-stage column block CB, synchronizing with the shift of the pointer mPT. In the selected column block CB, column units CU is sequentially change over by the column unit selection switches 319. In addition, like the first and third embodiment, the column units CU in the column block CB may be change over in the present embodiment.

In this way, for control of the columns of the memory cell array 1, the pointer mPT is shifted within the shift register 59 which is formed by the registers of the plurality of LCDs 50 at a predetermined timing and the plurality of column blocks CB are selected in a given order.

In the present embodiment, the pointer/redundancy control circuit 38 includes a circuit for controlling the operation with respect to LCDs 50 of the column units CU in the column blocks CB and a circuit for controlling the operation with respect to LCDs 50R of the redundancy unit RU in the column blocks CB.

The pointer/redundancy control circuit 38 performs control of replacing a column unit having a defect with a redundancy when the defect occurs in the circuits for driving the column units CU of the column block CB.

The pointer/redundancy control circuit 38 is, for example, replaced a defective column unit in a column block CB with the redundancy unit RU in the column block CB on a repair unit as the column unit basis.

Therefore, the column unit including a defective cell and/or a defective bit line, and the like, can be repaired by the redundancy unit.

In the flash memory of the present embodiment, the control of the columns in the redundancy units RU in the column blocks CB of the memory cell array 1 is performed using the pointer rPT.

The control of the columns of the redundancy units RU in the column blocks CB is performed using the pointer rPT which is different from the pointer mPT used for the column units CU in the column blocks CB.

As described above, the shift register 59R is formed across the plurality of redundancy LCDs 50R in the redundancy column decoder 350R. The shift register 59R of the redundancy units RU is electrically disconnected from the shift register 59 of the column units CU.

The pointer rPT for the redundancy units RU is held as a signal (set state signal) of the "H" level in the shift register 59R formed by the redundancy LCDs 50R, and moves among the redundancy LCDs 50R along a route which is different from the route of movement of the pointer mPT.

The pointer rPT for the redundancy units RU moves among the redundancy LCDs 50R of the redundancy column decoder 350R in response to a shift clock rCLK which is different from the shift clock mCLK which is used for the shift of the pointer mPT for the column units CU.

The shift clock rCLK is input to the plurality of redundancy LCDs 50R. For example, the pointer rPT moves within the shift register 59R, synchronizing with the input shift clock rCLK.

When a defective column unit CU in the memory cell array 1 is replaced with a redundancy unit RU, the setting or shift of the pointer rPT enables the change-over of the redundancy unit RU in the column block CB which are selected.

Thus, when the column units CU and redundancy unit RU are provided in the column block, the same as the above-described embodiments, in the flash memory 100 of the present embodiment, the redundancy column decoder 350R controls the redundancy units RU using the pointer rPT and the shift clock rCLK which are different from those used for the LCDs 50 in the main column decoder 350.

The configuration of the pointer/redundancy control circuit 38 in the flash memory of the present embodiment is described with reference to FIG. 18, in addition to FIGS. 15 to 17.

Figure 18:
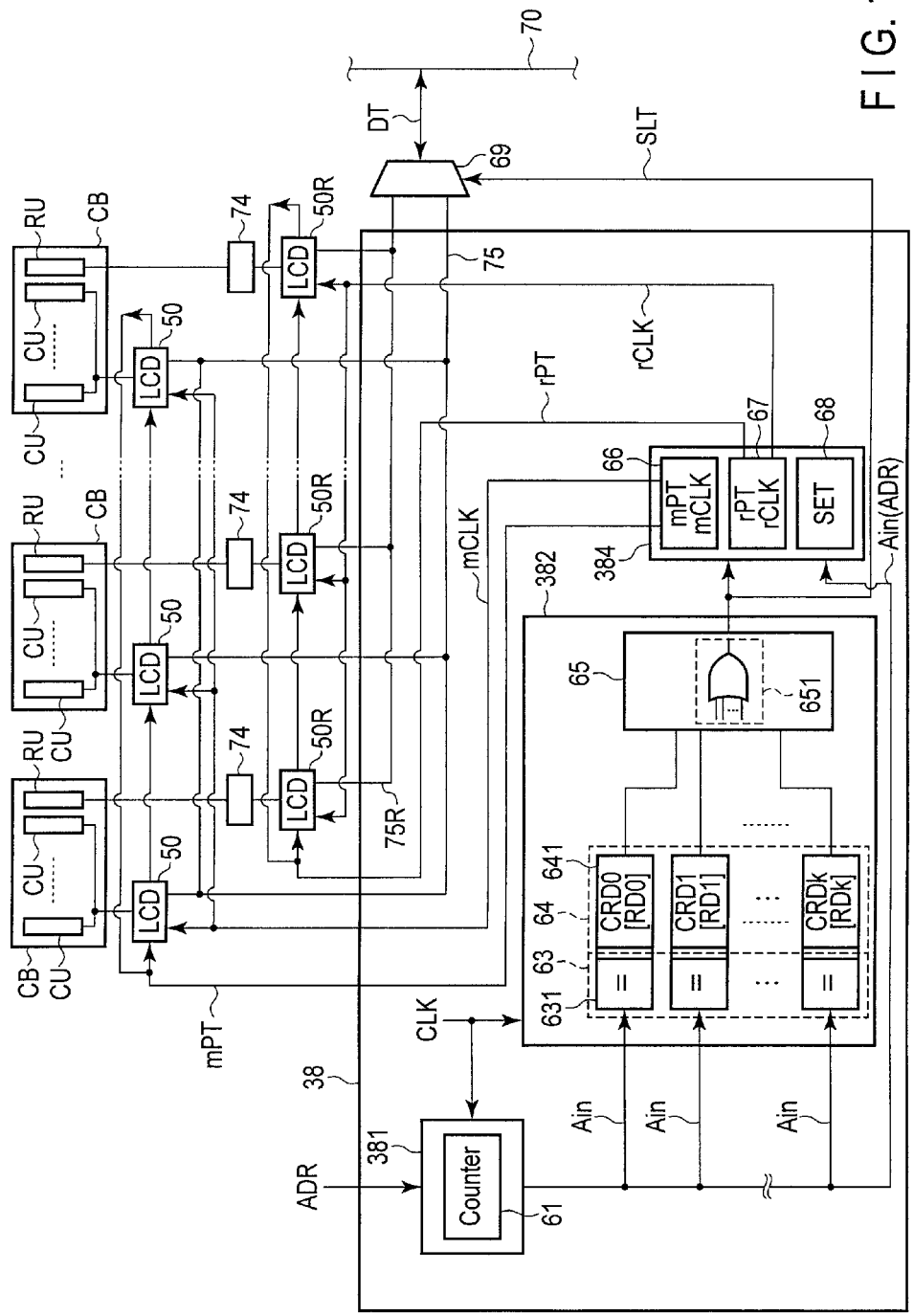
FIG. 18 is a schematic diagram illustrating an example of a configuration of a semiconductor memory according to a fourth embodiment.

FIG. 18 is a diagram illustrating an example of the internal configuration of the pointer/redundancy control circuit 38 included in the flash memory of the present embodiment.

In the present embodiment, when the external address signal ADR is input, the pointer/redundancy control circuit 38 changes the set signal of the pointers mPT and rPT, from a "L (0)" level to the "H (1)" level, and prepares for the setting of the pointer mPT to the LCD 50 corresponding to the external address signal ADR which is input and the setting of the pointer rPT to LCD 50R for controlling the redundancy unit RU.

In the present embodiment, the internal address signal Ain represents the column address (start address) of column block CB (or column unit) which corresponds to the external address signal ADR, and the column address in column block CB (or column unit) which is successive to the external address signal ADR. For example, the two column addresses adjacent each other correspond to the addresses of different column blocks CB.

In addition, in the present embodiment, the internal address signal Ain corresponds to the pointer which indicates the column block CB (or column unit) indicated by the external address, and to the pointer mPT which indicates the address (column address) of the column block CB (or column unit) which is to be subsequently selected. The value obtained by adding +1 to the present column address (pointer value) which is under selection represents the column address which is to be selected subsequently.

The value of the pointer mPT represents a physical column address corresponding to the selected LCD 50. The value of the pointer mPT matches the physical column address of the column block CB.

The pointer/redundancy control circuit 38 sets the pointer mPT to the selected LCD 50 using the column control signal generating unit 384 after the conversion from the external address signal ADR to the pointer mPT is finished and the preparation for causing the column unit CU (column block CB) to drive is finished.

Synchronizing with the setting of the pointer mPT to the LCD 50, for controlling the column blocks CB and the column units CU, the pointer/redundancy control circuit 38 generates the shift clock mCLK, and the pointer/redundancy control circuit 38 supplies the shift clock mCLK to the LCD 50 of the main column decoder 350. The shift clock mCLK is used as a control signal of the shift register 59 in the main column decoder 350. For example, a frequency of the shift clock mCLK differs from a frequency of the operation clock CLK of the flash memory.

Synchronizing with the shift clock mCLK, the signal hold state (hold state of the "H" or the "L" level) of each of the registers 501 which form the shift register 59 changes. As a result, the set state signal of the "H" level sequentially moves among the LCDs 50 in the main column decoder 350, and the column address to which the pointer mPT is set is shifted. With this operation, the column block CB which is under selection (access) change over among the column blocks CB. In this way, the change of the signal hold state in the shift register 59 becomes equivalent to the shift of pointer mPT.

In the flash memory 100 of the present embodiment, the external memory controller 120 or host device 120 can identify the addresses of the column block and the column unit which have been selected in the present time using the pointer mPT. The pointer/redundancy control circuit 38 can also identify the column block CB as an object for the present operation, for example, by distinguishing the pointer hold state of the LCD 50.

A replacement determination circuit 382 in the pointer/redundancy control circuit 38 performs a determination for a process of replacing an address of a defective column with a redundancy address, based on a result of a determination on whether the column address for column units CU selected by the column unit selection unit 319 is defective.

A defect address information storage circuit 64 in the replacement determination circuit 382 stores information-on-defects of the column units CU of the column blocks CB.

The defect address information storage circuit 64 stores the plurality of addresses (pointer values) CRD0, CRD1, . . . , and CRDk of the defective column units CU as information-on-defects.

As a described above, an address CRD of the defective column unit detected at the time of the test is stored in a defective column address storing latch 641 at the time when the flash memory 100 is powered up.

For example, the defective column address storing latches 641 is associated with addresses (redundancy addresses) RD0, RD1, . . . , and RDk of the redundancy units RU of the column blocks CB. As a result, the defective column addresses CRD0 CRD1, . . . , and CRDk of the column units CU are associated with the redundancy addresses RD0, RD1, . . . , and RDk of the redundancy units RU.

When the defective column unit becomes an object of operation at the time of the operation of the flash memory 100 including the column units CU and the redundancy unit RU in the column block CB, the redundancy address RD associated with the defective column address CRD indicating the defective column unit is accessed without accessing the defective column unit. The redundancy unit RU corresponding to the redundancy address RD is an object of the input/output of data (writing/reading of data). Thus, the defect in the column unit CU is repaired by performing a replacement process in which the defect is replaced with a redundancy.

The same as the first embodiment, the replacement determination circuit 382 in the pointer/redundancy control circuit 38 in the present embodiment includes a comparison circuit 63 including a plurality of comparing units 631 and a determining unit 65.

For example, each of the comparing units 631 compares the input internal address signal (pointer mPT) with each of the defective column addresses. The determining unit 65 outputs, as a determination signal, the result of the determination about the presence of the replacement process which is determined based on the comparison result of the internal address signal Ain and the defective column address CRD. The determining unit 65, for example, has a calculating unit having an OR gate 651. The output (comparison result) from each of the comparing units 631 is input to each input terminal of the OR gates 651 of the determining unit 65.

When the internal address signal Ain which is input to the replacement determination circuit 382 does not match the defective column address in the defect address information storage circuit 64, the determining unit 65 outputs a determination signal (for example, the signal of the "L(0)") indicating that the column unit CU which is to be selected next time is not defective (the replacement process is not performed).

When the internal address signal Ain which is input to the replacement determination circuit 382 matches the defective column address in the defect address information storage circuit 64, the determining unit 65 outputs a determination signal (for example, the signal of the "H(1)") indicating that the column unit CU which is to be selected next time is defective (the replacement process is performed).

The column-control-signal generating unit 384 controls the setting of the pointer mPT or rPT for the column block CB including the column units CU and the redundancy unit RU, based on the input of the external/internal address signal ADR/Ain to the pointer/redundancy control circuit 38 and the input of the determination signal.

The column-control-signal generating unit 384 causes the LCD 50 or 50R corresponding to the selected address to enter a set state (a hold state of the "H" level signal) based on the pointer mPT or rPT. In the present embodiment, column block CB of LCD 50 of the set state may be the same as a column block CB of redundancy LCD 50R or may differ from a column block CB of redundancy LCD 50R.

The same as the first embodiment, column-control-signal generating unit 384 includes a control unit 66 for generating and controlling the pointer mPT and the shift clock mCLK for the column unit CU, and the control unit 67 for generating and controlling the pointer rPT and the shift clock rCLK for the redundancy unit RU.

The column-control-signal generating unit 384 sets the pointer mPT so as to select the column unit CU in the column block CB corresponding to the column address as described above.

The column-control-signal generating unit 384 sets the pointer rPT to the redundancy unit RU in the column block CB corresponding to the redundancy address in order to control the replacement process of the defective column unit.

In a case where the defective column address CRD is replaced with the redundancy address RD by the control of the column-control-signal generating unit 384, the register 501 of the redundancy LCD 50R corresponding to the redundancy address RD which is to be used for the replacement process, within the shift register 59R of the redundancy column decoder 350R, holds the signal of the "H" level. The column block CB corresponding to the redundancy LCD 50R holding the signal of the "H" level is activated, and the redundancy unit RU indicated by the redundancy address RD is selected. The input/output of the data with respect to the redundancy unit RU is performed in this way.

The column-control-signal generating unit 384 generates the shift clock mCLK of a predetermined frequency. As described above, the generated shift clock mCLK is supplied to each of the LCDs 50 in the main column decoder 350.

The redundancy-side control unit 67 of the column-control-signal generating unit 384 generates the shift clock rCLK. The shift clock rCLK is supplied to the register 501B which forms the shift register 59R in the redundancy column decoder 350R.

Synchronizing with the supplied shift clock rCLK, the redundancy unit RU of the column block CB corresponding to the redundancy address RD which is an object of replacement are selected and activated. Synchronizing with the supplied shift clock rCLK, the pointer rPT for the redundancy units RU is shifted among the redundancy LCDs 50R, and the signal hold state of the register 501R in the shift register 59R in the redundancy column decoder 350R changes.

The shift clock rCLK for the redundancy units RU has a frequency different from that of the shift clock mCLK for the column units CU. When the internal address signal Ain, which is input to the replacement determination circuit 382, does not match the defective column address CRD in the defect address information storage circuit 64 (when the replacement process is not performed), the redundancy-side control unit 67 of the column-control-signal generating unit 384 maintains the signal level of the shift clock rCLK at the "L" level.

When the input internal address signal Ain matches the defective column address CRD (when the replacement process is performed), the redundancy-side control unit 67 of the column-control-signal generating unit 384 changes the signal level of the shift clock rCLK from the "L" level to the "H" level.

As described above, the determination signal of the determining unit 65 of the replacement determination circuit 382 indicates the "L" level when the column unit CU in the column block CB which is to be selected next time (subsequently) is not defective, and the determination signal indicates the "H" level when the column unit CU in the column block CB which is to be selected next time is defective. The selector 69 selects either the local data bus 75 for the column units or the local data bus 75R for the redundancy unit RU based on the input signal SLT from the determining unit 65.

In this way, the defective column unit CU is replaced with the redundancy unit RU replaces so that the defect of the column unit CU is repaired.

Besides the replacement of the defective cell and the defective bit line, the flash memory of the present embodiment can repair a defect in the sensing unit 301 and the latching unit 311 included in the column unit CU of the column block CB, by using the redundancy unit RU in the column block CB, through the replacement process (repair process) of using the mutually-independent pointers mPT and rPT in described above, when the defect occurs in the sensing unit 301 and the latching unit 311 included in the column unit CU.

As described above, using the mutually-independent pointers mPT and rPT, and the mutually-independent shift clocks mCLK and rCLK, the flash memory 100 of the present embodiment controls the process of replacing the defect in the column units CU in the column block CB with the redundancy unit RU in the column block CB, and repairs the defect in column unit CU.

Thus, in the flash memory 100 of the present embodiment, based on the result of comparison between the defective column address CRD and the address Ain which is to be selected next time, the data bus 70 is selectively connected to either the column unit CU or the redundancy unit RU by the selector 69, and the data DT is directly transmitted between the column unit CU and the data bus 70, or between the redundancy unit RU used in the replacement process and data bus 70.

The flash memory of the present embodiment, the same as the first to third embodiments, can perform the data transmission between the redundancy unit RU and the data bus 70, without going through the data bus 75 and the latching unit 311 of the column unit CU. Because of this, the flash memory of the present embodiment can perform a high speed operation.

Therefore, the operating characteristics of a semiconductor memory of the fourth embodiment may be improved.

(b) Operation

A control method (operation) of the flash memory of the fourth embodiment is described. Hereinafter, in addition to FIGS. 15 to 18, FIGS. 6 and 7 are also suitably referred to in describing the operation of the flash memory of the present embodiment.

Herein, for simplification of description, described is an operation in which a first column block CB (CB#0) is selected by the external address signal ADR, and subsequently each column block CB and each column unit CU are sequentially selected.

In the present embodiment, like the first embodiment, such as the example of FIG. 6, described is a case as an example in which, as the pointer mPT is shifted, a third column address MA2 and a j+1-th column address MAj are found to be defective column addresses CRD0 and CRD1.

For example, two adjacent column addresses belong to two adjacent column blocks CB, respectively, and two adjacent redundancy addresses belong to two adjacent column blocks CB, respectively.

Herein, the operation example of the flash memory of the present embodiment is described using the timing chart illustrated in FIG. 7.

For example, a control signal (command) and the address signal is input to the flash memory 100.

One or more defective column addresses CRD are stored in the defective column address storing latches 641 in the defect address storage circuit 64, respectively in a manner to correspond to the redundancy units (repair units) of the column block CB.

As illustrated in FIG. 7, in response to the input of the external address signal ADR, the signal level of the set signals mSET and rSET for the column units CU and the redundancy unit RU in the column block CB is changed from the level "L(0)" to the level "H(1)" by the set signal control unit 68. With the change of the signal level of the set signals SET, the operation for controlling the column of the memory cell array 1 is prepared.

Using the set signal mSET of the "H" level for controlling the column units CU of the column block CB and the external address signal ADR, the pointer mPT corresponding to the column block CB (or column unit CU) is generated by the column-control-signal generating unit 384.

Using the set signal mSET of the "H" level, the shift clock (main-side shift clock) mCLK for setting the pointer mPT to the LCD 50 indicated by the external address signal ADR is generated by the column-control-signal generating unit 384. The shift clock mCLK is supplied to the LCDs 50 of the main column decoder 350, respectively.

During a period until a substantial access to the selected address is started after the set signal mSET changes to the "H" level (the period until the LCD 50 starts driving), the address signal ADR and the defective column addresses CRD are compared by each of the comparing units 63 in the replacement determination circuit 382 to confirm whether the address signal ADR matches the defective column address CRD stored in each of the defective column address storing latches 641.

Herein, as illustrated in FIG. 6, a selected address MA0 (for example, the first column block CB#0) which is first selected based on the external address signal ADR does not include a defect. In this case, since the external address signal ADR and each of the defective column addresses CRD0, CRD1, . . . and CRDi do not match, the signal "0" (the signal of the "L" level) is output to the determining unit 65 from each of the comparing units 631.

The signal "0" is input to all the input terminals of the OR gates included in the calculating units 651 in the determining unit 65, and the OR gates output the signal of the "L(0)" level.

When the replacement determination circuit 382 obtains the determination signal of the "L" level, the replacement process between the column unit CU and the redundancy unit RU in the column block CB is not performed.

When the determination signal of the "L" level is input to the column-control-signal generating unit 384 (when the selected address is not a defect), for example, the redundancy-side control unit 67 does not drive, and the control signal (the pointer and the shift clock) for the redundancy unit RU of the column block CB is not generated nor output.

Thus, when the input address does not match the defective column address CRD (when the column unit to be selected next time is not defective), the data hold state of the shift register 590 of the redundancy LCD 50 becomes the "L(0)" level, the data pass switch 505R in the redundancy LCD 50R is not turned on. The redundancy unit RU in the column block CB is not electrically connected to the local data bus LDP2 (75R).

When control of the column of the memory cell array 1 is started, generation of the pointer mPT and the shift clock mCLK, for example, is started by the set signal mSET of the "H" level, based on the timing at which the external address signal (or the address signal from the internal control circuit 8) ADR is input, without being dependent on the determination signal.

Like the first embodiment, for example, synchronizing with the timing at which the determination signal is input, the signal of the "H" level serving as the pointer mPT is supplied to a predetermined LCD 50 corresponding to the address signal ADR by the main-side control unit 66. Herein, the pointer mPT is held in the predetermined LCD 50 corresponding to the column address MA, synchronizing with the first clock signal of the shift clock mCLK. The data hold state of the register 501 in the LCD 50 becomes the "H" level, and the data pass switch 505 turns on based on this "H" level signal. Thus, the column unit CU of the column block CB corresponding to the column address MA (herein, address MA0) are electrically connected to the local data bus LDP1 (75).

When the selection signal SLT supplied to the selector 69 (the determination signal of the replacement determination circuit 69) is at the "L" level, the local data bus LDP1 (75) for the column unit CU is connected to the global data bus GDP (70) by the selector 69. In this case, the local data bus LDP2 (75R) for the redundancy unit RU in the column block CB is electrically disconnected from the global data bus GDP (70) by the selector 69.

As illustrated in FIG. 6, the selected address MA0 (herein, the first column block CB#0) based on the external address signal ADR does not include a defect, and the column block CB is accessed in relation with the LCD 50 to which the pointer mPT has been set. As a result, the data DT is serially input and output between the column unit CU in the column block CB serving as the selected address MA0, and the data bus GDP.

When data writing is performed, the data DT of a predetermined size is input to the latching unit 311 or the sense amplifier unit 301 in the selected column unit CU via the data bus switch 505 in the ON state and the column unit selection switch 319 in the ON state. When data writing is performed, one page of the data can be written, in a lump, into the plurality of memory cells MC connected to the selection word line after the one page of the data is stored in the data latch circuit.

When data reading is performed, the data DT of a predetermined size is input to the latching unit 311 or the sense amplifier unit 301 in the selection column unit CU, for example, the data DT is output to the data input/output buffer (page buffer) 7 via the data pass switch 505 and the column selection switch 319 which are in the ON state, the local data bus 75 selected by the selector 69, and the global data bus 70.

For example, in a case where the address signals ADR and Ain and the defective column address CRD match, the redundancy-side set signal rSET is maintained by the set signal control unit 68 at the "H" level so that the pointer rPT may be set to a predetermined redundancy address RD.

Synchronizing with the operation clock CLK of the flash memory 100, an increment operation (a calculation process of "+1") of the external address signal ADR or the pointer mPT is performed by the counter 61 of the control unit 381.

The internal address signal Ain obtained by the increment operation corresponds to the column address (pointer) MA of the column unit CU of the column unit CB which is to be accessed next time (which is to be selected next time).

For example, during a period until the pointer mPT is shifted to the LCD 50 of the selected address which is to be selected next time after the pointer mPT is set to a certain LCD 50, that is, a period in which the input or output of the data DT is performed with respect to the selected column unit CU, whether the internal address signal Ain obtained by the increment is defective or not is determined.

By an operation which is substantially the same as the above-described operation performed with respect to the external address signal ADR, the internal address signal (pointer) Ain acquired through the increment process is input to each of the comparing units 631 in the replacement determination circuit 382. The comparison result of each of the comparing units 631 is output to the determining unit 65. The determination signal based on the comparison result is output to column-control-signal generating unit 384 from the determining unit 65, and the selection signal SLT is output to the selector 69 from the determining unit 65.

The pointer mPT is shifted to the LCD 50 which is to be selected next time from the LCD 50 corresponding to the column units CU for which the input/output of the data is completed, by the shift clock mCLK of a predetermined frequency, without being dependent on the determination result of good/fail with respect to the internal address signal Ain. With this operation, the column block CB connected to the local data bus 75 change over automatically, in sequence.

In the example illustrated in FIG. 6, a third column address MA2 is a defect address CRD. Accordingly, the column address MA2 is stored as the defective column address CRD in one defective column address storing latch 641.

When the internal address signal Ain indicating the column address MA2 is input to the replacement determination circuit 382, the output signal (comparison result) of the comparing unit 631 corresponding to the latch 641, in which the column address MA2 as the defective column address CRD1 is stored, among the comparing units 631 of the replacement determination circuit 382, displays "1." The output signals of other comparing units 631 display "0."

If "1" is contained in at least one signal output from the comparing units 631, the outputs (determination signal) of the OR gates of the calculating units 651 of the determining unit 65 will be set to "1."

Accordingly, when the column address MA2 (column unit or column block) which is to be selected next time is defective, the determination signal of "H(1)" is output to the column-control-signal generating unit 384 from the replacement determination circuit 382.

Based on the determination signal of "H", the set signal rSET for the redundancy unit RU of the column block CB is changed to the "L" level from the "H" level by the set signal control unit 68 in the column-control-signal generating unit 384.

The control signals rPT and rCLK are generated by the redundancy-side control unit 68 of the column-control-signal generating unit 384 with the timing at which the set signal rSET changes to the "L" level. For example, the redundancy-side shift clock rCLK is generated by the redundancy-side control unit 68, based on the determination signal of "H", and the signal level of the redundancy-side shift clock rCLK changes from the "L" level to the "H" level.

The shift clock rCLK is supplied to each of the redundancy LCDs 50R in the redundancy column decoder 350R, and the pointer rPT is supplied to the redundancy LCD 50R corresponding to the address for the replacement. With the timing in synchronization with the shift clock rCLK, the signal of the "H" level serving as the pointer rPT is input to the redundancy LCD 50R, and the pointer rPT is set to the redundancy address RD to replace the defective column address CRD.

And the redundancy unit RU as the control unit is selected and activated by the pointer rPT and the shift clock rCLK, with the timing at which the defective column address CRD (=MA2) is selected.

The operation of the selection and activation of the redundancy unit RU of the column block CB is substantially the same as the operation of the selection and activation of the column unit CU of the column block CB.

When the redundancy unit RU are selected by the process of replacing the defective column address CRD (defective column unit CU) with the redundancy address RA (redundancy unit RU), the signal of the "H" level is held in the register 501 in the redundancy LCD 50R corresponding to the address RD to which the pointer rPT is set, and the data pass switch 505R in the redundancy LCD 50R turns on based on the signal.

Thus, the column block CB including the defective column unit CU and the column block CB including the redundancy unit RU which has replaced the defective column unit is selected. The column unit selection switch 319 corresponding to the redundancy unit RU which has replaced the defective column address CRD turns on. Thus, the redundancy unit RU which has replaced the defective column address CRD is activated, and the redundancy unit RU is connected to the local data bus LDP2.

Even when the defective column unit CU of the column block CB is replaced by the redundancy unit RU of the column block CB, the pointer mPT is set to the LCD 50 corresponding to the defective column address MA2, synchronizing with the shift clock mCLK, and the defective column unit CU is electrically connected to the local data bus LDP1.

As described above, in the present embodiment, the local data bus LDP1 and the local data bus LDP2 are connected to the global data bus 70 via the selector 69. The determination signal corresponding to the comparison result of she internal address signal Ain and the defective column address CRD is supplied to the selector 69 as the selection signal SLT. When the column address (herein, address MA2) which is to be selected next time and the defective column address CRD match, the determination signal as the selection signal SLT indicates the "H(1)" level.

When the selection signal (determination signal) SLT of the "H" level is supplied to the selector 69, the local data bus LDP2 provided for the redundancy unit RU is connected to the global data bus GDP by the selector 69. The local data bus LDP1 provided for the column unit CU is electrically disconnected from the global data bus GDP by the selector 69. Accordingly, even though the column unit of the defective column address CRD is connected to the local data bus LDP1, the data transmission between the column unit CU of the defective column address CRD and the global data bus GDP is intercepted by the selector 69.

The timing at which the selector 69 switches the connection between the global data bus 70 and the local data bus 75 and 75R is synchronized with the timing at which the pointer hold state of the LCD corresponding to the address which is currently selected changes from the "H" level to the "L" level (the timing at which the shift clock mCLK changes from the "H" level to the "L" level.

In this way, when the column address MA2 at which the defect occurs in the column unit CU in a column block CB is a selected address, the column unit CU corresponding to the address MA2 is replaced by the redundancy unit RU corresponding to the redundancy address RA0. Instead of the column unit CU of the defective column address MA2 (CRD0), the redundancy unit RU of a column block CB is accessed as an object of the input/output of data. In this way, the defective column unit is repaired.

The redundancy unit RU of the column block corresponding to the redundancy address RA is connected to the global data bus GDP via the latch circuit 74, data is input to the redundancy unit RU when the data is written, or data is output from the redundancy unit RU when the data is read.

When data reading is performed, even when the redundancy unit RU is an accessing target, the data of the defective column unit in the column block CB is read from the memory cell unit to the sensing unit and the latching unit. As described above, the local data bus LDP2 is connected to the global data bus GDP by the selector 69, and the local data bus LDP1 is disconnected from the global data bus GDP. Accordingly, when the redundancy unit RU is accessed, the data from the column unit CU of the column block CB is not output to the global data bus GDP and the outside.

When the defective column unit in the column block CB is replaced by the redundancy unit RU at the time of data writing, in the redundancy unit RU corresponding to the redundancy LCD 50R to which the pointer rPT is set, the selector 69 causes the data DT from the outside to be input into the latching unit 311 in the redundancy unit RU, and causing the data from the outside not to be input to the latching unit 311 in the defective column unit.

In addition, if a column unit in the column block excluding a redundancy unit is defective, the defective column unit is replaced with a redundancy unit in the other column block.

After the transmission of the data DT between the global data bus GDP and the redundancy unit RU which has replaced the defective column unit is completed, the shift clock rCLK is changed from the "H" level to the "L" level by the redundancy-side control unit 67.

At this time, the pointer rPT is not shifted from the LCD 50R of the set state to the later-stage LCD 50R, but, for example, is held in the redundancy LCD 50R corresponding to the address RA0 which has undergone the input or output of the data. However, the pointer rPT may be shifted to the later-stage redundancy LCD 50R after the access to the redundancy unit RU is completed, or the signal hold stage of all the redundancy LCDs 50R may become a reset state ("L" level) once.

Herein, in the LCD in which the pointer rPT is held, the column unit selection switch 319 corresponding to the redundancy unit RU which has replaced the defective column address CRD turns on. However, if the address of the column block CB which is to be selected next time and the defective column address do not match, the data bus 75R is not connected to the global data bus 70 by the control of the selector 69. As a result, even though the LCD 50R holds the pointer rPT, control may be performed such that the input/output of the data is not performed with respect to the latching unit 311 in the redundancy unit RU.

For example, after the transmission of the data DT between the global data bus GDP and the redundancy unit RU which has replaced the defective column unit is completed, at the time when the column address and the defective column address match each other in the next time, the set signal rSET is changed from the "L" level to the "H" level by the set signal control unit 68 so that the pointer rPT is settable with a random timing.

Like the first to third embodiments, the selected redundancy address is not notified to the memory controller 120 or the host device 120 during the operation of the flash memory 100.

Within a period in which the data DT is being input to or output from the redundancy unit RU, like the above-described period in which the data is being input to or output from the column unit CU in the column unit CB, comparison and determination are made by the replacement determination circuit 382 to confirm whether the defective column address CRD and the column address (internal address signal) Ain in the column block CB which is to be selected next time match or not each other.

When the column address which is to be selected next time is found to be not defective, based on the determination result and comparison result between the defective column address CRD and the address signal Ain in the column block CB which is to be selected next time, the local data bus LDP1 is electrically connected to the global data bus GDP by the selector 69. On the other hand, the local data bus LDP2 is electrically disconnected from the global data bus GDP.

And synchronizing with the shift clock mCLK, the pointer (the signal of the "H" level) is shifted like in the above-described operation performed with respect to the column address of the column block CB. The data transmission is performed with respect to the LCD 50, to which the pointer mPT is set, between the global data bus 70 and the column units CU corresponding to the column address MA.

When the column address (for example, the address MAj) which is to be selected next time is found to be defective, based on the determination result and comparison result between the defective column address CRD and the address signal Ain which is to be selected next time, the local data bus LDP1 is electrically connected to the global data bus GDP by the selector 69 based on the determination signal. On the other hand, the local data bus LDP1 is electrically disconnected from the global data bus 70.

During the period in which the set signal rSET for the redundancy unit RU changes from the "H" level to the "L" level, the shift clock rCLK changes from the "L" level to the "H" level by the column-control-signal generating unit 384. The pointer rPT is shifted to the predetermined redundancy LCD 50R by the shift clock rCLK of the "H" level. Furthermore, the pointer rPT may be newly generated and set to the redundancy LCD 50R of the redundancy address RD which has replaced the defective column address CRD.

And, like the above-described operation which is performed on the redundancy address which has replaced the defective column address CRD of the column block CB, with respect to the redundancy LCD 50 to which the pointer rPT is set, the data is input or output between the global data bus 70 and the redundancy unit RU of the redundancy address RD associated with the defective column address CRD.

The above-described operation is repeatedly performed until the input or output of the data having a predetermined size which is requested from the outside is completed.

As described above, in the flash memory of the fourth embodiment, a redundancy unit is provided in the column block including column units.

As described above, according to the flash memory of the fourth embodiment, the operation for the column (column blocks column units and redundancy units) is controlled using the mutually-independent pointers mPT and rPT to the column blocks including the column units and the redundancy unit, respectively.

In the present embodiment, the control of the column of the column unit CU is performed by shifting the pointer mPT using the shift clock mCLK of a predetermined frequency, and changing over the column address MA which is selected and activated in a predetermined order. On the other hand, the control of the column of the redundancy unit RU is performed by setting the pointer rPT which is controlled independently of the pointer mPT for controlling the column unit CU, to the redundancy address RD which has replaced the defective column address CRD when the column address MA which is to be selected next time is the defective column address CRD. The flash memory of the present embodiment switches the connection between the local data buses 75 and 75R which are independently provided, respectively and the global data bus 70 connected the outside, depending on whether the selected column address is normal or defective. As a result, the data transmission can be operated a high speed operation without the date is transmitted from redundancy unit RU to column unit CU.

According to the flash memory of the present embodiment, even when a defect occurs in the latch (latching unit) 311 corresponding to the control units CU, since the data is directly transmitted between the control units RU of the column block CB and the global data bus 70, the whole flash memory (chip) is not determined to be defective.

In the flash memory of the present embodiment, the setting of the pointer mPT to the column units CU of the column block CB is performed only once at the time when the first address signal (external address signal) ADR is input to the pointer/redundancy control circuit 38, the pointer mPT of the column units CU of the column block CB sequentially shifts, synchronizing with the shift clock mCLK of a predetermined frequency, without being dependent on whether the defective column units are selected or not.

Thus, in the flash memory including a redundancy unit provided in column block of the present embodiment, the operation of setting again the pointer mPT to the column unit CU of the column block CB after the pointer rPT has been set to the redundancy unit RU in the column block CB once is not performed. Accordingly, according to the flash memory of the present embodiment, the margin of timing can be secured relatively easily and operation can also be accelerated.

In the flash memory of the present embodiment, even while the redundancy unit RU is being accessed by the defect repair process, the selection (the shift of the pointer) of the control unit is performed to the column units of the column blocks, with a predetermined cycle, independently of the control for the redundancy unit RU. Accordingly, the shift in the mapping between the input/output data and the addresses is difficult to occur in the flash memory of the present embodiment.

In the flash memory of the present embodiment, by controlling the column units CU and the redundancy unit RU in the column block CB of the memory cell array 1 and the circuits corresponding to the column units CU and the redundancy unit RU, respectively, using mutually-independent pointers mPT and rPT, a defect in the column unit CU can be repaired with a relatively simple circuit. Accordingly, according to the flash memory of the present embodiment, the scale (the occupied area) of the circuit needed for repairing the defect in the flash memory can be made small, and the area of the chip of the flash memory can be reduced.

As described above, like the first to third embodiments, the flash memory of the present embodiment can improve the operating characteristic of the flash memory.

(5) Fifth Embodiment

A semiconductor memory (for example, a flash memory) according to a fifth embodiment is described with reference to FIG. 19. In the present embodiment, the substantially same configurations as the flash memory of the first to fourth embodiments are denoted by the same reference numerals. In the flash memory of the present embodiment, description about the substantially same configurations, functions, or operations as the flash memory of the first to fourth embodiments is given as necessary.

FIG. 19 is a diagram illustrating an example of the internal configuration of the pointer/redundancy control circuit 38 included in the flash memory of the fifth embodiment.

Like the second embodiments, regarding each circuit corresponding to a redundancy unit RU of a column block CB of a memory cell array 1, a rule of selection order of column addresses may not be set depending on cases.

In the present embodiment, when the selection order of redundancy addresses RD is not specified, it is possible to set a pointer to a LCD 50R corresponding to the redundancy unit RU of the column block CB at any time. Therefore, a signal level of a set signal rSET is always maintained at a "H" level until the pointer is set to the redundancy address RD.

And when a column address MA to be selected in the column unit (column block) and a defective column address CRD match each other, a pointer rPT of the redundancy unit RU is set to the redundancy addresses RD one by one in turns.

As illustrated in FIG. 19, like the second embodiment, the flash memory including a redundancy unit included in column block of the fifth embodiment includes a circuit (pointer setting circuit) 389 which controls setting of the pointer rPT to the redundancy unit RU.

The pointer setting circuit 389 distinguishes a redundancy address RD to which the pointer rPT is first set, based on an external address signal ADR which indicates a start address in she column blocks CB. Based on the result of this distinguishing, the pointer rPT for the redundancy unit is set to a predetermined redundancy LCD 50R before the input/output of the data to the column unit CU is started.

In the present embodiment, regarding the addresses of the column block CB which are selected in a given order, the redundancy addresses RD in a given order which is determined according to the arrangement of addresses are associated with defective column addresses CRD in a given order. Thus, each redundancy address corresponding to redundancy unit which is a replacement unit is sequentially selected in one direction and connected to a data bus 70 by the shift of the pointer rPT which is performed based on the given order.

According to the flash memory of the present embodiment, when the column address selected in the column block CB is a defective column address, the defective column address CRD is replaced by the redundancy address RD (a replacement unit or a repair unit) based on the preset order, the redundancy address RD is selected.

An example provided in the flash memory of the fifth embodiment is that the order of selection of the redundancy addresses is specified, and access to the column unit CU of the column block CB of the memory cell array 1 and access to the redundancy unit RU of the column block are separately performed.

In an example described the present embodiments, illustrated in above-described FIG. 9, the column addresses MA3, MA6, MA7, and MA9 of "3", "6", "7", and "9" are defective column addresses.

In the present embodiment, for example, defective column address storing latches 641 are sorted in ascending order so as to correspond to defective column addresses. The defective column address storing latches 641 which are sorted are associated with certain redundancy addresses RD which are replacement units (repair units), respectively.

As illustrated in the FIG. 9, in the redundancy addresses RD allocated to redundancy units RU in column blocks CB, a first redundancy address RD0 is used as an object of replacement for the column address MA3 (=CRD0) of "3", a second redundancy address RD1 is used as an object of replacement for the column address MA6 (=CRD1) of "6", a third redundancy address RD2 is used as an object of replacement for the column address MA7 (=CRD2) of "7", and a fourth redundancy address RD3 is used as an object of replacement for the column address MA9 (=CRD3) of "9." One redundancy address RD corresponds to one redundancy unit RU. For example, redundancy units RU of adjacent redundancy addresses RD belong to different column blocks CB, and are controlled by different redundancy LCDs 50D.

When the redundancy unit is also provided in the column block CB, the sorting of the defective column address storing latches 641 is relatively easily performed, and the sorting for mapping between the defective column addresses and the redundancy addresses can be performed again while the user is using the flash memory.

As illustrated in FIG. 19, like the circuit illustrated in FIG. 8, the pointer/redundancy control circuit 38 includes a redundancy-side pointer setting circuit 389. Like the configuration illustrated in the FIG. 8, the redundancy-side pointer setting circuit 389 of the present embodiment includes a calculating unit 62 and a comparison circuit 63Z including comparing units 639.

Each of the comparing units 639 provided in the pointer setting circuit 389 compares an external address signal ADR indicating a start address of the operation of the flash memory and the defective column address CRD to see which one is larger.

The defective column address CRD used by the pointer setting circuit 389 is transmitted to each of the comparing units 639 from the defective column address storing latches 641.

The comparing units 639 correspond to the defective column addresses CRD (defective column address storing latches 641) in a one-on-one manner.

Like the pointer setting circuit of FIG. 8, the comparing units 639 in the pointer setting circuit 389 of FIG. 19 determine whether the external address signal ADR is larger than the defective column address CRD, and output a signal of an "L(0)" level or a signal of an "H(1)" level to the calculating unit 62.

Like the pointer setting circuit of FIG. 8, the counter 62 as the calculating unit 62 counts the number (the number of the signals of the "H" level) of comparison results in which the external address signal ADR is larger than the defective column address CRD among the comparison results obtained by the comparison between the external address signal ADR and the defective column address CRD. The counter 62 outputs a calculation result (a count number of "H") to a column-control-signal generating unit 384.

Based on the calculation result from the counter 62, the pointer setting circuit 389 outputs a control signal SRP. In order to set the pointer rPT to redundancy addresses RD corresponding to the count number of counters 62 based on the control signal SRP, the column-control-signal generating unit 384 outputs a signal of an "H" level to a predetermined redundancy LCD 50R which controls the redundancy address RD which is first selected, and maintains the signal of the "H" level in the redundancy LCD 50R.

The column-control-signal generating unit 384 makes the shift clock rCLK "H" level, for example, in order to hold the signal of the "H" level in the redundancy LCD 50R.

Based on the control signal SRP, the set signal rSET for the redundancy unit RU is changed from the "L" level to the "H" level by the column-control-signal generating unit 38 at the same timing as when the pointer rPT for the redundancy unit is set. And after the pointer rPT is set to a predetermined redundancy address RD, the set signal rSET changes to the "L" level.

Operation of the flash memory of the fifth embodiment is described. Herein, operation of the flash memory of the fifth embodiment is described using the timing chart of FIG. 10. In addition, the operation of the flash memory of the present embodiment is the similar to the operation of the flash memory of the second embodiment.

The present embodiment, like the second embodiment, describes an example in which a column address MA5 indicating "5" for the column unit CU is input to the column control circuit 3 as the external address signal ADR.

The mapping relation between the redundancy addresses RD and the defective column addresses CRD is sorted (decided) beforehand, for example, as illustrated in above-described FIG. 9, and the defective column addresses CRD0, CRD1, CRD2, . . . are associated with the redundancy addresses RD0, RD1, RD2, . . . , respectively, in ascending order of the column addresses MA.

The external address signal (start address) ADR which indicates the column address MA5 of "5" in the column units CU is input to the pointer/redundancy control circuit 38.

Figure 10:
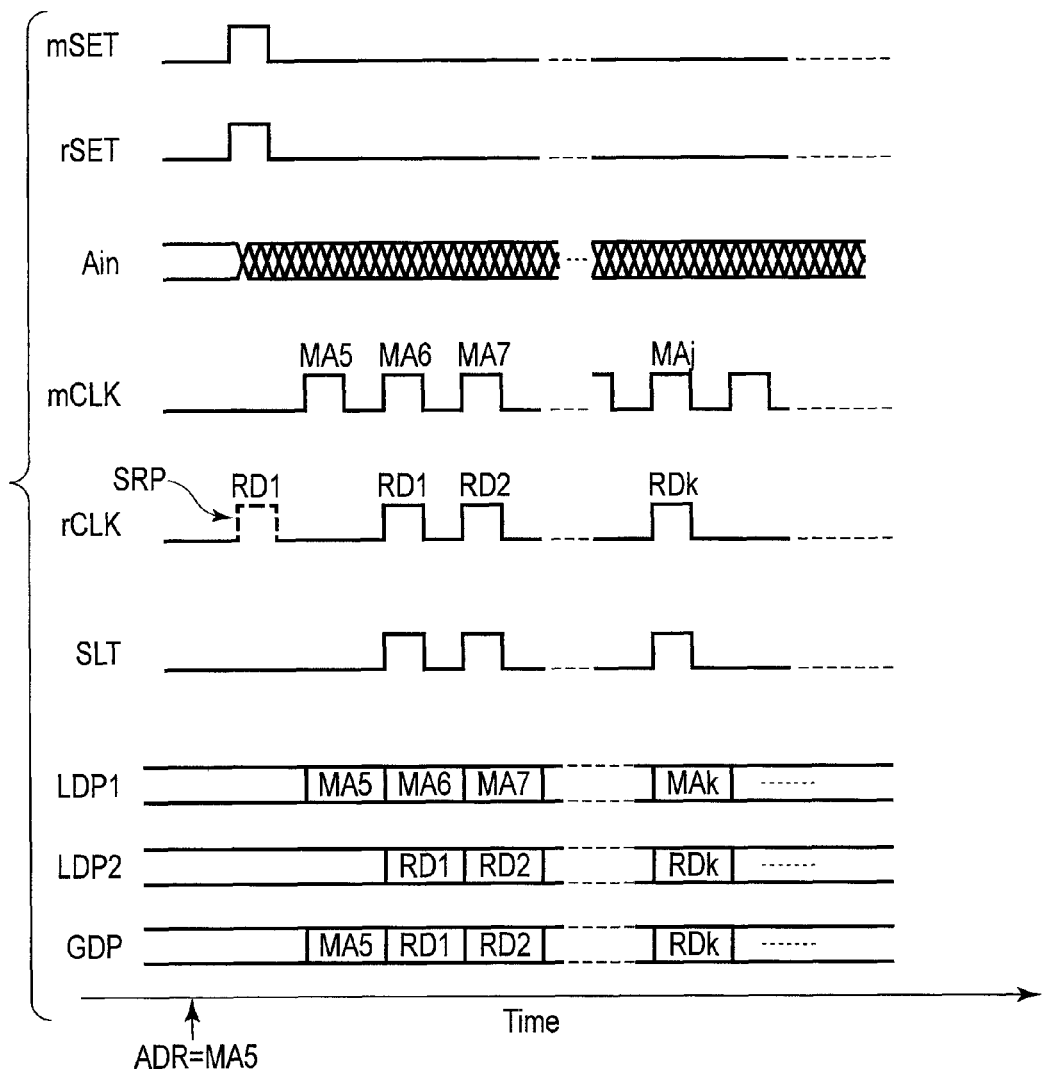
FIG. 10 is a timing chart illustrating an example of operation of the semiconductor memory according to the second embodiment.

As described in the second embodiment using FIGS. 8 through 10, the external address signal ADR of "5" is input to the replacement determination circuit 382 as the internal address signal (column address) Ain, and to the comparison circuit 63Z of the pointer setting circuit 389. And the order relationship of the external address signal ADR of "5" and the defective column addresses CRD0, CRD1, CRD2 and CRD3 is examined by each of the comparing units 639, respectively.

As described in the second embodiment, when comparing the external address ADR of "5" with the defective column address CRD0 (column address MA3) of "3", "5" which is the value of the address signal ADR is larger than "3" which is the value of the defective column address CRD0. Accordingly, in the comparing unit 639 corresponding to the defective column address CRD0 of "3", the relation "ADR>CRD" is obtained. In this case, the comparing unit 639 corresponding to the latch 641 which stores the defective column address CRD smaller than the external address signal ADR outputs the comparison result of the "H(1)."

And also, when comparing the external address ADR of "5" with the defective column address CRD1 of "6" (the column address MA6 of "6") as the defective column address CRD1, "5" which is the value of the address signal ADR is smaller than "6" which is the value of the defective column address CRD1. Accordingly, in the comparing unit 639 corresponding to the defective column address CRD1, the relation "ADR>CRD" is not obtained. In this case, the comparing unit 639 corresponding to the latch 641 which stores the defective column address CRD larger than the external address signal ADR outputs the comparison result of the "L(0)."

When comparing the external address signal ADR with each of "7" and "9" as the defective column addresses CRD2 and CRD3, the relation "Ain>CRD" is not obtained, each of the comparing units 639 output the comparison result "L(0)".

The comparison result between the external address signal ADR and each defective column address CRD is output to the counter 62, and the counter 62 counts the number of the signals of the "H(1)" level among comparison results.

Based on the above-described comparison results between the external address signal ADR and each defective column address CRD, the output of the counter 62 is set to 1.

The value of "1(0001)" as the output of the counter 62 is associated with the second redundancy address RD1 among redundancy addresses RD.

Accordingly, in order to set the pointer rPT to the redundancy unit (redundancy address), the redundancy-side set signal rSET changes from the "L" level to the "H" level, based on the control signal SRP.

In order to set the pointer rPT to the second redundancy address RD1 based on the control signal SRP, the signal of the "H" level is output, and the signal of the "H" level is held in a register 501R of the redundancy LCD 50R corresponding to the second redundancy address RD1.

After the pointer rPT for the redundancy unit is set to a predetermined redundancy address RD, the redundancy-side set signal rSET changes from the "H" level to be set to the "L" level.

By the substantially same operation as the operation described in the first to fourth embodiments, in the replacement determination circuit 382, the external address signal ADR is compared with each of the defective column addresses CRD0, CRD1, CRD2, and CRD3 by each of the comparing unit 631Z substantially at the same time as the operation of the pointer setting circuit 389.

With respect to the external address signal ADR, the determining unit 65 of the replacement determination circuit 382 determines that the column unit CU of column block CB corresponding to the column address MA of "5" is a column address which does not contain a defect. In the column block CB, the pointer mPT is set to the column block CB and the column unit CU corresponding to the address MA5.

Based on the determination result of the external address signal ADR and the defective column address CRD, the selector 69 connects the local data bus 75 to a global data bus 70.

On the other hand, the local data bus 75R for redundancy unit is electrically disconnected from the global data bus 70 by the selector 69. Therefore, though the pointer rPT is beforehand set to the redundancy unit RU, the redundancy unit RU to which the pointer rPT has been set does not have a negative influence on the access to the normal column unit CU corresponding to the start address ADR.

After the input or output of the data of the column unit CU corresponding to the start address ADR ("5") is completed, the pointer mPT which has been set to the column block sequentially shifts among the LCDs 50 in the main column decoder 350, synchronizing with the shift clock mCLK of a predetermined frequency.

The replacement determination circuit 382 sequentially performs the comparison between the incremented column address Ain and the defective column address CRD.

When the column address MA6 corresponding to "6" becomes an object of operation, since the column address MA6 of "6" is the defective column address CRD1, by "1" which indicates the replacement process, the shift clock rCLK changes to the "H" level, and the access to the redundancy unit RU is performed.

The redundancy unit RU of the redundancy address RD1 associated with the column address (the defective column address) of "6" is electrically connected to the global data bus 70 by the selector 69, in a substantially similar manner to the operation described in the first to fourth embodiment. Subsequently, the direct transmission of the data DT is performed between the redundancy unit RU and the global data bus 70.

After the input or output of the data to the redundancy unit RU which has replaced the column address of "6" is completed, the shift clock rCLK changes to the "L" level from the "H" level.

As illustrated in FIGS. 9 and 10, in the column blocks CB, when the column unit CU corresponding to the column address MA7 of "7" is defective, two redundancy units are consecutive accessing targets.

Based on the determination result by the replacement determination circuit 382, the pointer rPT shifts between adjacent redundancy LCDs 50R, synchronizing with the shift clock rCLK changed to the "H" level.

As described above, since the selection order of the redundancy addresses RD is set beforehand, the pointer rPT of the redundancy unit RU is shifted to the adjacent redundancy address RD with only use of the shift clock rCLK.

Similarly to the above-described operation, the redundancy unit RU which has replaced the defective column unit of the column address MA7 of "7" is accessed, and the input or output of the data DT to the redundancy unit RU is performed.

Subsequently, similarly to the operation described in the first to fourth embodiments, either the column unit CU or the redundancy unit RU is electrically, directly connected to the global data bus 70 via the selector 69, based on the comparison result between the internal address signal (incremented column address) Ain and the defective column address CRD.

In the flash memory including a column block having the column units and the redundancy unit, even though the start address is the defective column address CRD, the pointer rPT can be set to the redundancy address by the replacement determination circuit 382 and the pointer setting circuit 389 included in the flash memory of the present embodiment so that the defective column address CRD can be replaced by the redundancy address RD.

As described above, in the present embodiment, the defective column addresses CRD and the redundancy addresses RD are sorted, and the selection order of the redundancy addresses RD is specified according to the arrangement of the defective column addresses CRD. By comparing an address (for example, an address which is first selected according to a certain operation sequence) ADR which is selected now with the defective column address CRD in a state in which the selection order of the redundancy addresses RD is specified, before the redundancy address RD to be a first accessing target is activated by the replacement process, the pointer rPT can be set to the redundancy address RD beforehand.

By means of the above, the flash memory of the present embodiment can perform control of the pointer rPT for the redundancy unit RU in a similar manner to the control of the pointer mPT for the column unit CU by the shift of the pointer rPT synchronized with the clock rCLK, and can access the redundancy address RD to which the shifted pointer rPT is set.

Therefore, according to the semiconductor memory of the fifth embodiment and the control method thereof, the same effect as in the first to fourth embodiments can be acquired, and the operating characteristic of the semiconductor memory may be improved.

(6) Sixth Embodiment

A semiconductor memory (for example, a flash memory) according to a sixth embodiment is described with reference to FIG. 20. In the present embodiment, the substantially same configurations as the flash memory of the first to fifth embodiments are denoted by the same reference numerals. In the flash memory of the present embodiment, description about the substantially same configurations, functions, or operations as the flash memory of the first to fifth embodiments is given as necessary.

Figure 20:
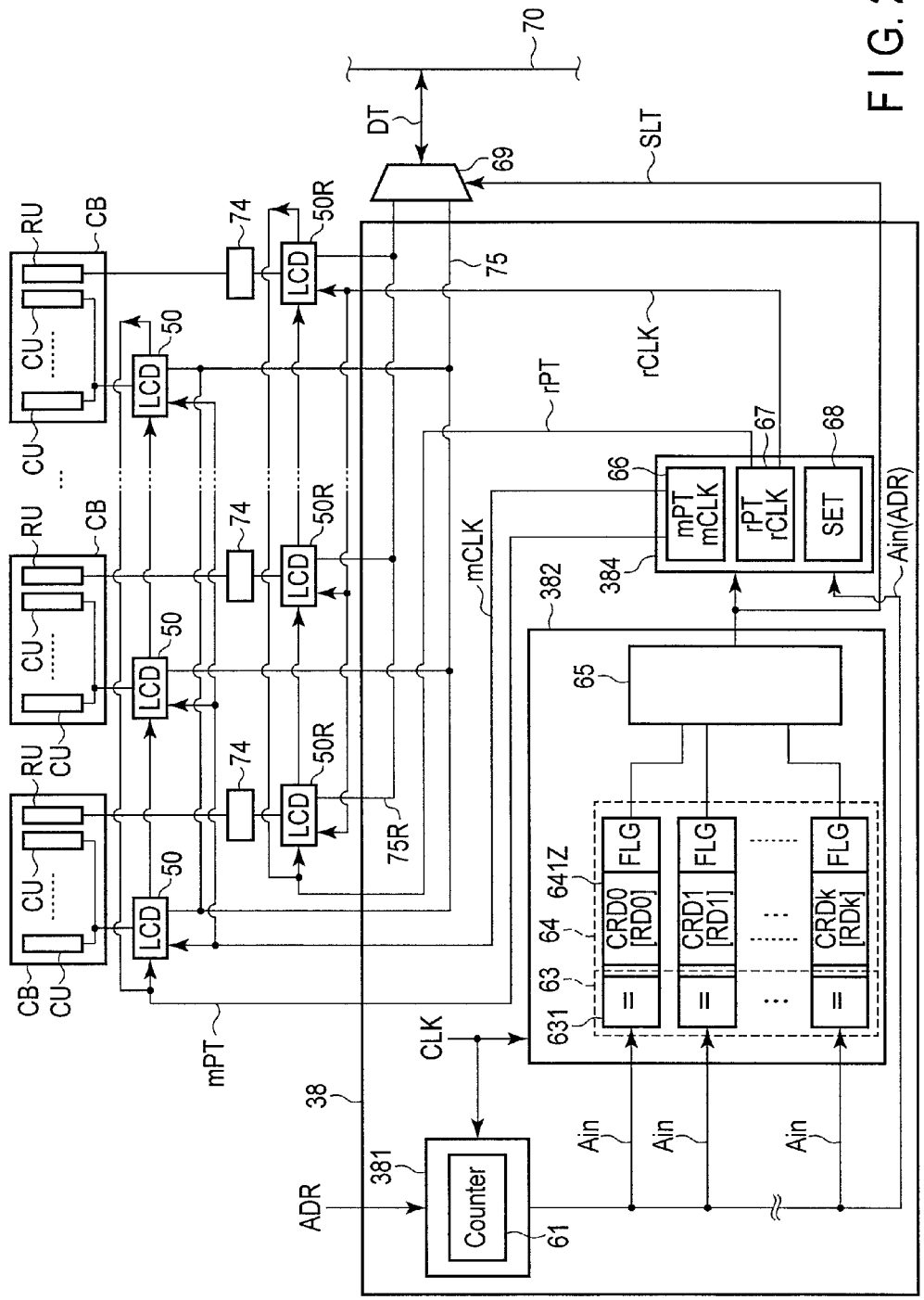
FIG. 20 is a schematic diagram illustrating an example of a configuration of a semiconductor memory according to a sixth embodiment.

FIG. 20 is a schematic diagram illustrating the internal configuration of a pointer/redundancy control circuit of the flash memory of the sixth embodiment.

The redundancy unit RU in the column block CB is likely to include a defective cell, a defective bit line, a defective sensing unit 301, or a defective latching unit 319.

As illustrated in FIG. 20, in the flash memory of the present embodiment, flag data FLG which indicates a redundancy address allocated a redundancy unit RU in a column block CB being normal or defective is added to a defective column address storing latch 641 associated with the redundancy address RD. For example, the flag data (defect redundancy information) indicating being-normal or being-defective of the redundancy address RD may not be notified to an external device, such as a memory controller 120 or a host device 120.

With use of the flag data FLG, the flash memory of the present embodiment can replace a column unit CU with a redundancy RU by using mutually-independent pointers mPT and rPT, respectively, even in a case where the redundancy units RU in the column block CB include a redundancy address RD of a defect.

Like the third embodiment, in FIG. 12, the flash memory of the present embodiment is described with an example in which a second redundancy address RD1 in the redundancy units is defective. FIG. 12 illustrates an example in which column addresses MA3, MA7, and MA9 of "3", "7", and "9" are defective column addresses CRD0, CRD1, and CRD2 in the column units CU in the column blocks CB.

For example, when the redundancy unit RU is provided in the column block CB, a first redundancy address RD0 is associated with the column address MA3 of "3"(CRD0), a third redundancy address RD2 is associated with the column address MA7 of "7"(CRD1), and a fourth redundancy address RD3 is associated with the column address MA9 of "9" (CRD2). With this configuration, the defective column addresses CRD in the column units CU of column blocks CB are replaced by normal redundancy addresses RD.

A dummy address DA is stored in a defective column address storing latch 641Z associated with the defective redundancy address RD. For example, as described in the third embodiment, supposing that the column addresses MA corresponding to the redundancy addresses RD which are ahead of and behind the defective redundancy address RD are "Mn" and "Mm" (Mn and Mm are integers equal to or greater than 0, and Mm is a value two or more larger than "2"), the order relation "Mn<the dummy address DA<Mm" is established.

As illustrated in FIGS. 12 and 20, in the flash memory of the present embodiment, the flag data FLG of 1 bit or more is added to the defective column address storing latch 641 corresponding to each of the redundancy addresses RD. Each of the defective column address storing latches 641Z stores the flag data FLG as defective redundancy information of the redundancy unit RU in the column block CB, in company with the defective column address CRD of the column unit CU in the column block CB.

As described above, in the present embodiment, the flag data FLG of "0" is stored in the defective column address storing latches 6412 associated with the redundancy addresses (herein, redundancy address RD0, RD2, RD3) which do not include a defect. The flag data FLG of "1" is stored in the defective column address storing latches 641Z associated with the defective redundancy addresses (herein, a redundancy address RD1).

Like the third embodiments, besides based on the comparison result obtained by comparing an internal address signal (column address) Ain and the defective column address CRD, the connection relation between the redundancy unit RU corresponding to the redundancy address RA and a data bus 70 is controlled based on the flag data FLG of "0" or "1."

By the replacement determination circuit 382 in illustrated in FIG. 13, the operation of the redundancy unit RU provided in the column block CB can be controlled using the flag data FLG.

As described above, for example, by replacement determination circuit 382, control is made such that a defective redundancy unit is not connected to a data bus 70 by an AND operation (logical sum) of the output (a comparison result of an address) of the comparing unit 631 and the flag data FLG.

As described above, determining unit 65 of FIG. 13 includes a defective redundancy address determining unit 659.

The flag data FLG of "0" indicates that the redundancy address RA corresponding to the defective column address storing latch 641Z and provided in the column block CB is normal.

When all the outputs of the AND gates 649 are "0", the column-control-signal generating unit 384 and the selector 69 drive based on the output signal (determination signal) of the calculating unit 651. The defective redundancy address determining unit 659 does not output a signal which drives and controls the column-control-signal generating unit 384 and the selector 69.

The flag data FLG of "1" indicates that the redundancy unit provided in the column block CB corresponding to the defective column address storing latch 641Z which holds the flag data FLG of "1" is defective.

Like the third embodiments, when the defective redundancy address determining unit 659 detects the signal of "1" from the AND gate 649, the defective redundancy address determining unit 659 controls operation of the selector 69 so that the defective redundancy address may not be accessed based on the signal of "1" of the comparing unit 631.

When the defective redundancy address determining unit 659 detects the signal of "1" from the AND gate 649, as a normal column address MA is used as the dummy address DA, the accessing target is a column address of the column unit CU in the column block CB. The selector 69 connects the local data bus 75 for the column unit CU to the global data bus 70 based on the control signal supplied from the defective redundancy address determining unit 659.

Accordingly, even when it is determined to be the object of the replacement process based on the dummy address DA, the column unit CU of the column block CB is connected to the global data bus 70 by the controlling of the operation of the selector 69, based on the output signal of "1" from the AND gate 649 and the control signal of the defective redundancy address determining unit 659.

Thus, in a state where the pointer rPT is set to the defective redundancy address RD in the column block CB, even though the output of the calculating unit (the OR gate) 651 is set to "1" which indicates the replacement process being performed, the defective redundancy address RD is not connected to the global data bus 70, and data DT is transmitted between the normal column unit (column address) corresponding to the dummy address DA of the column unit CU and the global data bus 70.

As described in the third embodiment, in a case where the internal address signal Ain and the dummy address DA match, the signal of "1" from the AND gate 649 is output, the redundancy address RD associated with the defective column address storing latch 641 in which the dummy address DA is stored is not accessed and is skipped.

On the other hand, since the flag data FLG is set to "0" for the normal redundancy address RD, the AND operation of the output (the comparison result of addresses Ain and CRD) of the comparing unit 631 and the flag data FLG does not yield "1."

As described above, the defective redundancy address RD (the defective redundancy unit) in the column block CB is controlled using the flag data FLG so as not to be accessed.

For the dummy address DA stored in the defective column address storing latch 641 corresponding to the defective redundancy address RD, when a k-th redundancy address RDk is defective, a column address, obtained by subtracting 1 from the defective column address CRD stored in the defective column address storing latch associated with a (k+1)-th redundancy address RDk+1, is stored, as the dummy address DA, in the defective column address storing latch associated with the k-th redundancy address RDk.

Herein, like the third embodiment, the example illustrated in FIG. 12, when the column address MA6 of "6" as the dummy address DA is used and the normal column address of "6" as the internal column address Ain is input to each of the comparing units 631, the comparing unit 631 corresponding to dummy address DA of "6" outputs "1." And the calculation result of the AND gate 649 corresponding to the latch 641Z in which the dummy address DA is stored becomes "1" by the flag data FLG of "1" and the output "1" of the comparing unit 641.

The column address corresponding to the dummy address DA becomes the accessing target, the selector 69 is controlled based on the signal from the determining unit 65 such that based on the output of "1" from the AND gate 649, the local data bus 75 is connected to the global data bus 70 but the local data bus 75R is not connected to the global data bus 70. In this way, the normal column unit CU corresponding to the column address MA6 treated as the dummy address DA is connected to the global data bus 70.

On the other hand, although the pointer rPT is set to the defective redundancy unit RU provided in the column block CB corresponding to the defective redundancy address RD, the defective redundancy unit RU is not connected to the global data bus 75 by the selector 69.

In this way, when the internal address signal Ain matches the dummy address DA associated with the defective redundancy address, the normal column unit CU indicated by the dummy address DA is accessed, and the defective redundancy unit RU indicated by the redundancy address RD associated with the dummy address DA is skipped.

When the column address Ain with a different value from that of the dummy address DA is input to each of the comparing units 631, the operation result of each of the AND gates 649 becomes "0." Accordingly, like the operation described above, based on the comparison result of the defective column address CRD and the internal address signal Ain, either the column unit CU or the redundancy unit RU is connected to the global data bus 70.

As described in the third embodiment, when consecutive redundancy addresses RD is defective, values obtained by subtracting 1 from each of addresses (defective column addresses) in the defective column address storing latches 641Z associated with the normal redundancy addresses RD which are adjacent to the defective redundancy address are stored in the defective column address storing latches 641 associated with the consecutive defective redundancy addresses RD as the dummy addresses DA of the consecutive values, respectively.

Described above, when the dummy address DA is smaller than the column address MA of "0" by performing the subtraction process on the defective column address CRD, the flag data FLG indicating the defective redundancy address RD is expressed in 2 bits, for example, in the defective column address storing latch 641Z in which the dummy address DA smaller than the column address MA0 of "0" is stored, an upper order of 1 bit of the flag data FLG may be set to "1".

For example, there is a case where among a plurality of consecutive redundancy addresses RDk−1, RDk, and RDk+1, the redundancy address RDk is defective and redundancy addresses RDk−1 and RDk+1 which are prior or subsequent to the defective redundancy address is normal.

In this case, like the above-described example using FIG. 14 in the third embodiment, the normal redundancy addresses RD may not be used to improve control efficiency of the pointers mPT and rPT at the defective column address CRD and the redundancy address RD in the column block CB including the column units and redundancy unit, depending on the position of the defective redundancy address.

For example, the flag data FLG of "1" and the dummy address with a different value from the defective redundancy address RD1 are stored in the defective column address storing latch 641Z corresponding to the unused first redundancy address RD0 (RDk−1). Supposing that the column address MA corresponding to the redundancy address RD2 (RDk+1) subsequent to the defective redundancy address RD1 is "Mz" (z is an integer equal to or greater than 0, and z is a value two or more than "2"), any one address among the addresses ahead of the column address MA corresponding to the redundancy addresses RD2 is used as the dummy address DA1 of the defective redundancy address RD1 so that the order relation "the dummy address DA0<the dummy address DA1<Mz" is obtained.

Thus, when the redundancy unit in the column block includes a defect, the efficiency of control of the pointer rPT for the redundancy unit can be increased.

When "Mz" is smaller than 2, as described above, the flag data FLG illustrating the defective redundancy address RD may be expressed in 2 bits.

As described in the present embodiment, even when a defect exists in circuits corresponding to the redundancy unit RU in the column block CB, it is possible to except the defective redundancy address from the objects of operation, using the flag data FLG indicating the redundancy address RD being defective. Thereby, it is possible to replace the defective column address CRD of the column block CB with the redundancy address RD without impairing the operation speed of the flash memory.

It is also possible to control the columns of the column block including the column unit and redundancy unit with a combination of the flash memory of the present embodiment and the flash memory of the fifth embodiment.

Therefore, according to the semiconductor memory of the sixth embodiment and the controlling method thereof, the same effect as in the first to fifth embodiments is acquired, and the operating characteristic of the semiconductor memory can be improved.

(7) Seventh Embodiment

A semiconductor memory (for example, a flash memory) according to a seventh embodiment is described with reference to FIG. 21. In the present embodiment, the substantially same configurations as the flash memory of the first to sixth embodiments are denoted by the same reference numerals. In the flash memory of the present embodiment, description about the substantially same configurations, functions, or operations as the flash memory of the first embodiment is given as necessary.

FIG. 21 is a schematic diagram illustrating the internal configuration of the flash memory of the seventh embodiment.

The flash memory of the seventh embodiment differs from the forth embodiment in that the latch circuit 74 is connected to a comparison circuit 81 and in that a latch circuit 9 is connected in common to one ends of column unit selection switches 319 in the column units CU and one end of column unit selection switch 319 in the redundancy unit RU.

As illustrated in FIG. 21, the latch circuit 74 is connected in common to one ends of column unit selection switches 319 in the column units CU and one end of column unit selection switch 319 in the redundancy unit RU in the same column block CB. Thus, the data of the column units CU can be supplied to the latch circuit 74.

The comparison circuit 81 illustrated in FIG. 21 has a register 82 holding a predetermined data. The comparison circuit 81 is electrically connected to the latch circuit 74. The comparison circuit 81 compares the data of the latch circuit 74 with the data of the register 82. When the data of the latch circuit 74 matches the data of the register 82, the comparison circuit 81 outputs a given control signal to the internal control circuit 8.

A description is given with a specific example below.

For example, any one of the column units CU includes a region (hereinafter, referred to as a flag data region) storing a flag data. When the flog data is read from the flag data region, the flag data can be temporarily stored in the latch circuit 74 via the column unit selection switch 319.

The comparison circuit 81 compares whether the flag data matches the data stored in the register 82 or not, and the comparison circuit 81 outputs the given control signal to the internal control circuit 8 when the flag data matches the data stored in the register 82.

A description is given with an example in which a first flag holding a data of "1" is used when the number of a writing/erasing operation exceeds a predetermined number of times. The comparison circuit 81 can detect the data of first flag so as to determine whether the flag data is a data of "1" or not, without reading the flag data via the selector 69.

As a result, when the number of a writing/erasing operation exceeds a predetermined number of times, the internal control circuit 8 can change a control of the flash memory at high speed.

[Others]

Although the flash memory has been described as the semiconductor memory in the present embodiment, the present embodiment may be also applicable to memories such as MRAM (Magnetoresistive RAM), ReRAM (Resistive RAM), and PCRAM (Phase Change RAM) as long as the control method of the column of the memory cell array is substantially identical.

Although the NAND flash memory has been described as the semiconductor memory in the present embodiment, the present embodiment may be a memory in which a memory cell array 1 has cells of a three dimensional structure.

Figure 23:
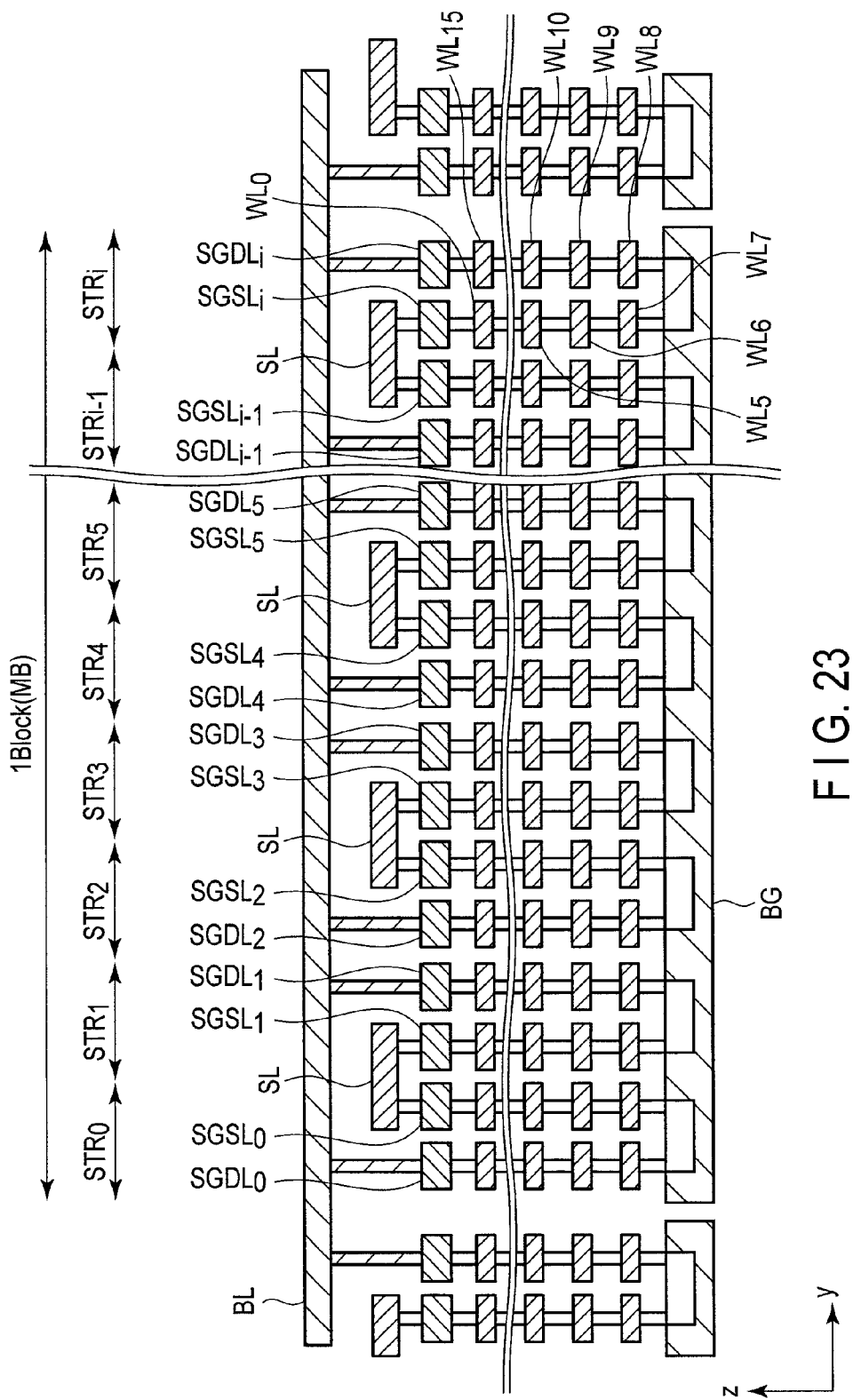
FIG. 23 is a sectional view illustrating the structure of modification of the embodiment.

The configuration of memory cell array 1 is described, with reference to FIGS. 22 to 24. FIG. 22 is perspective view illustrating a portion of the memory cell array of the modification. FIG. 23 is a cross sectional view illustrating a portion of the memory cell array of the modification. FIG. 24 is a cross sectional view illustrating a memory cell in the memory cell array of the modification. In FIG. 22, a description is given with an example in perspective view of a memory block having two string units. FIG. 23 shows a sectional structure along a y-z plane of FIG. 22.

As illustrated in FIGS. 22 and 23, a back gate BG made of a conductive material is formed above a substrate sub. The back gate BG extends along an x-y plane. A plurality of the string units SU is formed above the substrate sub. A plurality of strings $STR_0$ to $STR_i$ is formed in the string unit SU.

Specifically, the string unit SU is formed by strings $STR_0$ to $STR_i$ arranged in a direction (x direction of FIG. 22) perpendicular to a direction in which the bit line BL extends. One block includes i pieces of string units. "i" is a natural number. A string unit including string $STR_0$ is referred to as a string unit SU0. Similarly, a string unit including a string $STR_Y$ is referred to as a string unit SUY (Y=1 to i).

For convenience of illustration, in FIG. 22, the two string units SU0 and SU1 are only shown. Hereinafter, when not distinguishing a specific memory cell from among strings STr0 to $STR_i$, the string is denoted as a string STR.

In FIG. 22, one string STR includes n pieces of memory cell transistors. "n" is a natural number. FIGS. 22 and 23 show an example in which one string includes 16 memory cell transistors $MTr_0$ to $MTr_{15}$.

The cell transistor $MTr_7$ is connected to the cell transistor $MTr_8$ via a back gate transistor BTr. Each of first ends of source side and drain side select gate transistors SSTr and SDTr is connected to the cell transistor $MTr_0$ and $MTr_{15}$, respectively. The source line SL and the bit line BL extend above the transistors SSTr and SDTr, respectively. A second end of the transistors SSTr is connected to the source line SL and a second end of the transistor SDTr is connected to the bit line BL.

The sell transistors $MTr_0$ to $MTr_{15}$ include a semiconductor pillar SP and an insulating film IN2 on a surface of the semiconductor pillar SP (refer to FIG. 24). The semiconductor pillar SP, for example, is made of silicon above the back gate BG. Two semiconductor pillars SP forming of one string STR are connected to a pipe layer made of a conductive material in the back gate. The pipe layer forms the back gate transistor BTr. As illustrated in FIG. 24, the insulating film IN2 includes a tunneling insulating film IN2c on the semiconductor pillar SP, a charge trapping layer IN2b on the insulating film IN2c and a block insulating film IN2a on the charge trap layer IN2b. The charge trapping layer IN2b is made of an insulating material.

As illustrated in FIGS. 22 and 23, the cell transistors $MTr_0$ to $MTr_{15}$ include word lines (control gates) extending along the x direction, respectively. The word lines $WL_0$ to $WL_{15}$ are selectively connected to CG lines CG (CG lines $CG_0$ to $CG_{15}$) corresponding to word lines $WL_0$ to $WL_{15}$ by the row control circuit (row decoder) 2. The CG lines are not shown in FIGS.

22 and 23. The cell transistor MTr stores data determining based on the number of carriers in the charge trapping layer IN2$b$ in non-volatile manner.

Gate electrodes (gates) of each of the cell transistor $MTr_0$ of the strings $STR_0$ arranged along an x axis in each of blocks MB are connected in common to the word line $WL_0$. In the same way, each of gate electrodes of each of the cell transistor $MTr_X$ of the strings $STR_X$ arranged along an x axis in each of blocks MB are connected in common to the word line $WL_X$. "X" is 0 or a natural number less than or equal to n. Other strings STR have the same connection relation. That is, each of gate electrodes of each of the cell transistors $MTr_Y$ of the strings $STR_Y$ arranged along an x axis in each block MB is connected in common to the word line $WL_Y$. "Y" is 0 or natural number less than or equal to i. The word line $WL_0$, furthermore, is shared by all strings STR in one block MB. Each of the word lines $WL_1$ to $WL_7$ is also shared by all strings in the blocks MB.

A plurality of the strings STR arranged along a y axis in each of the blocks MB is connected in common to the bit line BL. The all sell transistors $MTr_0$ in the block MB are connected in common to the word line $WL_0$. In the same way, the all cell transistors $MTr_Z$ in the block MB are connected in common to the word line $WL_Z$. "Z" is 0 or natural number less than or equal to i. Therefore, each of word line WL is formed in shape of comb-teeth.

The word line WL has a first portion provided in cell region (RM) and a second portion provided in two leading regions (RDD and RDS). The two leading regions (RDD and RDS) are provided so as to face each other. The cell region (RM) is provided between the two leading regions (RDD and RDS).

In each of word lines WL, a plurality of the first portions extends from the second portion in the x direction, thereby, the word line having the comb-teeth shape is formed.

Any of strings in the block MB are applied a same bias during an erase operation. Thus, the block is an erase unit. Each of gate of the back gate transistors are connected in common to the back gate line BG.

A page is formed by memory cell transistors MTr included in the common string unit SU among the cell transistors MTr sharing the word line WL and its memory space. 1-page, for example, has a size of 8K bite. When each of the cell transistor MTr, for example, store 2 bits of data, a data stored in the memory cell transistors MTr included in the common string unit SU among the cell transistors MTr sharing the word line WL is a data size of two pages.

The select gate transistors SSTr and SDTr include the semiconductor pillar SP, a gate insulating film (not shown) on a surface of the semiconductor pillar SP, and a gate (select gate line) SGSL and SGDL, respectively.

Gates of each of the source side select gate transistors SSTr of the strings $STR_0$ arranged along the x axis in each of the blocks MB are connected in common to a source side select gate line $SGSL_0$. In the same way, each of gates of each of the source side select gate transistors SSTr of the strings $STR_Y$ arranged along the x axis in each of the blocks MB is connected in common to a source side select gate line $SGSL_Y$. The select gate lines SGSL extend along the x axis. The select gate lines SGSL are selectively connected to SGS line (not shown) by the row control circuit (row decoder). First ends of each of transistors SSTr in two adjacent strings STR are same source line SL. The source lines in one block are connected to each other.

Gates of each of the drain side select gate transistors SDTr of the strings $STR_0$ arranged along the x axis in each of the blocks MB is connected in common to a drain side select gate line $SGDL_0$. In the same way, each of a gate of each of the drain side select gate transistors SDTr of the strings $STR_Y$ arranged along the x axis in each of the blocks MB is connected in common to a drain side select gate line $SGSL_Y$. The select gate lines SGDL extend along the x axis. First ends of each of the transistor SDTr of the all string STR provided in one block and arranged along the y axis are connected to same bit line BL.

As described above, a plurality of the strings $STR_Y$ arranged along the x axis in each of the block MB (the strings connected to a different bit line BL each other) shares the select gate lines SGSL and SGDL and word lines $WL_0$ to $WL_{15}$.

A flash memory of the present embodiment can include the following embodiment.

(Additional Statement 1)

A semiconductor memory includes a memory cell array having a plurality of column blocks including a plurality of column units allocated to column and a redundancy unit allocated to the column; a column control circuit that sequentially selects the column blocks using a first pointer corresponding to an address signal externally supplied, and selects the redundancy unit using a second pointer when defect address information of the column unit matches the address signal so that data of the column unit corresponding to the defect address information is replaced with data of the redundancy unit based on the defect address information; and a selection circuit that selects either one of the data of the column unit and the data of the redundancy unit and that outputs the selected data, based on a comparison result between the address signal and the defect address information.

(Additional Statement 2)

The semiconductor memory of the additional statement 1 further includes a latch circuit connected to one end of a first selection switch, the redundancy unit has first sense amplifier circuits, first data latching circuits and the first selection switch, the first sense amplifier circuits and the first data latching circuits are connected in common to the other end of the first selection switch via a first data bus.

(Additional Statement 3)

The semiconductor memory of the additional statement 2, wherein the column unit has second sense amplifier circuits, second data latching circuits and second selection switches, the second sense amplifier circuits are connected in common to the second data latching circuit via second data bus, the second sense amplifier circuits and the second data latching circuit are connected in common to the second selection switches corresponding to the second sense amplifier circuit and the second data latching circuits via a third data bus.

(Additional Statement 4)

The semiconductor memory of the additional statement 3 further includes a control circuit for controlling the operation of the semiconductor memory, the latch circuit is connected to a comparison circuit, the comparison circuit compares a first data with the second data which is held in the latch circuit and outputs a first signal to the control circuit, the control circuit controls the operation of the semiconductor memory based on the first signal. The first data may be any data as long as the first data is a data for changing the operation of the semiconductor memory.

(Additional Statement 5)

A method of controlling a semiconductor memory, includes: inputting a command signal which commands a data transmission to a memory cell array including a main region and a redundancy region, and an address signal that indicates an object of the data transmission in the memory cell array, the main region and the redundancy region including a plurality of memory cells arranged along a row direction and a column direction, the main region including a plurality of first control units assigned to a column of the main region, the redundancy region including a plurality of second control units assigned to a column of the redundancy region; generating a first pointer corresponding to the address signal and sequentially selecting the plurality of first control units; selecting the second control unit using a second pointer different from the first pointer such that one of the first control units corresponding to defect address information is replaced by one of the second control units, when the defect address information of the main region and the address signal match each other; and connecting either a first data path connected to the main region or a second data path connected to the redundancy region to a third data path which connects the memory cell array and outside of the memory cell array to each other, based on a comparison result between the address signal and the defect address information, and performing the data transmission to the memory cell array.

(Additional Statement 6)

The method of controlling a semiconductor memory of additional statement 5, wherein based on the address signal corresponding to the first control unit which is first selected in the main region, before the first control unit associated with the second control unit which is first selected in the redundancy region is selected, the second pointer is set.

(Additional Statement 7)

The method of controlling a semiconductor memory of additional statement 5, wherein when the second control units include one or more of the second control units which are defective, the defective second control unit is skipped.

(Additional Statement 8)

The method of controlling a semiconductor memory of additional statement 5, wherein the first pointer selects the first control unit using a clock signal, without being dependent on operation of the second pointer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
a memory cell array including a main region and a redundancy region, the main region and the redundancy region including a plurality of memory cells arranged along a row direction and a column direction;
a plurality of first control units configured to assign to a column of the main region;
a plurality of second control units configured to assign to a column of the redundancy region;
a column control circuit configured to sequentially select the first control units by using a first pointer corresponding to an address signal, and select the second control unit by using a second pointer when defect address information of the main region matches the address signal so that one of the first control units corresponding to the defect address information is replaced with one of the second control units; and
a selection circuit configured to connect either one of a first data bus provided for the main region and a second data bus provided for the redundancy region to a third data bus provided for data transmission between the memory cell array and an outside of the memory cell array, based on a comparison result between the address signal and the defect address information.

2. The semiconductor memory according to claim 1, wherein
the second control units are associated with the first control units such that a selection order of the second control units corresponds to a selection order of the first control units which are defective, and
the second control units are sequentially selected one by one in one direction.

3. The semiconductor memory according to claim 2, wherein
based on the address signal corresponding to the first control unit which is first selected in the main region, before the first control unit associated with the second control unit which is first selected in the redundancy region is selected, the second pointer is set to the second control unit which is first selected.

4. The semiconductor memory according to claim 3, wherein
when the second control units include one or more of the second control units which are defective, the defective second control unit is skipped.

5. The semiconductor memory according to claim 1, wherein
the first pointer selects the first control unit using a clock signal, without being dependent on operation of the second pointer.

6. The semiconductor memory according to claim 1, wherein
when the second control unit is selected, data transmission to the memory cell array is performed between the second control unit selected and the third data bus via a selection circuit.

7. The semiconductor memory according to claim 6, wherein
when the second control unit is selected, at a time of the data transmission between the selected second control unit and the third data bus, the first control unit is electrically connected to the first data bus, and electrically disconnected from the third data bus.

8. The semiconductor memory according to claim 1, wherein
a dummy address and flag data indicating an unused state are associated with the second control unit which is unused, and the second control unit which is not in use is electrically disconnected from the third data bus, based on the flag data and a comparison result obtained by comparing the address signal and the defect address information.

9. The semiconductor memory according to claim 1, wherein
the column control circuit includes a plurality of first local column decoders configured to correspond to the first control units, respectively, and a plurality of second local column decoders configured to correspond to the second control units, respectively,
the first control signal including a clock signal of a predetermined frequency is input to each of the first local column decoders, and
the second control signal is input to each of the second local column decoders, in which a signal level of the second control signal changes when the address signal matches the defect address information.

10. The semiconductor memory according to claim 9, wherein
the column control circuit includes a first shift register configured to range over the first local column decoders and a second shift register configured to range over the second local column decoders, and
the first pointer moves within the first shift register for every local column decoder, synchronizing with the first control signal, and the first control unit corresponding to the first local column decoder to which the first pointer is set is activated.

11. The semiconductor memory according to claim 10, wherein
the second pointer moves within the second shift register, by control based on the second control signal, and the second control unit corresponding to the second local column decoder to which the second pointer is set is activated.

12. The semiconductor memory according to claim 1, wherein
the column control circuit includes:
a plurality of defective column address storing units which store the one or more defective column addresses included in the defect address information in a one-on-one manner;
a plurality of first comparing units that is provided to correspond to the defective column address storing units in a one-on-one manner and that compares whether the defective column addresses stored in the defective column address storing units, respectively, and the address signal match each other; and
a determining unit that determines whether to replace the first control unit with the second control unit based on the comparison result from the first comparing units.

13. The semiconductor memory according to claim 12, wherein
the determining unit generates a second control signal which controls setting of the second pointer to the second control unit when the address signal and the defective column address match each other and a signal level changes, and
the first control unit corresponding to the defective column address is replaced by the second control unit based on the second pointer and the second control signal.

14. The semiconductor memory according to claim 12, wherein
the column control circuit includes a second comparing unit which compares whether a first-selected column address in the main region is larger than the defective column address, and
the column control circuit sets the second pointer to the second control unit which is first-selected in the redundancy region, based on a comparison result of the second comparing unit.

15. The semiconductor memory according to claim 1, wherein
each of the first control unit and the second control unit includes at least one bit line, one or more memory cells connected to the bit line, a sense amplifier unit connected to the bit line, and a latching unit connected to the bit line.

16. A semiconductor memory comprising:
a memory cell array including a plurality of column blocks including a plurality of column units configured to assign to a column and a redundancy unit configured to assign to the column;
a column control circuit configured to sequentially select the column units using a first pointer corresponding to an address signal externally supplied, and select the redundancy unit using a second pointer when defect address information of the column unit matches the address signal so that data of the column unit corresponding to the defect address information is replaced with data of the redundancy unit based on the defect address information; and
a selection circuit configured to select either one of the data of the column unit and the data of the redundancy unit and outputs the selected data, based on a comparison result between the address signal and the defect address information.

17. The semiconductor memory according to claim 16, further comprising:
a latch circuit connected to the redundancy unit, wherein
the redundancy unit has a plurality of first sense amplifier circuits, a plurality of first data latching circuits and a first selection switch,
the first sense amplifier circuits and the first data latching circuits are connected in common to the first selection switch via a first data bus.

18. The semiconductor memory according to claim 17, wherein
the column unit has a plurality of second sense amplifier circuits, a plurality of second data latching circuits and a plurality of second selection switches,
the second sense amplifier circuits and the second data latching circuits are connected in common to a second first data bus,
the second sense amplifier circuits and the second data latching circuits are connected in common to the second selection switches corresponding to each others via a third data bus,
the first and second selection switches are connected in common to the latch circuit.

19. A method of controlling a semiconductor memory, comprising:
inputting a command signal which commands a data transmission to a memory cell array including a main region and a redundancy region, and an address signal that indicates an object of the data transmission in the memory cell array, the main region and the redundancy region including a plurality of memory cells arranged along a row direction and a column direction, the main region including a plurality of first control units configured to assign to a column of the main region, the redundancy region including a plurality of second control units configured to assign to a column of the redundancy region;
generating a first pointer corresponding to the address signal and sequentially selecting the plurality of first control units;
selecting the second control unit using a second pointer different from the first pointer such that one of the first control units corresponding to defect address information is replaced by one of the second control units, when the defect address information of the main region and the address signal match each other; and
connecting either a first data bus connected to the main region or a second data bus connected to the redundancy region to a third data bus which connects the memory cell array and outside of the memory cell array to each other, based on a comparison result between the address signal and the defect address information, and performing the data transmission to the memory cell array.

20. The method of controlling a semiconductor memory according to claim 19, wherein
the second control units are associated with the first control units such that a selection order of the second control units corresponds to a selection order of the first control units which are defective, and
the second control units are sequentially selected one by one in one direction.

* * * * *